US009136489B2

(12) United States Patent
Aramaki et al.

(10) Patent No.: US 9,136,489 B2
(45) Date of Patent: Sep. 15, 2015

(54) METHOD FOR PRODUCING ORGANIC PHOTOELECTRIC CONVERSION DEVICE AND ORGANIC PHOTOELECTRIC CONVERSION DEVICE

(75) Inventors: Shinji Aramaki, Yokohama (JP); Yoshiharu Sato, Sagamihara (JP)

(73) Assignees: Mitsubishi Chemical Corporation, Tokyo (JP); Japan Science and Technology Agency, Kawaguchi-shi (JP)

(*) Notice: Subject to any disclaimer, the term of this patent is extended or adjusted under 35 U.S.C. 154(b) by 337 days.

(21) Appl. No.: 12/299,183

(22) PCT Filed: May 1, 2007

(86) PCT No.: PCT/JP2007/059338
§ 371 (c)(1),
(2), (4) Date: Jan. 28, 2009

(87) PCT Pub. No.: WO2007/126102
PCT Pub. Date: Nov. 8, 2007

(65) Prior Publication Data
US 2009/0308458 A1    Dec. 17, 2009

(30) Foreign Application Priority Data

May 2, 2006  (JP) ................ 2006-128541
Jun. 9, 2006  (JP) ................ 2006-161374
Nov. 29, 2006 (JP) ................ 2006-321475

(51) Int. Cl.
*H01L 31/00* (2006.01)
*H01L 51/42* (2006.01)
*B82Y 10/00* (2011.01)
*H01L 51/00* (2006.01)

(52) U.S. Cl.
CPC .............. *H01L 51/424* (2013.01); *B82Y 10/00* (2013.01); *H01L 51/0026* (2013.01); *H01L 51/0078* (2013.01); *H01L 51/4206* (2013.01); *H01L 51/4253* (2013.01); *C08G 2261/1424* (2013.01); *C08G 2261/3223* (2013.01); *H01L 51/009* (2013.01); *H01L 51/0036* (2013.01); *H01L 51/0047* (2013.01); *H01L 51/0052* (2013.01); *H01L 51/0053* (2013.01); *Y02E 10/549* (2013.01)

(58) Field of Classification Search
USPC .......... 136/263, 255, 249, 259; 257/275, 256, 257/259, 72, 103, 369, 407, 102, 59, 40, 257/283, 285, 280; 438/99, 83
See application file for complete search history.

(56) References Cited

U.S. PATENT DOCUMENTS 5,331,183 A    7/1994  Sariciftci et al.
5,454,880 A   10/1995  Sariciftci et al.
6,300,612 B1  10/2001  Yu
2003/0226996 A1* 12/2003 Aramaki et al. ......... 252/62.3 Q
2004/0183070 A1  9/2004  Afzali-Ardakani et al.
2005/0263183 A1 12/2005 Nishikitani et al.
2006/0032530 A1* 2/2006  Afzali-Ardakani et al. .. 136/263

FOREIGN PATENT DOCUMENTS

| JP | 6 179802    |   | 6/1994  |
|----|-------------|---|---------|
| JP | 6-318725 A  |   | 11/1994 |
| JP | 07-142751   |   | 6/1995  |
| JP | 8 500701    |   | 1/1996  |
| JP | 9-18039     |   | 1/1997  |
| JP | 2004247481  | * | 2/2001  |
| JP | 2003/304014 |   | 10/2003 |
| JP | 2003 304014 |   | 10/2003 |
| JP | 2004 247481 |   | 9/2004  |
| JP | 2004/247481 |   | 9/2004  |
| JP | 2004-356229 |   | 12/2004 |
| JP | 2005 328030 |   | 11/2005 |
| JP | 2006 32914  |   | 2/2006  |
| WO | WO 00/11725 |   | 3/2000  |

OTHER PUBLICATIONS

K. Petritsch et al., Dye-based donor/acceptor solar cells, Solar Energy Materials & Solar Cells, vol. 61, pp. 63-72, 2000.*
Uchida, Soichi et al., "Organic small molecule solar cells with a homogeneously mixed copper phthalocyanine: $C_{60}$ active layer", Applied Physics Letters, vol. 84, No. 21, pp. 4218-4220, (2004).
Yamashita, Kazuo et al., "Improvement of Porphyrin Photovoltaic Cells in Panchromaticities and Quantum Yields by Use of Tetrabenzoporphyrin Skeleton", Bull. Chem. Soc. Jpn., vol. 60, No. 2, pp. 803-805, (1987).
Woehrle, Dieter et al., "Investigations of n/p-Junction photovoltaic Cells of Perylenetetracarboxylic Acid Diimides and Phthalocyanines", J. Mater. Chem., vol. 5, No. 11, pp. 1819-1829, (1995).
Uehara, Kaku et al., "Leading-edge Technology for Thin Film Organic Photovoltaic Cells", CMC Publishing, pp. I-VIII, 63-66 and 72-74, (2005).
Tang, C. W. "Two-layer organic photovoltaic cell", Appl. Phys. Lett., vol. 48, No. 2, pp. 183-185, (1986).
Shaheen, Sean E. et al., "2.5% efficient organic plastic solar cells", Applied Physics Letters, vol. 78, No. 6, pp. 841-843, (2001).
Janssen, Rene A.J. et al., "Polymer-Fullerene Bulk Heterojunction Solar Cells", MRS Bulletin, vol. 30, pp. 33-36, (2005).
"Dye Sensitization Solar Cell-Latest Technology and Market", Toray Research Center Inc., pp. 1-7, (2004).
U.S. Appl. No. 12/668,141, filed Jan. 7, 2010, Sato, et al.

(Continued)

Primary Examiner — Monique Peets
(74) Attorney, Agent, or Firm — Oblon, McClelland, Maier & Neustadt, L.L.P.

(57) ABSTRACT

The objects are to provide a method for producing a durable organic photoelectric conversion device by a coating process or to produce an organic photoelectric conversion device superior in photoelectric conversion characteristics to the conventional devices. In the production method for an organic photoelectric conversion device including a substrate, a pair of electrodes which are formed on the substrate and at least one of which is transparent, and an active layer formed between the pair of electrodes, the active layer is formed by coating; and the active layer contains a pigment.

12 Claims, 1 Drawing Sheet

(56) References Cited

OTHER PUBLICATIONS

Notice of Rejection issued Mar. 6, 2012 in Japanese Patent Application No. 2006-321475 (with English translation).
Notice of Rejection issued May 22, 2012 in Japanese Patent Application No. 2007-151210 (with English translation).
Notice of Rejection issued May 22, 2012 in Japanese Patent Application No. 2007-121209 (with English translation).
Korean Rejection issued Sep. 29, 2010, in Korea Patent Application No. 2008-7029231 (with English Translation).
Korean Rejection issued May 6, 2011, in Korea Patent Application No. 2008-7029231 (with English Translation).
Korean Rejection issued Sep. 29, 2011, in Korea Patent Application No. 2011-7018520 (with English Translation).
Chinese Office Action issued Apr. 22, 2010, in China Patent Application No. 200780015742.X (with English Translation).
Japanese Notice of Reason(s) for Refusal issued Dec. 6, 2011, in Japan Patent Application No. 2008-323252 (with English translation).
Kohshin Takahashi, et al., "Enhanced quantum yield in porphyrin/electron-donor double-layer solar cells", Solar Energy Materials and Solar Cells 45, (Elsevier), 1997, pp. 127-139.
Noboru Ono, et al., "Synthesis and properties of new conjugated systems from—π—extended prroles", Technical Report of Institute of Electronics, Information and Communication Engineers, OME, Organic Electronics, vol. 101, No. 103, May 25, 2001, pp. 1-6.
Japanese Office Action issued Jul. 9, 2013 in Patent Application No. 2012-128213 with English Translation.
Notification for Submitting Publications from the Japanenese Patent Office dated Jun. 28, 2011 which corresponds to the corresponding Japanese Patent Application No. 2007-151210.
Extended European Search Report Issued Feb. 11, 2013 in Patent Application No. 07742773.0.
K. Petritsch et al., "Dye-based donor/acceptor solar cells", Solar Energy Materials & Solar Cells, XP004244750, vol. 61, pp. 63-72, 2000.
European Office Action issued Oct. 8, 2013 in Patent Application No. 07 742 773.0.
Yan Shao et al., "Efficient Organic Heterojunction Photovoltaic Cells Based on Triplet Materials", Advanced Materials, vol. 17, No. 23, XP-055081522, Dec. 5, 2005, pp. 2841-2844.
Official Communication as received in the corresponding European Patent Application No. 07742773.0-1552 dated Feb. 9, 2015.
Carine Edder, et al., "Benzothiadiazole- and pyrrole-based polymers bearing thermally cleavable solubilizing groups as precursors for low bandgap polymers", Chemical Communications, No. 18 pp. 1965-1967.

\* cited by examiner

METHOD FOR PRODUCING ORGANIC PHOTOELECTRIC CONVERSION DEVICE AND ORGANIC PHOTOELECTRIC CONVERSION DEVICE

CROSS-REFERENCE TO RELATED APPLICATIONS

This application is a 371 of PCT/JP07/59338 filed May 1, 2007 and claims the benefit of JP 2006-128541 filed May 2, 2006, JP 2006-161374 filed Jun. 9, 2006 and JP 2006-321475 filed Nov. 29, 2006.

TECHNICAL FIELD

The present invention relates to an organic photoelectric conversion device and the production method thereof, and in particular to an organic photoelectric conversion device preferably used for an organic thin layer solar cell and an optical sensor.

BACKGROUND OF THE INVENTION

A conventional solar cell, one of the use of an organic photoelectric conversion device, has been developed and practically used which device is made of polycrystal silicon. The production of the device requires high purity silicon and a high-temperature process. Considering the energy required for production, the contribution to energy saving technology of solar cell has been questionable. Besides outdoor electric generation use, the conventional production method still has a problem in fabrication of the device on a plastic substrate required for portable solar cells.

Another usage of an organic photoelectric conversion device as an optical sensor is represented by an image sensor incorporated in a facsimile or a photocopier. Such an optical sensor has been put into practice in an image reader with a linear sensor, serving as a scanner, made of silicon crystal. However, there has not hitherto been a two-dimensional scanner developed for practical use, which is large in area and requires no scanning.

In order to solve the above problems, efforts have been made to develop a solar cell which can be produced with less energy and which can be formed by a simple coating method with organic material which method can enable formation of a layer large in area.

For example, it has been proposed that organic material that has undergone dye sensitizing is used for the production of a wet solar cell. However, since the wet solar cell uses an electrolytic solution in the structure of the cell and may cause solution leak and iodine dissipation in the solution, such a cell has not been put into practice yet.

Another solar cell formed of organic material is exemplified by an organic thin layer solar cell entire of which is solid.

A solar cell (an organic solar cell) formed of an organic semiconductor may have various structures such as a dye sensitizing type, a bulkhetero junction type, a hetero pn junction type, and a Shottky type, for example (see Patent reference 1, and Non-Patent references 1 and 2).

A hetero junction type is a formation fabricated by depositing a layer made of an electron donor and a layer made of an electron acceptor, and uses charge transport caused by photoinduction at the interface of the layers. A reported example of the solar cell was formed of copper phthalocyanine and perylene derivative respectively for an electron donor and an electron acceptor and attained a conversion efficiency of 1% in Non-Patent reference 3. Alternatively, a condensed aromatic hydrocarbon, such as pentacene and tetracene, can be proposed for an electron donor, and a fullerene compound such as $C_{60}$ is proposed as an electron acceptor.

A bulkhetero junction type fabricates an active layer by mixing an electron donor and an electron acceptor at an appropriate ratio, and is therefore different from a hetero junction type that has an active layer in a two-layer structure. Junctions of the electron donor and the electron acceptor are uniformly spread in the bulk of the mixture active layer, so that solar light can be efficiently utilized. A device with a bulkhetero junction can be produced by co-depositing an electron donor and an electron acceptor by vacuum deposition to form an active layer or by coating, such as spin coating or printing, with the mixture solution of both electron donor and acceptor. An active layer has been reported which has been fabricated by vacuum deposition using copper phthalocyanine and $C_{60}$ (Non-Patent reference 4). A wet coating method typically uses a mixture of conjugated polymer of polythiophene and [6,6]-phenyl C61-butyric acid methyl-ester (abbreviated to PCBM) which is a soluble derivative of fullerene (Non-Patent reference 5).

Reported production methods of the above solar cell of a bulkhetero junction type fabricate a layer by coating with a mixture of a polythiophene derivative or a poly phenylene vinylene derivative and a fullerene ($C_{60}$) derivative (see Patent reference 2 and Non-Patent reference 6). The reports mentioned that the mixture layer of a solar cell thus produced has conjugated polymer and a fullerene compound that are separated in phase from each other.

It has been reported that a solar cell formed of a benzoporphyrin compound takes the form of a device with a Schottky junction (Non-Patent reference 7) or takes the form of a device with a hetero junction in which the electron acceptor layer has been formed of a perylene derivative (Non-Patent Reference 8 and Patent Reference 3). Both of the above devices however have low conversion efficiency and therefore large problems remain to be unsolved for practical use.

In the meanwhile, an organic pigment as represented by phthalocyanine, benzoporphyrin, quinacridone, and pyrrolopyrrole, is known to the public because the pigment can serve as high crystalline pigment material and has high durability under irradiation with light.

[Patent reference 1] Japanese Patent Application Laid-Open (KOKAI) No. HEI 8-500701
[Patent reference 2] Japanese Patent Application Laid-Open (KOKAI) No. HEI 6-179802
[Patent reference 3] Japanese Patent Application Laid-Open (KOKAI) No. 2003-304014
[Non-Patent reference 1] "State-of-the-art organic thin layer solar cell", November, 2005, CMC Publishing Co., Ltd.
[Non-Patent reference 2] "dye sensitization solar cell—latest technology and market", July, 2004, TORAY RESEARCH CENTER. Inc.
[Non-Patent reference 3] C. W. Tang, "Appl. Phys. Lett.", vol. 48. pp. 183-185, 1986
[Non-Patent reference 4] S. Uchida et al., "Appl. Phys. Lett", vol. 84, pp. 4218-4220, 2004
[Non-Patent reference 5] S. E. Shaneen et al., "Appl. Phys. Lett", vol. 78, pp. 841-843, 2001
[Non-Patent reference 6] "Material Research Society Bulletin" (sic), vol. 30, No. 1, 33, 2005
[Non-Patent reference 7] K. Yamashita et al., "Bull. Chem. Soc. Jpn". Vol. 60, pp. 803-805, 1987
[Non-Patent reference 8] D. Wohrle et al., "J. Mater. Chem.", vol. 5, pp. 1819-1829, 1995

DISCLOSURE OF THE INVENTION

Problems to be Solved by Invention

Any solar cell generates electricity in response to light absorption. An organic solar cell generates electricity usually by the following mechanism consisting of the steps of:

step 1: generation of an excitation state (exciton) caused by light absorption;

step 2: dissociation of exciton into ion pairs (so-called carriers); and step 3: cleavage of the ion pairs and resulted carries electrodes.

The present invention calls where (a layer) steps 1 and 2 occur an active layer.

Here, an exciton usually has a limited movable length (exciton diffusion length) over the lifetime thereof. Specifically, a general exciton diffusion length is as short as 10 nm or so. For this reason, photo voltaic power can be obtained only by generated excitons which have the generation points and the dissociation points within the movable length.

Therefore seems that increase of the dissociation point of exciton should achieve high efficiency.

From the above viewpoint, an organic solar cell is frequently configured to have an interface between two different components, impurities, a depletion layer, or an accumulation layer at which charge transport can easily occur to efficiently conduct the above step 2 (i.e., dissociation of excitons into ion pairs), so that the above step can proceed. Accordingly, the above organic solar cells usually have a characteristic structure where charge transport occurs.

An example of such a solar cell has a layer formed by organic pigment. In formation of a layer made of organic pigment for production of a solar cell, since organic pigment usually has high crystallinity, it has been difficult to form an organic pigment layer in a method other than vacuum deposition. It has been practically difficult to form a layer with a large area, and therefore such solar cells have been expensive to produce.

Although Patent reference 2 and Non-Patent reference 6 disclose production methods of solar cells of a bulkhetero junction type by a coating process, the use of conjugated polymers could not expect high durability under irradiation with light as compared to a solar cell containing organic pigment, and made it difficult to obtain a solar cell with adequate lifetime.

Further, the conventional organic thin-layer solar cell has an interface between the electron donor and the electron acceptor inadequate in largeness for efficient contact and has low mobility of electric charge. For this reason, as compared with a silicon-based solar cell, conventional organic thin-layer solar cells have been low in conversion efficiency and have problems in improvement of basic performance as a photoelectric conversion device.

With the foregoing problems in view, the first object of the present invention is to provide a production method for a durable organic photoelectric conversion device by a coating process and an organic photoelectric conversion device having a layer containing organic pigment and inorganic particles.

The second object of the present invention is to provide an organic photoelectric conversion device and a production method of the same which result in a device with excellent photoelectric conversion characteristics as compared with conventional devices.

Means to Solve the Problems

The inventors of the present invention found that an active layer formed of pigment by coating can produce an organic photoelectric conversion device long in lifetime as a result of eager study to attain the first object.

In addition, the inventors of the present invention found that use of a benzoporphyrin compound obtained by heat conversion of a soluble precursor thereof as an electron donor of an organic photoelectric conversion device improved the photoelectric conversion characteristics on the basis of the above knowledge to accomplish the second object.

Specifically, in accordance with a first aspect of the present invention, there is provided a method for producing an organic photoelectric conversion device including a substrate, a pair of electrodes which are formed on the substrate and at least one of which is transparent, and an active layer formed between the pair of electrodes, wherein the active layer is formed by coating; and the active layer contains a pigment. On the basis of the above knowledge, the inventors produce the present invention.

The method for producing an organic photoelectric conversion device of the present invention preferably includes the step of converting a latent pigment to the pigment.

In addition, the method for producing an organic photoelectric conversion device of the present invention preferably converts the latent pigment to the pigment after the latent pigment is formed by coating.

Further, the pigment preferably has a semiconductor characteristic.

Still further, the method for producing an organic photoelectric conversion device of the present invention preferably includes the step of converting one or more pigments.

Still further, the method for producing an organic photoelectric conversion of the present invention preferably performs the coating with a mixture of the two or more latent pigments.

Still further, the pigment is preferably at least one compound selected from the group consisting of porphyrin, phthalocyanine, quinacridone, pyrrolopyrrole, dithioketopyrrolopyrrole, and derivatives thereof.

Still further, the method for producing an organic photoelectric conversion of the present invention preferably includes the step of forming a layer by coating, with a mixture of the latent pigment and a material the solid of which has a semiconductor characteristic.

Still further in a method for producing an organic photoelectric conversion device of the present invention, the pigment preferably has a semiconductor characteristic; and the majority carrier of the pigment is opposite in polarity to that of the material.

Still further, the material is preferably formed of particles.

Still further, the material is preferably formed of inorganic particles.

In accordance with a second aspect of the present invention, there is provided an organic photoelectric conversion device comprising: a substrate; a pair of electrodes which are formed on the substrate and at least one of which is transparent; and an active layer formed between the electrodes and containing an organic pigment and inorganic particles.

The organic pigment is preferably obtained by converting a latent pigment.

The organic pigment and the inorganic particles are preferably separated in phase from each other.

In the method for producing an organic photoelectric conversion device of the present invention, the active layer preferably comprises an electron donor layer containing an electron donor and an electron acceptor layer containing an electron acceptor; and the method preferably comprises the step of forming the electron donor layer by converting a soluble precursor of a benzoporphyrin compound expressed by a following formula (I) or (II) having a bicyclo ring into the benzoporphyrin compound as the electron donor by a heat conversion.

[Chemical Formula 1]

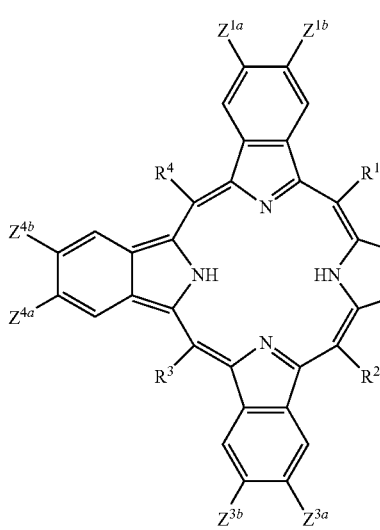

(I)

[Chemical Formula 2]

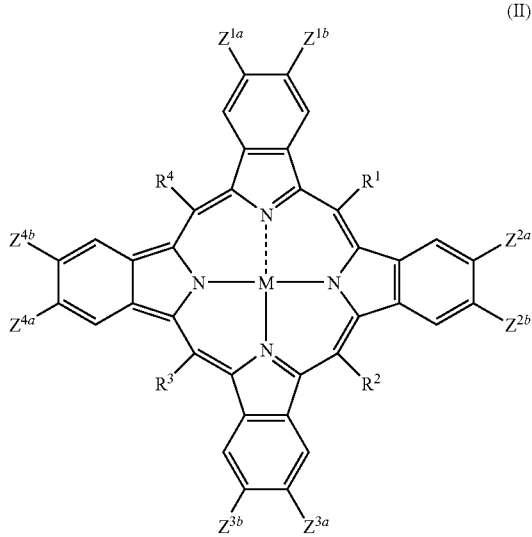

(II)

In formula (I) and (II), ($Z^{ia}$ and $Z^{ib}$ (i is an integer of 1-4) independently of one another are a univalent atom or a univalent atomic group, but $Z^{ia}$ and $Z^{ib}$ may bind to each other to form a ring; $R^1$-$R^4$ independently of one another are a univalent atom or a univalent atomic group; and M is a divalent metal atom or an atomic group in which a trivalent or more metal atom binds to one or more other atoms)

Still further, the soluble precursor is preferably a compound expressed by a following formula (III) or (IV).

[Chemical Formula 3]

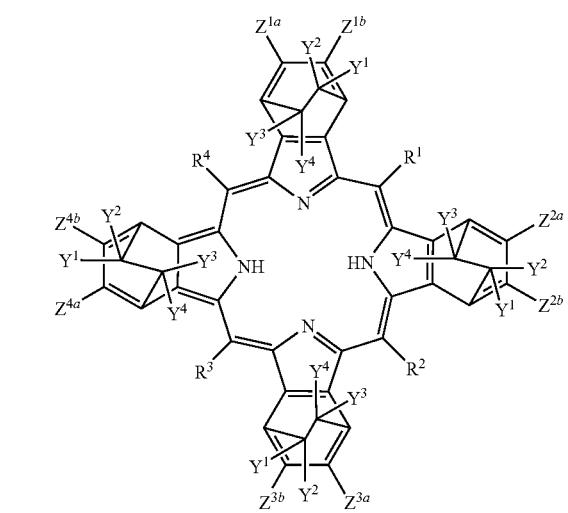

(III)

[Chemical Formula 4]

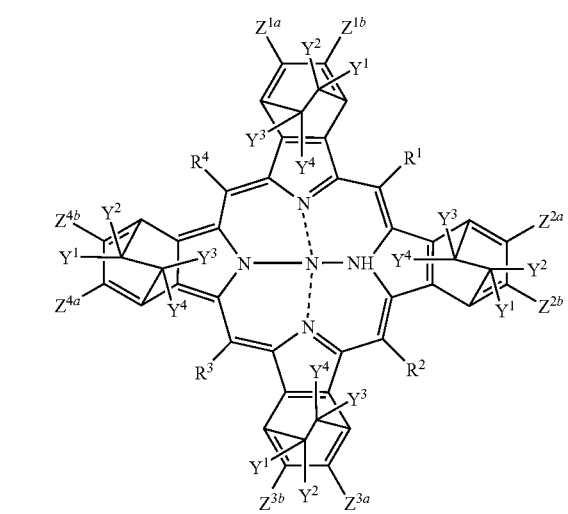

(IV)

(in formulae (III) and (IV), $Z^{ia}$ and $Z^{ib}$ (i is an integer of 1-4) independently of one another are a univalent atom or a univalent atomic group, but $Z^{ia}$ and $Z^{ib}$ may bind to each other to form a ring; $R^1$-$R^4$ independently of one another are a univalent atom or a univalent atomic group; $Y^1$-$Y^4$ independently of one another are a univalent atom or a univalent atomic group; and M is a divalent metal atom or an atomic group in which a trivalent or more metal atom binds to one or more other atoms).

Still further, the method for producing an organic photoelectric conversion of the present invention preferably comprises the steps of forming a layer made of the soluble precursor by coating; forming the electron acceptor layer on the soluble precursor layer; and forming the electron donor layer by the heat conversion.

In accordance with a third aspect of the present invention, there is provided an organic photoelectric conversion device comprising: a substrate; a pair of electrodes which are formed on the substrate and at least one of which is transparent; an electron donor layer formed between the electrodes and containing a benzoporphyrin compound expressed by the above formula (I) or (II), and an electron acceptor layer formed between the pair of electrodes and containing a fullerene compound.

In accordance with a fourth aspect of the present invention, there is provided an organic photoelectric conversion device comprising: a substrate; a pair of electrodes formed on the substrate and at least one of which is transparent; an active layer containing an electron acceptor and an electron donor; a benzoporphyrin compound layer formed between one of the electrodes and the active layer and containing a benzoporphyrin compound expressed by the above formula (I) or (II).

In accordance with a fifth aspect of the present invention, there is provided a method for producing an organic photoelectric conversion device comprising the step of forming the benzoporphyrin compound layer by converting a soluble precursor of the benzoporphyrin compound which precursor includes a bicyclo ring to the benzoporphyrin compound in heat conversion.

The soluble precursor is preferably a compound expressed by the above formula (III) or (IV).

Further, in the method for producing an organic photoelectric conversion device, the device is preferably a solar cell.

Still further, the organic photoelectric conversion device is preferably a solar cell.

Effects of Invention

The method for producing an organic photoelectric conversion device can guarantee at least one of the advantages of production of a durable organic photoelectric conversion device by a coating process and of fabrication of an organic photoelectric conversion device excellent in photoelectric conversion characteristics. In addition, the method can usually produce an organic photoelectric conversion device with high efficiency.

In addition, the present invention can provide an organic photoelectric conversion device including a layer containing organic pigment and inorganic particles.

Figure 1:
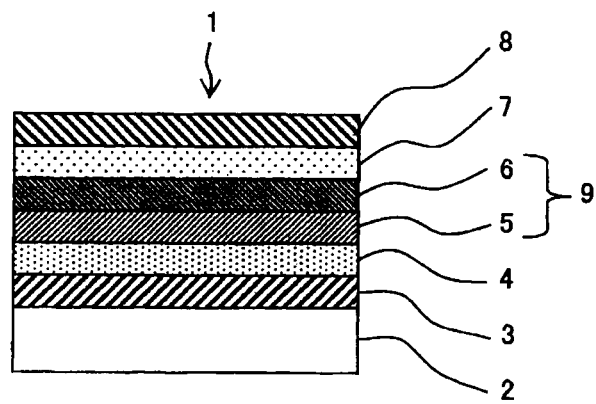
FIG. 1 is a schematic sectional view of an organic photoelectric conversion device according to a first embodiment of the present invention.

EXPLANATION OF SYMBOLS 1, 10, 12 organic photoelectric conversion device
2 substrate
3 positive electrode
4 p-type semiconductor layer
5 electron donor layer
6 electron acceptor layer
7 n-type semiconductor layer
8 negative electrode
9 active layer
11, 13 partial active layer

BEST MODE FOR CARRYING OUT THE INVENTION

Hereinafter, description is made with reference to embodiments and examples, to which the present invention however should by no means be limited. Various modifications can be suggested without departing from the gist of the present invention.

1. Overview

The method for producing an organic photoelectric conversion device of the present invention is characterized in that the method produces an organic photoelectric conversion device which includes a substrate, a pair of electrodes which are formed on the substrate and at least one of which is transparent, and an active layer formed between the pair of substrates, wherein the active layer is formed by coating and that the active layer includes pigment.

The pigment is preferably obtained by converting latent pigment. Therefore, the method for producing an organic photoelectric conversion device of the present invention preferably includes a step (converting step) of converting latent pigment to pigment. Use of latent pigment does not particularly limit the specific method for producing an organic photoelectric conversion device, but preferably adopts either the following method (1) or (2):

(1) a method including the converting step of converting two or more latent pigments into one or more pigments; and (2) a method including the layer forming step of forming a layer (herein after sometimes called "precursor layer") by coating with a mixture of latent pigment and material (herein after sometimes called "solid semiconductor material") the solid of which has a semiconductor characteristic.

In particular, the method (2) preferably performs a converting step, after the layer forming step, for converting the latent pigment to pigment, and thereby forms a layer (herein after called a "semiconductor mixture layer") containing the pigment and the solid semiconductor material.

Pigment serving as a material for an active layer of the organic photoelectric conversion device is not always excellent in layer formation characteristics due to the natural characteristics of the material itself. However, although the pigment is poor in the layer formation characteristic, if latent pigment serving as a precursor of the pigment is good in the layer formation characteristic, the latent pigment can be easily formed into a layer by a low cost method such as coating. A preferable embodiment of the production method of the present invention produces an organic photoelectric conversion device with these characteristics by forming a latent pigment into a layer having a desired shape and a size and being deposited at a desired position and then converting the latent pigment into the pigment to thereby form the active layer.

In the method for producing an organic photoelectric conversion device of the present invention, the active layer and a layer made of a latent pigment corresponding to the active layer are formed only by coating.

2. Pigment and Latent Pigment

Latent pigment according to the present invention is a precursor of pigment which precursor is different in chemical structure from the pigment. Giving external stimulus, such as heat or irradiation with light, to latent pigment modifies the chemical structure of the latent pigment, which is thereby converted into pigment.

Latent pigment according to the present invention is preferably good in layer formation characteristics. Even if a pigment is poor in layer formation characteristic, costs for layer formation can be reduced by forming a layer of a latent pigment, which is then converted into the pigment. For the sake of application of coating, it is preferable that latent pigment takes the form of liquid that can be used in coating, or has high solubility in a certain solvent and the solution thereof can be used in coating. The solubility of a latent pigment in a solvent is usually 0.1 weight % or more, preferably 0.5 weight % or more, more preferably 1 weight % or more.

Preferable latent pigment according to the present invention can be easily converted into pigment. Any external stimulus can be given to a latent pigment in the step of converting the latent pigment to the pigment, and is usually a heat treatment or irradiation with light.

Such preferable latent pigment according to the present invention is converted into a pigment through a converting step at a high yield. The yield of the pigment converted from the latent pigment can take any value as long as the capabilities of the organic photoelectric conversion device are not significantly impaired. A higher yield is more preferable. The yield is usually 90% or more, preferably 95% or more, more preferably 99% or more.

The pigment according to the present invention is obtained by conversion of the above latent pigment and has low solubility in a general solvent, which means here solubility in, for example, toluene of usually 1% or less, preferably 0.1% or less.

Any pigment can be used depending on the structure of the organic photoelectric conversion device, and the present invention usually uses organic compound (organic pigment) as the pigment. Further, the pigment preferably has semiconductor characteristics because movement of electric charges inside the pigment usually causes the organic photoelectric conversion device to generate electric power. The semiconductor characteristics here are exemplified by possession of the carrier mobility of the single layer formed of the pigment of $10^{-7}$ cm$^2$/Vs or more. Carrier mobility can be measured by the time-of-flight method, or measurements of field-effect transistor, the Hall effect, the electric conductivity combined with carrier density.

The present invention does not particularly direct to express color peculiar to pigment. However, since a general semiconductor uses π-conjugated molecules, a suitable material for a solar cell has an absorption band at the sunlight spectrum region.

The following are examples of a preferable latent pigment which can be converted into pigment molecules at a high yield in response to external stimulus.

In other words, preferable latent pigment is exemplified in the specification of U.S. Pat. No. 6,071,989, and compounds are expressed by the following formula (1).

$$A(B)_x \qquad (1)$$

in which x is a number from 1 to 8, but when x is one from 2-8, B may be the same or different, A in formula (1) is a radical of a chromophore of anthraquinone, azo, benzimidazolone, quinacridone, quinophthalone, diketopyrrolopyrrole, dioxazine, indanthrone, indigo, isoindoline, isoindolin one, perylene, or phthalocyanine, and is attached to B via one or more heteroatoms, such as N, O, or S, possessed by radical A.

B is a radical selected from a group consisting of the formulae (2), (3), (4), (5a) or (5b). Throughout this specification, the notation of "Ck" (k is a natural number) means that the carbon number is k. For example, C1 represents the carbon number to be one.

[Chemical Formula 5]

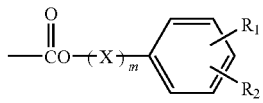
(2)

[Chemical Formula 6]

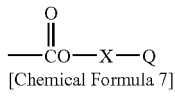
(3)

[Chemical Formula 7]

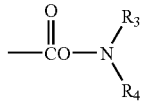
(4)

[Chemical Formula 8]

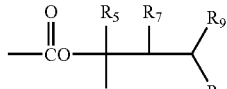
(5a)

[Chemical Formula 9]

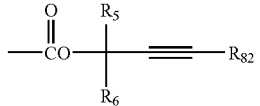
(5b)

Here, m in formula (2) is zero or 1.

In formulae (2) and (3), X is C2-C5 alkenylene group or C1-C6 alkylene group which is unsubstituted or substituted one or more times by C1-C6 alkyl group, $R_5$ and $R_6$.

Further, in formula (2), $R_1$ and $R_2$ independently of one another are hydrogen atom, C1-C6 alkyl group, alkoxy group, halogen, cyano group, nitro group, N(C1-C6 alkyl)$_2$, (that is, amino group having nitrogen bound to C1-C6 alkyl group) or unsubstituted or halogen-, cyano-, nitro-, C1-C6alkyl- or C1-C6 alkoxy-substituted phenyl group.

In formula (3), Q is hydrogen atom, C1-C6 alkyl group, CN, C, CCl$_3$, a radical expressed by the formula below, SO$_2$CH$_3$, or SCH$_3$. Here, $R_1$ and $R_2$ are the same as that described above.

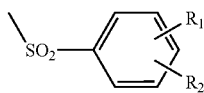
[Chemical Formula 10]

In addition, $R_3$ and $R_4$ in formula (4) independently of one another are halogen, C1-C4 alkyl group, or a radical expressed by the formula below.

[Chemical Formula 11]

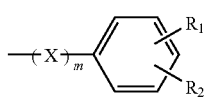

$R_3$ and $R_4$ may bind to each other to form a piperidinyl group. Here, X, m, $R_1$ and $R_2$ are the same as those described above.

In formulae (5a) and (5b), $R_5$ and $R_6$ independently of one another are hydrogen atom, C1-C24 alkyl group, an O-interrupted, S-interrupted or C1-C6 alkyl-disubstituted and N-interrupted C1-C24 alkyl group, C3-C24 alkenyl group, C3-C24 alkynyl group, C4-C12 cycloalkyl group, unsubstituted or C1-C6 alkyl-, C1-C6 alkoxy-, halogen-, cyano- or nitro-stituted phenyl group or biphenyl group. A O-, S-, N-interrupted alkyl group represents an alkyl group which has these atoms in the carbon chain thereof.

Furthermore, in formula (5a), $R_7$, $R_8$ and $R_9$ independently of one another are hydrogen atom, C1-C24 alkyl group or C3-C24 alkenyl group.

In formula (5b), $R_{82}$ is hydrogen atom, C1-C6 alkyl group or radicals expressed by the formula below.

[Chemical Formula 12]

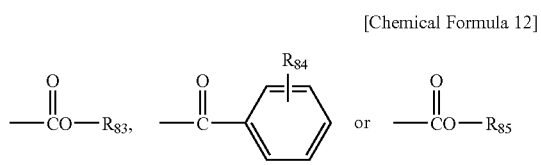

Here, $R_{83}$ is C1-C6 alkyl group, $R_{84}$ is hydrogen atom or C1-C6 alkyl group, and $R_{85}$ is hydrogen atom, C1-C6 alkyl group, unsubstituted or C1-C6 alkyl-substituted phenyl group.

B in formula (1) is a radical expressed by the formula below

[Chemical Formula 13]

Here, $G_1$ is (C2-C12)p,q-alkylene group which is unsubstituted or substituted one or more times by C1-C12 alkyl group, C1-C12 alkoxy group, C1-C12 alkylthio group or C2-C24 dialkylamino group, p and q being different positional numbers. The group $G_1$ may be substituted by a single substituent or by two or more substituents.

Further, $G_2$ is heteroatom selected from the group consisting of N, O and S. If $G_2$ is O or S, is 0 and, if $G_2$ is N, i is 1.

$R_{10}$ and $R_{11}$ independently of one another are [—(C2-C12 p',q'-alkylene)-$R_{12}$—]$_{ii}$—C1-C12 alkyl group (that is, ii repeating combinations of C2-C12 p',q'-alkylene group and $R_{12}$ having the $R_{12}$ terminus binding to C1-C12 alkyl group) or C1-C12 alkyl group which is unsubstituted or substituted one or more times by C1-C12 alkoxy group, C1-C12 alkylthio group, C2-C24 dialkylamino group, C6-C12 aryloxy group, C6-C12 arylthio group, C7-C24 alkylarylamino group or C12-C24 diarylamino group. The group $G_2$ may be substituted by a single substituent or by two or more substituents.

ii is a number from 1 to 1000, p' and q' are different positional numbers.

Each $R_{12}$ independently of one another is O, S or C1-C12 alkyl-substituted N, and C2-C12 alkylene group. In the repeating units, [C2-C12 alkylene-$R_{12}$] can be identical or different.

$R_{10}$ and $R_{11}$ can be saturated or mono- to decaunsaturated, can be uninterrupted or interrupted at any desired points by from 1 to 10 groups selected from the group consisting of —(C=O)— and —$C_6H_4$—, and may carry no or from 1 to 10 further substituents such as halogen atom, cyano group or nitro group.

If $G_1$ is —$(CH_2)_{iv}$—, iv is a number from 2 to 12, and $G_2$ is S, but $R_{11}$ is not unsubstituted, saturated and O-, S-, or N-interrupted C1-C4 alkyl.

The compound expressed by the formula (6) below can serve as an alternative preferable latent pigment.

[Chemical Formula 14]

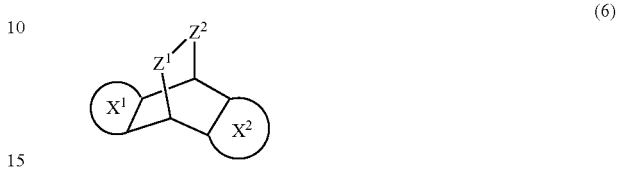

At least one of $X^1$ and $X^2$ in formula (6) is a group forming a π-conjugated divalent aromatic ring, and $Z^1$-$Z^2$ are groups that can be eliminated by heat or light. A π-conjugated compound obtained as a result of elimination of $Z^1$-$Z^2$ from this compound comes to be a pigment molecule. Besides, $X^1$ and $X^2$ is substituted or unsubstituted ethenylene group if not being a group forming a π-conjugated divalent aromatic ring.

Heat or light eliminates $Z^1$-$Z^2$ to convert the compound expressed by formula (6) to a π-conjugated compound high in planarity as shown by the following reaction formula. The resultant π-conjugated compound is the pigment according to the present invention and, in the present invention, preferably has semiconductor characteristics.

[Chemical Formula 15]

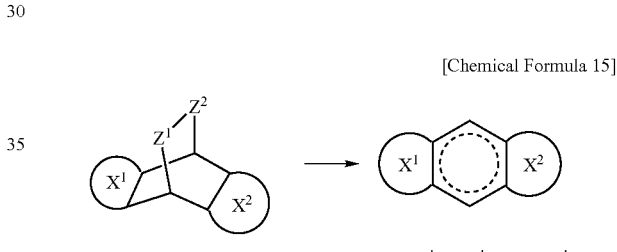

π - conjugated compound

Examples of the compound of the formula (6) are shown below. t-Bu represents a t-butyl radical.

[Chemical Formula 16]

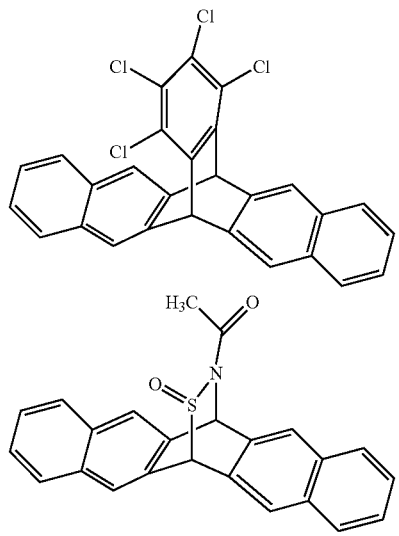

-continued
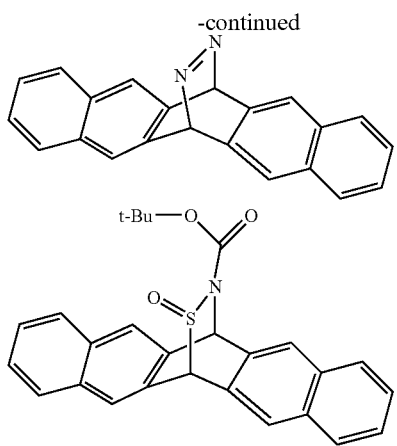
[Chemical Formula 17]
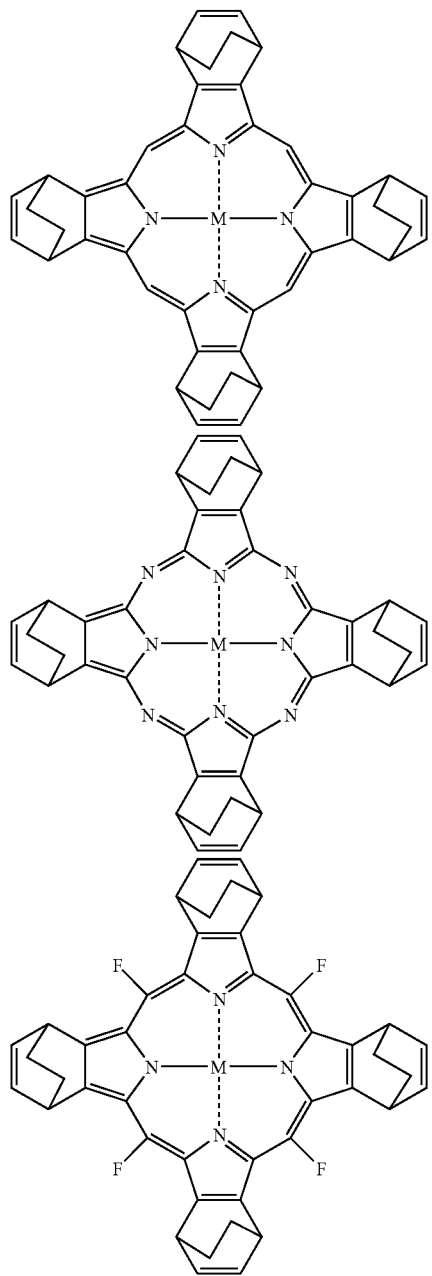
-continued
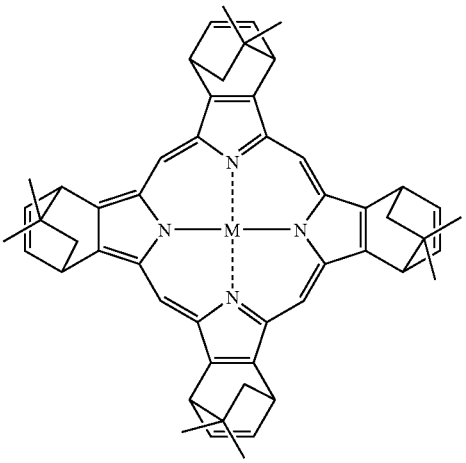
[Chemical Formula 18]
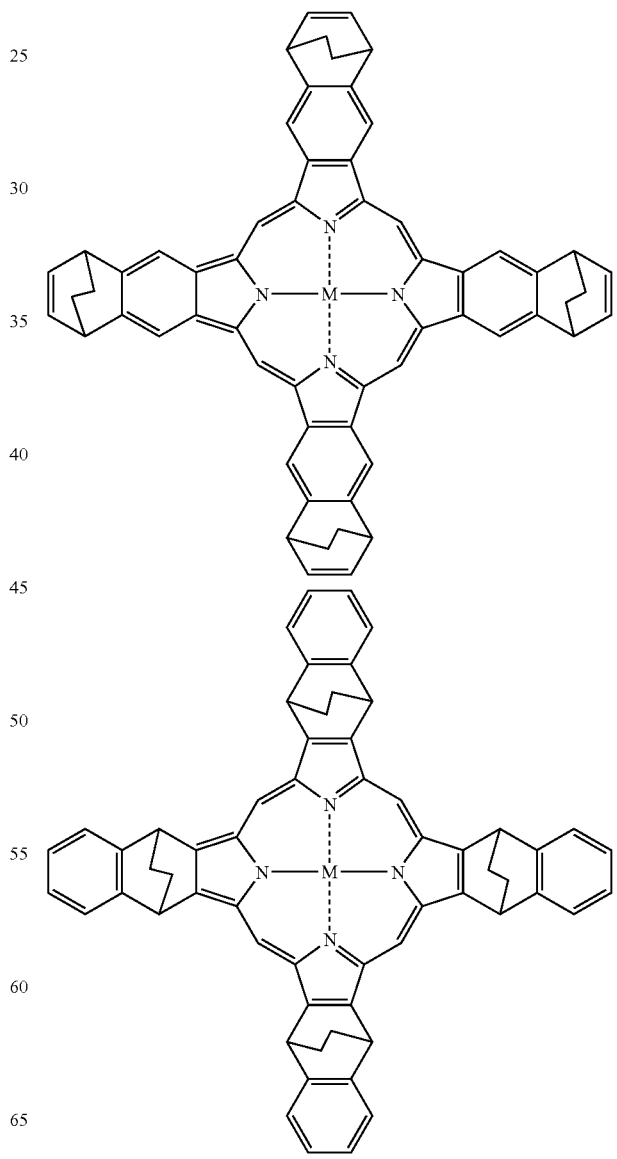

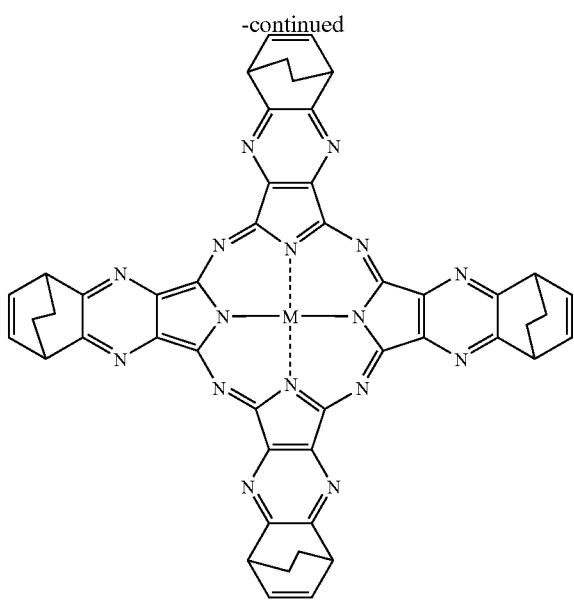

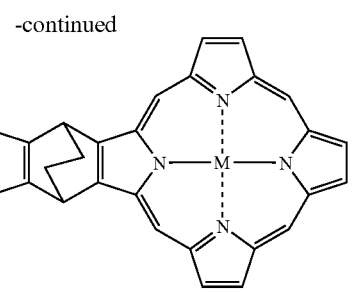

A pigment (π-conjugated compound) generated by conversion of a latent pigment is exemplified by a condensed aromatic hydrocarbons such as naphthacene, pentacene, pyrene, fullerene; oligomers such as α-sexithiophene; aromatic carboxylic anhydrides and their imides such as naphthalenetetracarboxylic anhydride, naphthalenetetracarboxylic diimide, perylenetetracarboxylic anhydride, or perylenetetracarboxylic diimide; and macrocyclic compounds such as copper phthalocyanine, perfluorocopper phthalocyanine, tetrabenzoporphyrin or their metallic salts. For example, specific conversion of the above latent pigment is carried out as follows.

[Chemical Formula 19]

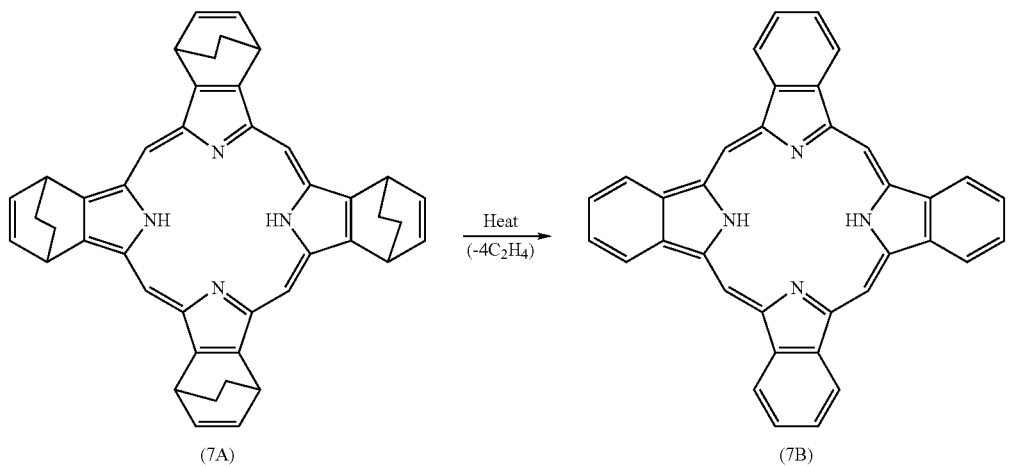

(7A)　　　　　　　　　　　　　(7B)

[Chemical Formula 20]

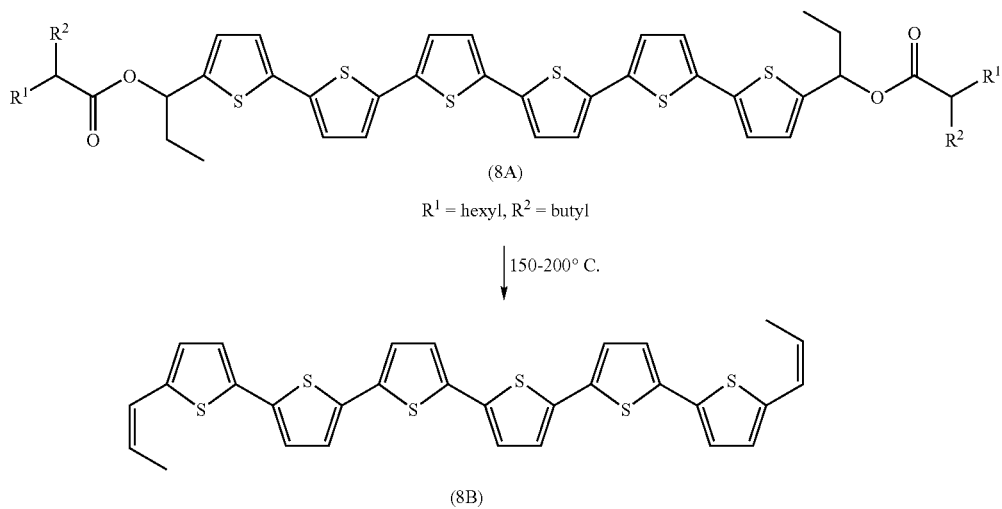

(8A)

$R^1$ = hexyl, $R^2$ = butyl 150-200° C.

(8B)

[Chemical Formula 21]

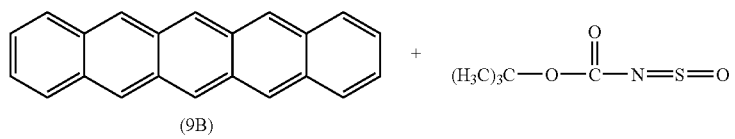

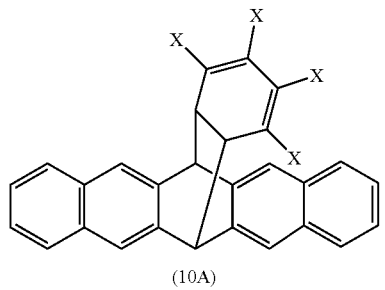

[Chemical Formula 22]

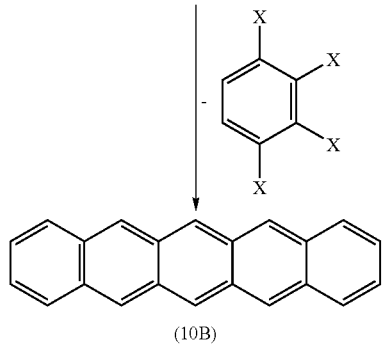

Generally, pigments obtained from conversion of such latent pigments are high crystalline materials with crystallinity. The π-conjugated molecules of the pigments according to the present invention aggregate with one another for strong molecular interaction, which therefore provide the pigments according to the present invention with a strong absorption band at the visible light region and semiconductor characteristics capable of conducting electric charges however different in degree. Above all, pigments with high semiconductor characteristics are preferable.

From this viewpoint, among the above pigments, a preferable organic pigment obtained by converting a latent pigment is, for example, tetrabenzoporphyrin, metal complexes thereof with copper or zinc, phthalocyanine or metal complexes thereof, a pentacene compound, or a quinacridone compound, among which benzoporphyrin, phthalocyanine, and metal complexes thereof are particularly preferable.

The pigments are classified into a p type and an n type according to semiconductor characteristics. The p type and the n type represent that what contributes to electric conduction of the semiconductor material is positive holes or electrons, and depend on the states of electrons, doping, and trapping of the material and other factors. Examples of p-type and n-type pigments are shown below, but are not always definitely classified. Some pigments show both the p-type and n-type characteristics.

Specifically, a pigment (herein after called a p-type pigment) with p-type semiconductor characteristics is exemplified by phthalocyanine and metal complexes thereof; tetrabenzoporphyrin and metal complexes thereof; polyacenes such as tetracene(naphthacene), pentacene, pyrene, or perylene; oligothiophenes such as sexithiophene; and derivatives having the skeletons of the above compounds.

On the other hand, pigment (herein after called an n-type pigment) with n-type semiconductor characteristics is exemplified by fullerene ($C_{60}$); perfluoro derivatives of above p-type pigments; aromatic carboxylic anhydride and imide thereof such as naphthalenetetracarboxylic anhydride, naphthalene tetracarboxylic diimide, perylenetetracarboxylic anhydride, perylenetetracarboxylic diimide; and derivatives having the structures of the above compounds.

Further, a compound formed by introducing a structure to enhance the electron affinity of the compound into a skeleton expressed by the above formula (7B) can be used as a preferable precursor of an n-type semiconductor material. The compound expressed by the above formula (7B) serves as a pigment and is obtained by converting a latent pigment compound expressed by formula (7A).

The examples of the structure which enhances the electron affinity of the compound expressed by formula (7B) is produced by substitution with a number of electron-withdrawing substituents such as fluorine or by replacing a π-conjugated carbon atom —CH= with nitrogen to have the structure of —N=, and is exemplified by the following compounds and metal complexes thereof with copper, zinc and others.

[Chemical Formula 23]

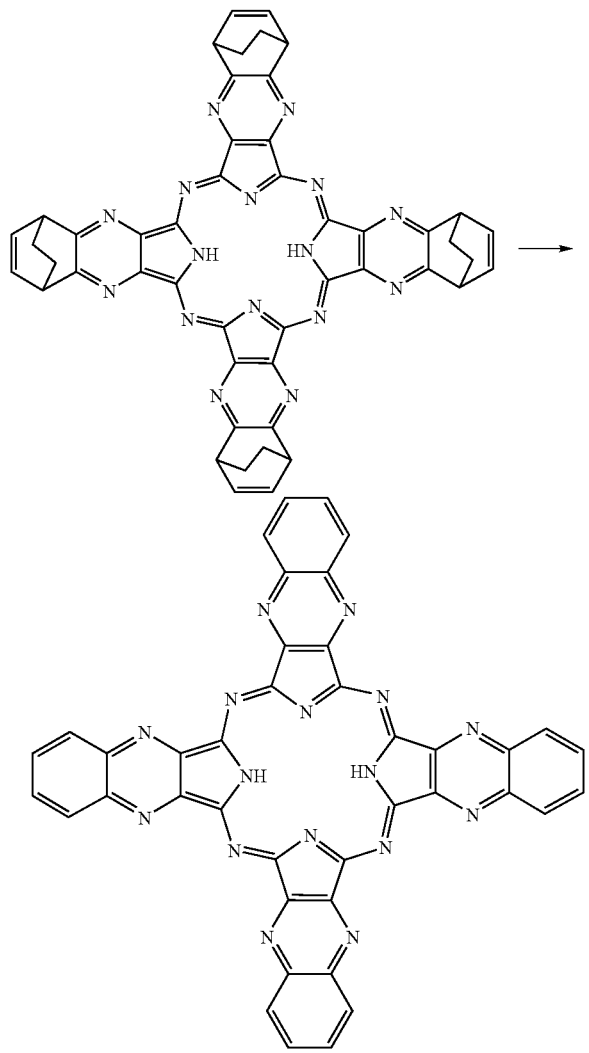

Similarly, F- or N-substituted compounds expressed by the above formulae (8B), (9B), and (10B) can be used as n-type semiconductors. The compounds expressed by the above formulae (8B), (9B), and (10B) each serve as a pigment, which can be obtained by converting latent pigments expressed by formulae (8A), (9A), and (10A), respectively.

A preferable embodiment of the method for producing an organic photoelectric conversion device of the present invention has the step of converting two or more latent pigments into a pigment as described to be the above method (1). An organic photoelectric conversion device produced in this method normally has an active layer containing a pigment of a p-type and a pigment of an n-type. In the present invention, at least one of the p-type and n-type pigments is produced through conversion of a latent pigment. In the selection of a latent pigment, it is preferable to select a precursor corresponding to at least one of the above n-type and p-type pigments.

Among the above pigments, an organic photoelectric conversion device produced in the method of the present invention preferably uses at least one selected from the group consisting of porphyrin, phthalocyanine, quinacridone, pyrrolopyrrole, dithioketopyrrolopyrrole and their derivative as a pigment. In particular, a benzoporphyrin compound is preferably used as a latent pigment and is herein after detailed.

[2-1. Benzoporphyrin Compound]

A benzoporphyrin compound according to the present invention is expressed by the following formula (I) or (II).

[Chemical Formula 24]

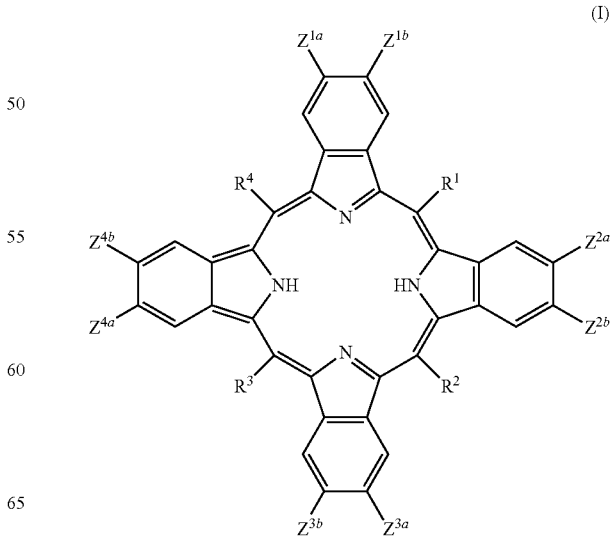

[Chemical Formula 25]

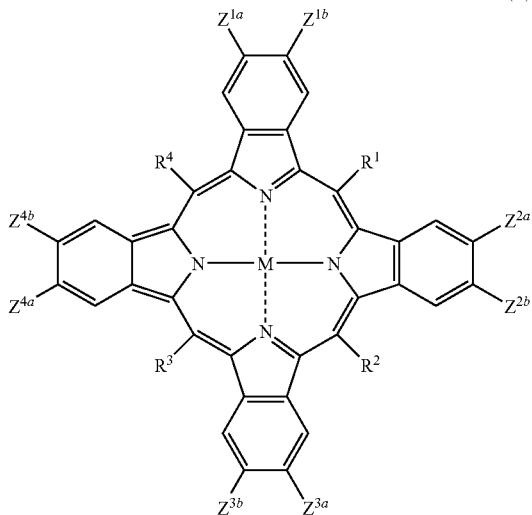

(II)

(In formulae (I) and (II), $Z^{ia}$ and $Z^{ib}$ (i is an integer of 1-4) independently of one another are a univalent atom or a univalent atomic group, but $Z^{ia}$ and $Z^{ib}$ may bind to each other to form a ring; $R^1$-$R^4$ independently of one another are a univalent atom or a univalent atomic group; and M is a divalent metal atom or an atomic group in which a trivalent or more metal atom binds to one or more other atoms)

In formulae (I) and (II), $Z^{ia}$ and $Z^{ib}$ (i is an integer of 1-4) independently of one another are a univalent atom or a univalent atomic group.

The example of an atom serving as $Z^{ia}$ and $Z^{ib}$ is hydrogen atom; and halogen atom such as fluorine atom, chlorine atom, bromine atom, and iodine atom.

The examples of the atomic group are hydroxyl group; amino group; and an organic group such as alkyl group, aralkyl group, alkenyl group, cyano group, acyl group, alkoxy group, alkoxycarbonyl group, allyloxy group, dialkylamino group, diaralkylamino group, haloalkyl group, aromatic hydrocarbon ring group, aromatic heterocyclic group.

Among the above organic groups, alkyl group can have any carbon number unless significantly impairing the effects of the present invention, but is usually 12 or less, preferably 8 or less. There is a possibility that an excessively large carbon number of alkyl group lowers the semiconductor characteristics, enhances the solubility resulting in re-dissolving when being overcoated, or lowers the heat resistance. The alkyl group is exemplified by methyl group and ethyl group.

Among the above organic groups, aralkyl group can have any carbon number unless significantly impairing the effects of the present invention, but is usually 12 or less, preferably 8 or less. There is a possibility that an excessively large carbon number of aralkyl group lowers the semiconductor characteristics, enhances the solubility resulting in re-dissolving when being overcoated, or lowers the heat resistance. The aralkyl group is exemplified by benzyl group.

Among the above organic groups, alkenyl group can have any carbon number unless significantly impairing the effects of the present invention, but is usually 12 or less, preferably 8 or less. There is a possibility that an excessively large carbon number of alkenyl group lowers the semiconductor characteristics, enhances the solubility resulting in re-dissolving when being overcoated, or lowers the heat resistance. The alkenyl group is exemplified by vinyl group.

Among the above organic groups, acyl group can have any carbon number unless significantly impairing the effects of the present invention, but is usually 12 or less, preferably 8 or less. There is also a possibility that an excessively large carbon number of acyl group lowers the semiconductor characteristics, enhances the solubility resulting in re-dissolving when being overcoated, or lowers the heat resistance. The acyl is exemplified by formyl group, acetyl group, and benzoyl group.

Among the above organic groups, alkoxyl group can have any carbon number unless significantly impairing the effects of the present invention, but is usually 12 or less, preferably 8 or less. There is a possibility that an excessively large carbon number of alkoxyl group lowers the semiconductor characteristics, enhances the solubility resulting in re-dissolving when being overcoated, or lowers the heat resistance. The alkoxyl group is exemplified by methoxy group and ethoxy group.

Among the above organic groups, alkoxycarbonyl group can have any carbon number unless significantly impairing the effects of the present invention, but is usually 12 or less, preferably 8 or less. There is a possibility that an excessively large carbon number of alkoxycarbonyl group lowers the semiconductor characteristics, enhances the solubility resulting in re-dissolving when being overcoated, or lowers the heat resistance. The alkoxycarbonyl group is exemplified by methoxycarbonyl group and ethoxycarbonyl group.

Among the above organic groups, allyloxy group can have any carbon number unless significantly impairing the effects of the present invention, but is usually 12 or less, preferably 8 or less. There is a possibility that an excessively large carbon number of allyloxy group lowers the semiconductor characteristics, enhances the solubility resulting in re-dissolving when being overcoated, or lowers the heat resistance. The allyloxy group is exemplified by phenoxy group and benzyloxy group.

Among the above organic groups, dialkylamino group can have any carbon number unless significantly impairing the effects of the present invention, but is usually 12 or less, preferably 8 or less. There is a possibility that an excessively large carbon number of dialkylamino group lowers the semiconductor characteristics, enhances the solubility resulting in re-dissolving when being overcoated, or lowers the heat resistance. The dialkylamino group is exemplified by diethylamino group and diisopropylamino group.

Among the above organic groups, diaralkylamino group can have any carbon number unless significantly impairing the effects of the present invention, but is usually 12 or less, preferably 8 or less. There is a possibility that an excessively large carbon number of diaralkylamino group lowers the semiconductor characteristics, enhances the solubility resulting in re-dissolving when being overcoated, or lowers the heat resistance. The diaralkylamino group is exemplified by dibenzylamino group and diphenethylamino group.

Among the above organic groups, haloalkyl group can have any carbon number unless significantly impairing the effects of the present invention, but is usually 12 or less, preferably 8 or less. There is a possibility that an excessively large carbon number of haloalkyl group lowers the semiconductor characteristics, enhances the solubility resulting in re-dissolving when being overcoated, or lowers the heat resistance. The haloalkyl group is exemplified by α-haloalkyl group such as trifluoromethyl group.

Among the above organic groups, an aromatic hydrocarbon ring group can have any carbon number unless significantly impairing the effects of the present invention, but is usually 6 or more, preferably 10 or more and usually 30 or less, preferably 20 or less. There is a possibility that an excessively large carbon number of aromatic hydrocarbon ring group lowers the semiconductor characteristics, enhances the solubility resulting in re-dissolving when being overcoated, or lowers the heat resistance. The aromatic hydrocarbon ring group is exemplified by phenyl group and naphthyl group.

Among the above organic groups, an aromatic heterocyclic group can have any carbon number unless significantly impairing the effects of the present invention, but is usually 2 or more, preferably 5 or more and usually 30 or less, preferably 20 or less. There is a possibility that an excessively large carbon number of aromatic heterocyclic group lowers the semiconductor characteristics, enhances the solubility resulting in re-dissolving when being overcoated, or lowers the heat resistance. The aromatic heterocyclic group is exemplified by thienyl group and pyridyl group.

Further, the above atomic group may have any substituent unless significantly impairing the effects of the present invention. The substituent is, for example, halogen such as fluorine; C1-C6 alkyl group such as methyl group or ethyl group; alkenyl group such as vinyl group; C1-C6 alkoxycarbonyl group such as methoxycarbonyl group, or ethoxycarbonyl group; C1-C6 alkoxy group such as methoxy group or ethoxy group; allyloxy group such as phenoxy group or benzyloxy group; dialkylamino group such as dimethylamino group or diethylamino group; acyl group such as acetyl group; haloalkyl group such as trifluoromethyl group; and cyano group. One of the substituents may substitute for one or more carbons, or any combination consisting of two or more of the substituents may substitute at any ratio.

Furthermore, $Z^{ia}$ and $Z^{ib}$ may bind to each other to form a ring. When $Z^{ia}$ and $Z^{ib}$ bind to each other to form a ring, the example of the ring (i.e., a ring with the configuration expressed by $Z^{ia}$—CH=CH—$Z^{ib}$) including $Z^{ia}$ and $Z^{ib}$ is an aromatic hydrocarbon ring, may have a substituent, such as a benzene ring, a naphthalene ring, or an anthracene ring; an aromatic heterocyclic ring, may have a substituent, such as a pyridine ring, a quinoline ring, a furan ring, or a thiophene ring; and non-aromatic cyclic hydrocarbon such as a cyclohexane ring.

A ring formed by binding $Z^{ia}$ and $Z^{ib}$ can have any substituent unless significantly impairing the effects of the present invention. Examples of the substituent are the same as the substituents of the atomic groups serving as $Z^{ia}$ and $Z^{ib}$. One of the substituents may substitute for one or more carbons, or any combination consisting of two or more of the substituents may substitute at any ratio.

Among the above examples of $Z^{ia}$ and $Z^{ib}$, hydrogen atom is particularly preferable because of fine crystalline packing which can be expected to bring high semiconductor characteristics.

In formulae (I) and (II), $R^1$-$R^4$ independently of one another are a univalent atom or a univalent atomic group.

Examples of $R^1$-$R^4$ are the same as the above example of $Z^{ia}$ and $Z^{ib}$. In addition, if $R^1$-$R^4$ are atomic groups, the atomic groups may have any substituent unless significantly impairing the effects of the present invention. Examples of this substituent are the same as the above substituents of $Z^{ia}$ and $Z^{ib}$. One of the substituents may be substituted for one or more carbons, or any combination consisting of two or more of the substituents may be substituted at any ratio. For the purpose of enhancing the planarity of the molecule, $R^1$-$R^4$ are preferably selected from atoms such as hydrogen, halogen and others.

In formulae (I) and (II), M is a divalent metal atom or an atomic group in which a trivalent or more metal atom binds to one or more other atoms.

M is exemplified by Zn, Cu, Fe, Ni, and Co if M is a divalent metal atom. Conversely, if M is an atomic group in which a trivalent or more metal atom binds to one or more other atoms, M is exemplified by Fe—$B^1$, Al—$B^2$, Ti=O, and Si—$B^3B^4$. Here, $B^1$, $B^2$, $B^3$ and $B^4$ are univalent groups such as halogen atom, alkyl group, or alkoxy group.

The benzoporphyrin compound according to the present invention is, for example, two porphyrin rings sharing one atom to coordinate, two porphyrin rings bound to each other by adhering one or more atoms or atomic groups, or a long-chain compound formed by binding three or more porphyrin rings.

Preferable examples of the benzoporphyrin compound according to the present invention are listed below. The benzoporphyrin compound according to the present invention should by no means be limited to these examples. The examples here have symmetrical molecular structure, but a compound with an asymmetrical structure of a combination of partial structures can also be used.

[Chemical Formula 26]

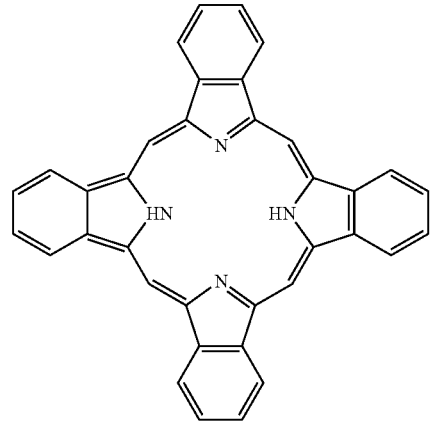

(BP-1)

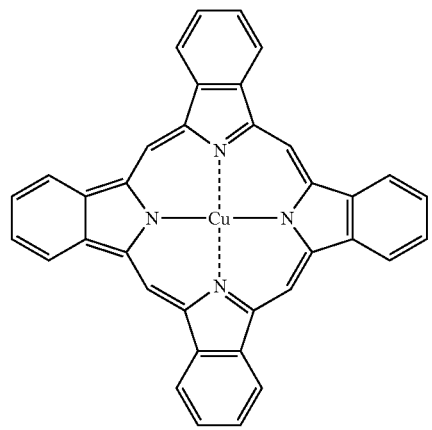

(BP-2)

(BP-3)
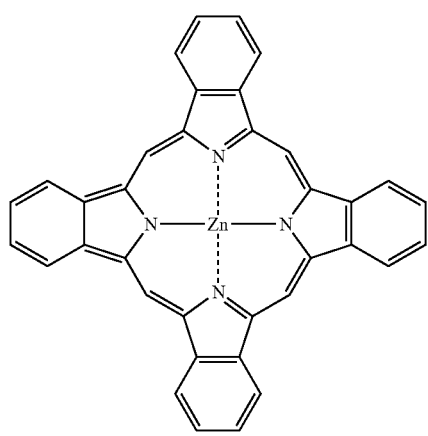
(BP-4)
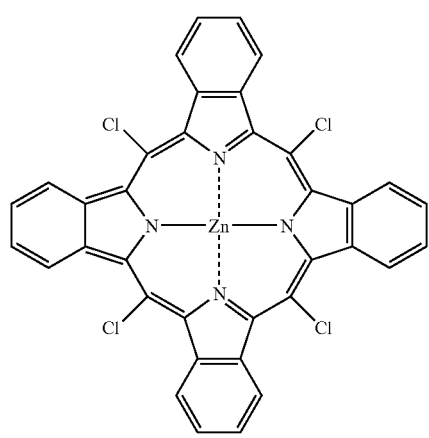
(BP-5)
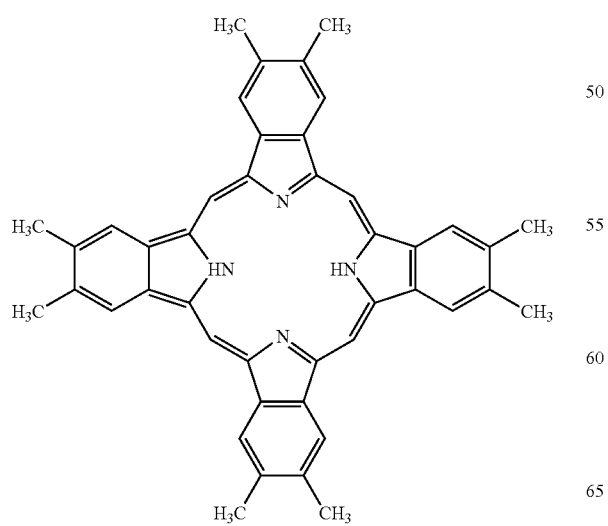
(BP-6)
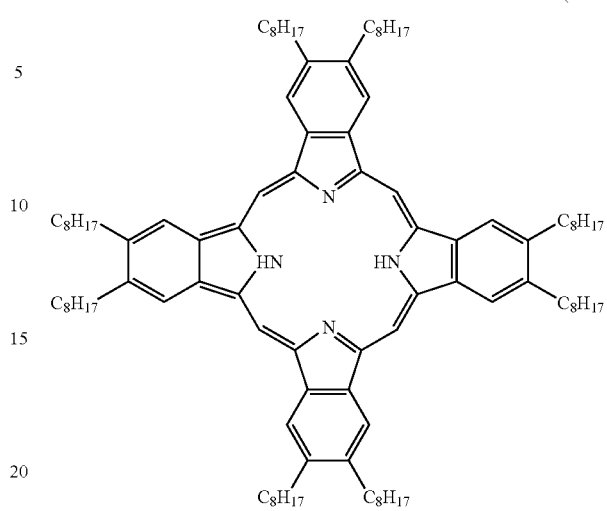
(BP-7)
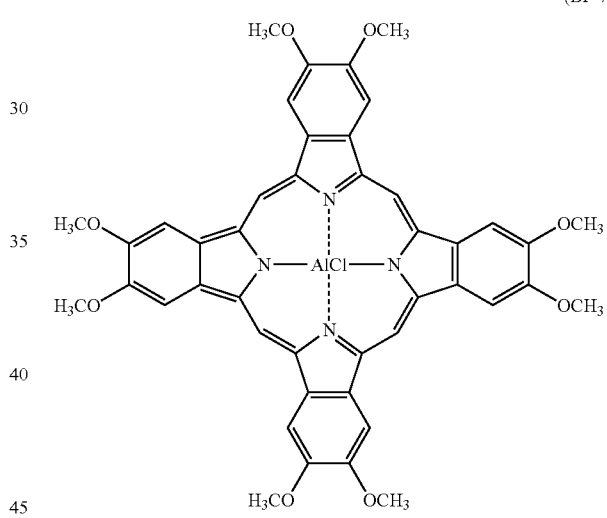
(BP-8)
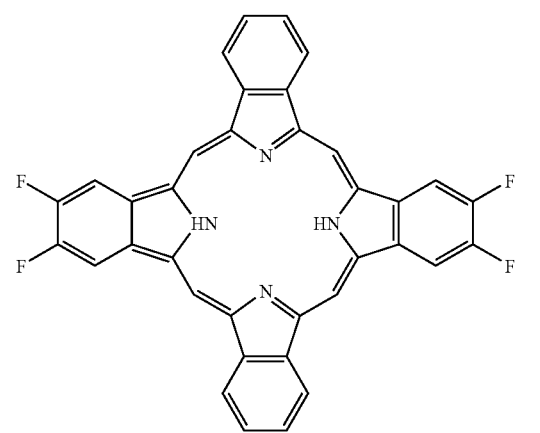

-continued (BP-9)

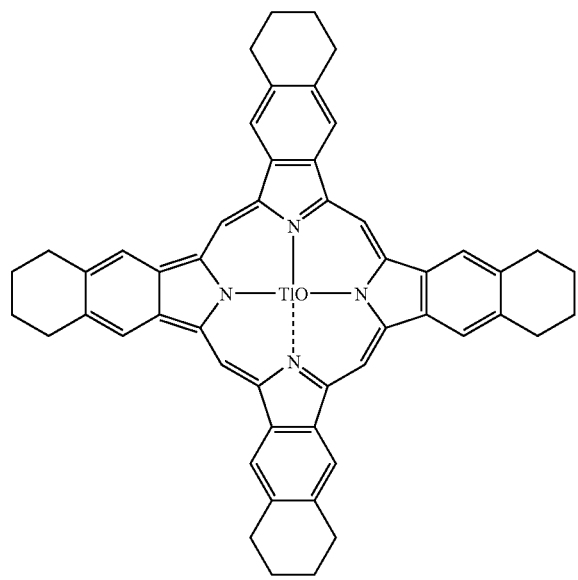

(BP-10)

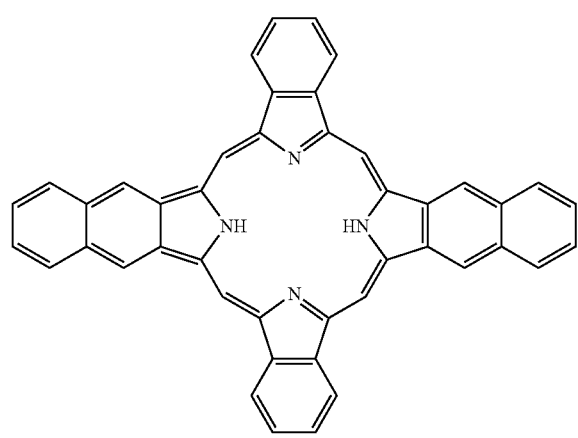

[Chemical Formula 27]

(BP-11)

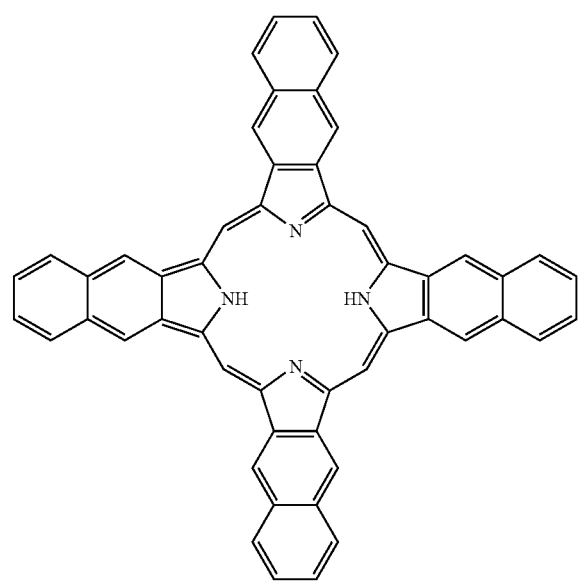

-continued (BP-12)

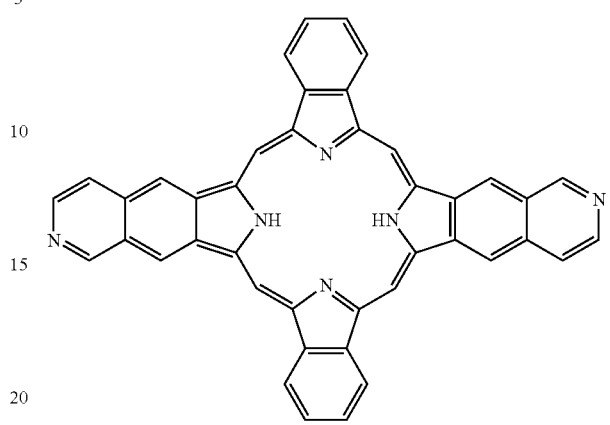

(BP-13)

[2-2. A Soluble Precursor of Benzoporphyrin Compound]

The above benzoporphyrin compound according to the present invention can be obtained by conversion by heat (herein after, sometimes called "heat conversion") performed on a soluble precursor of the benzoporphyrin compound. Here, description will be made in relation to the soluble precursor.

A soluble precursor according to the present invention is converted into a benzoporphyrin compound according to the present invention by undergoing heat conversion. The soluble precursor can have any structure as long as the soluble precursor has a bicycle ring and can be converted into the benzoporphyrin compound according to the present invention by heat conversion.

However, the soluble precursor is preferably a compound expressed by the following formula (III) or (IV).

[Chemical Formula 28]

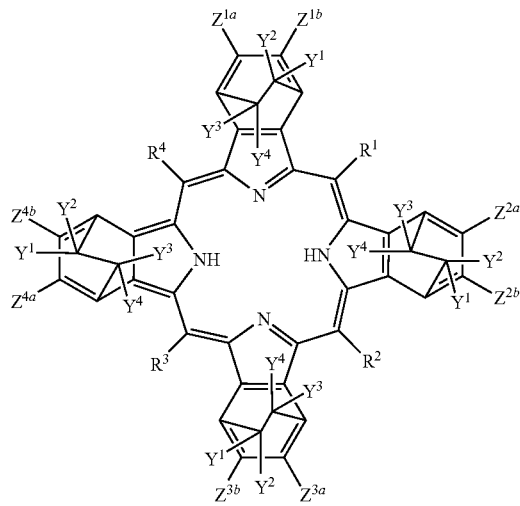

(III)

[Chemical Formula 29]

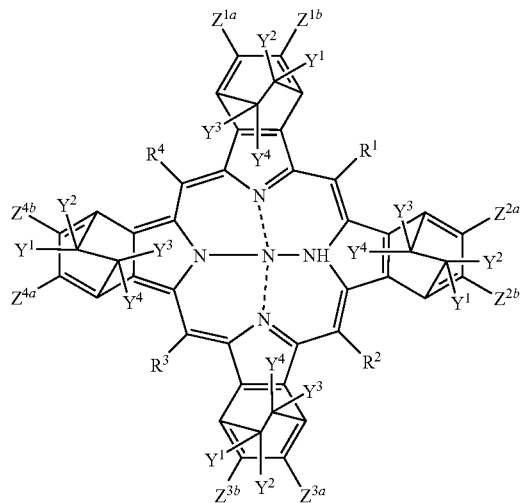

(IV)

(In formulae (III) and (IV), $Z^{ia}$ and $Z^{ib}$ (i is an integer of 1-4) independently of one another are a univalent atom or a univalent atomic group, but $Z^{ia}$ and $Z^{ib}$ may bind to each other to form a ring; $R^1$-$R^4$ independently of one another are a univalent atom or a univalent atomic group; $Y^1$-$Y^4$ independently of one another are a univalent atom or a univalent atomic group; and M is a divalent metal atom or an atomic group in which a trivalent or more metal atom binds to one or more other atoms)

$Z^{ia}$, $Z^{ib}$, $R^1$-$R^4$ and M in formulae (III) and (IV) are identical to those in formulae (I) and (II).

In above formulae (III) and (IV), $Y^1$-$Y^4$ independently of one another are a univalent atom or a univalent atomic group. Formulae (III) and (IV) each have four $Y^1$, four $Y^2$, four $Y^3$, and four $Y^4$. The four $Y^1$ may be the same or different from one another; the four $Y^2$ may be the same or different from one another; four $Y^3$ may be the same or different from one another; and four $Y^4$ may be the same or different from one another.

An atom serving as $Y^1$-$Y^4$ is exemplified by hydrogen group while an atomic group is hydroxyl group, alkyl group, and others. The alkyl group has any carbon number unless significantly impairing the effects of the present invention, but is normally 1 or more and normally 10 or less, preferably 6 or less, more preferably 3 or less. If the alkyl group has an excessively large carbon number which means that a group to be eliminated is large, it is difficult for the eliminated group to volatilize so that the eliminated groups may remain in the layer. The exemplary alkyl group here is methyl group, ethyl group, and others.

If $Y^1$-$Y^4$ are each atomic groups, the atomic groups may have any substituents unless significantly impairing the effects of the present invention. The substituents are exemplified by those of the above $Z^{ia}$ and $Z^{ib}$ One of the substituents may be substituted for one or more carbons, or any combination consisting of two or more of the substituents may be substituted at any ratio.

Among the above examples, $Y^1$-$Y^4$ are preferably hydrogen atom and alkyl groups with a carbon number of 10 or less. A smaller carbon number causes the eliminating group generated by the conversion to have a small molecular weight so that the group easily evaporates out of the reaction system. In addition, introducing alkyl group improves the solubility of the porphyrin compound.

The soluble precursor according to the present invention is converted into the benzoporphyrin compound according to the present invention by heat conversion. The reaction occurring in the conversion is not limited, but for a soluble precursor expressed by the above formula (III) or (IV), application of heat eliminates the compound of the below formula (V). The eliminating reaction proceeds quantitatively and converts the soluble precursor into the benzoporphyrin compound according to the present invention.

[Chemical Formula 30]

(V)

The heat conversion is detailed, taking the above benzoporphyrin compound BP-1 as an example. One of the soluble precursors of benzoporphyrin compound BP-1 can be the compound (herein after called "BP-1 precursor") expressed by formula (III) in which $Z^{ia}$, $Z^{ib}$, $R^1$-$R^4$ and $Y^1$-$Y^4$ are all hydrogen atom. However, it should be noted that the soluble precursor of the benzoporphyri compound BP-1 is not limited to the above BP-1 precursor.

When the BP-1 precursor is heated, ethylene groups are eliminated from each of four rings coupled to the porphyrin ring of the BP-1 precursor. This ethylene elimination obtains benzoporphyrin compound BP-1 and this conversion is expressed by the reaction formula below.

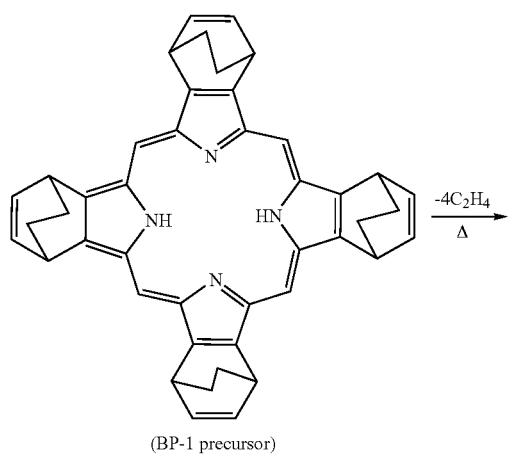

(BP-1 precursor)

$-4C_2H_4$
Δ

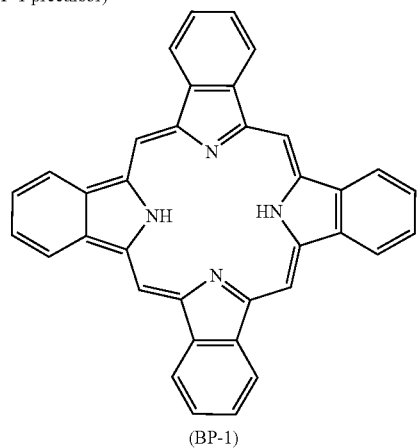

(BP-1)

During the conversion of the soluble precursor to the benzoporphyrin compound according to the present invention, the temperature conditions are not limited as long as the above reaction proceeds, but is usually 100° C. or higher, preferably 150° C. or higher. At excessively low temperatures, the conversion may take a long time, which is not preferable for practical reasons. The upper limit is arbitrary, but is usually 400° C. or lower, preferably 300° C. or lower because excessively high temperatures may decompose or sublimate the soluble precursor.

For the conversion of the soluble precursor to the benzoporphyrin compound according to the present invention, the time period for heating is not limited to as long as the above reaction proceeds, but is usually 10 seconds or longer, preferably 30 seconds or longer, and is usually 100 hours or shorter, preferably 50 hours or shorter. An excessively short heating time period may inadequately convert the precursor and an excessively long heating time period may not be practically preferable.

During the conversion according to the soluble precursor to the benzoporphyrin compound of the present invention, the atmosphere is not limited to as long as the above reaction proceeds, but is preferably an inert atmosphere. The inert gas used for this atmosphere is exemplified by nitrogen, a rare gas and others and may be a single kind or any combination of two or more kinds at any ratio.

The soluble precursor according to the present invention is high in solubility in solvent such as organic solvent. The specific solubility differs with the kinds of the solvent. The solubility of the soluble precursor in chloroform at 25° C. is usually 0.1 g/L or more, preferably 0.5 g/L or more, more preferably 1 g/L or more. The upper limit of the solubility is not particularly limited, but is usually 1000 g/L or less.

In contrast to the high solubility of the soluble precursor according to the present invention, the benzoporphyrin compound according to the present invention derived from the above precursor is extremely low in solubility in solvent such as organic solvent. It is estimated that the low solubility of the benzoporphyrin compound according to the present invention is caused from the planer structure thereof while the soluble precursor according to the present invention has a non-planer structure and therefore is high in solubility and is resistant to crystallization. Use of the difference in solubility in solvent facilitates the formation of a layer including the benzoporphyrin compound by coating, which can be conducted in the following manner, for example. The soluble precursor according to the present invention is dissolved in a solvent to prepare the solution and the solution is applied to thereby form a fine amorphous or mostly amorphous layer. The layer is then heated to convert the soluble precursor according to the present invention to finally obtain a layer made of a benzoporphyrin compound having high planarity. If the soluble precursor is a compound expressed by formula (III) or (IV) in which $Y^1$-$Y^4$ are all hydrogen atom as in the above example, ethylene molecules eliminate, are unlikely to remain in the resultant layer and are therefore preferable for toxicity and safety aspects.

The production method of the soluble precursor according to the present invention is not limited and can adopt any method known to the public. Taking the above BP-1 precursor as an example, the compound can be produced by the following synthesis route. Here, Et and t-Bu represent an ethyl group and a t-butyl group, respectively.

[Chemical Formula 32]

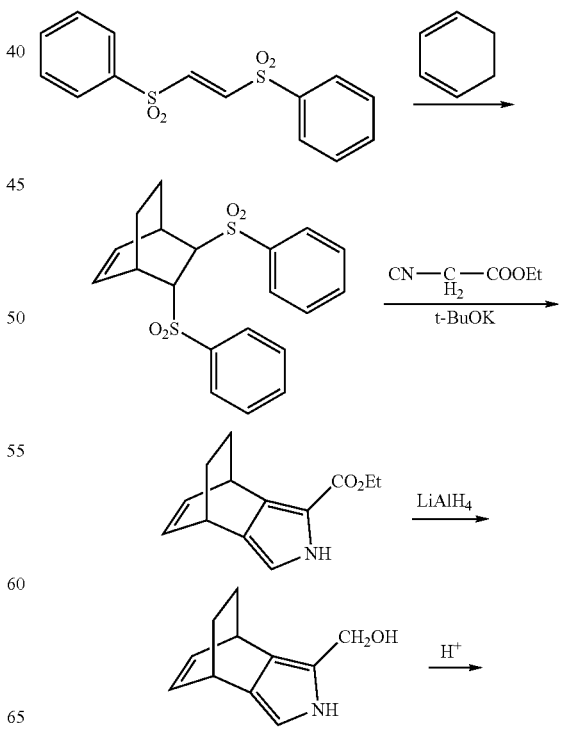

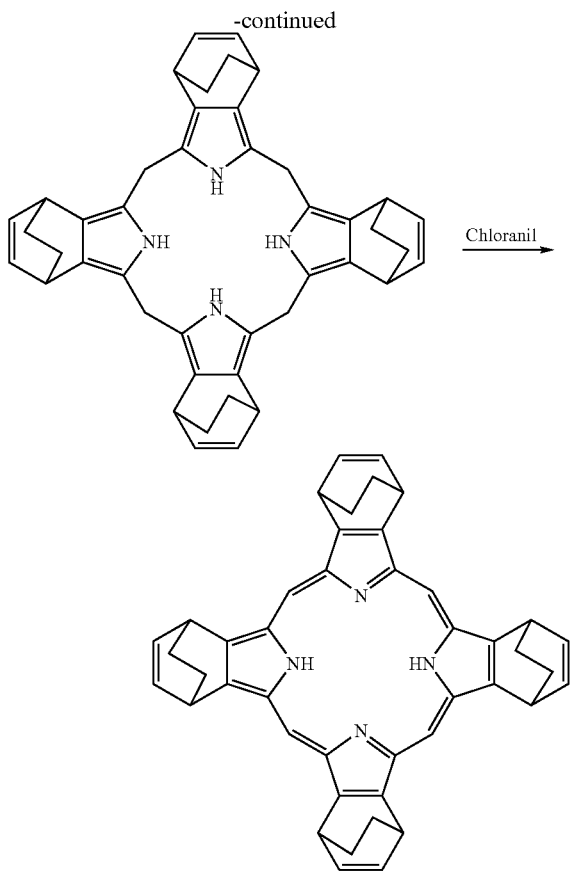

[3. Solid Semiconductor Material]

As one of the preferable embodiments of the method for producing an organic photoelectric conversion device of the present invention, the above method (2) has a layer formation step of mixing latent pigment and solid semiconductor material and coating the mixture to form a precursor layer. The organic photoelectric conversion device produced by the above method includes an active layer containing a solid semiconductor material.

The solid semiconductor material is a material at least the solid state of which can transport an electric charge. At that time, the solid semiconductor material can have semiconductor characteristics of any extent as long as the material can serve as the material for an organic photoelectric conversion device. However, the carrier mobility of the solid semiconductor material is usually $10^{-7}$ cm$^2$/Vs or more, preferably $10^{-5}$ cm$^2$/Vs or more. Since electric conductivity is defined in terms of the product of carrier mobility and carrier density, a material, if having some carrier mobility and including therein carrier caused by, for example, heat, doping, and injection from the electrodes, can transport an electric charge. The larger carrier mobility is more preferable for the solid semiconductor material.

Semiconductor material, such as the solid semiconductor material and the pigment having semiconductor characteristics according to the present invention, has two kinds of carriers: electrons and positive holes, among which a carrier larger in density is called the majority carrier. The majority carrier usually depends on the kind of semiconductor material and doping state. Semiconductor material with the majority carrier of electrons is called an n type while a material with the majority carrier of positive holes is called a p type, and semiconductor material in which the number of electrons and the number of positive holes are equal is called i-type.

An organic photoelectric conversion device separates electrons from positive holes and takes the separated electrons and positive holes out of the device in response to absorption of light, so that most of the organic photoelectric conversion devices have the active layer including both p-type and n-type semiconductor materials. For this reason, if the pigment of the present invention has a semiconductor characteristic, it is preferable that the majority carrier of the pigment is opposite in polarity from that of the solid semiconductor material. In other words, when the pigment according to the present invention is a semiconductor of a p-type, the solid semiconductor material is preferably a semiconductor of an n-type. Conversely, when the pigment according to the present invention is a semiconductor of an n-type, the solid semiconductor material is preferably a semiconductor of a p-type. If the organic photoelectric conversion device has two or more pigments or solid semiconductor material, it is preferable that at least one of the pigments has a majority carrier with the opposite polarity to that of at least one of the solid semiconductor materials. In addition, the organic photoelectric conversion device may have pigments and/or solid semiconductor materials the same in polarity. Specifically, if the pigment according to the present invention is made of pentacene or benzoporphyrin, the solid semiconductor material that is to be used in combination with the pigment should be an n-type semiconductor because the pigment functions as a p-type semiconductor. Such a solid semiconductor material is exemplified by naphthalene tetracarboxylic diimide, fullerene ($C_{60}$), titania, or zinc oxide.

However, the p type and n type are not unconditionally determined according to the kinds of semiconductors. For example, even in use of semiconductors of the same type in combination, one of the semiconductors may function as a p type while the other functions as an n type due to the energy levels (HOMO, LUMO level, Fermi level) thereof or the doping state.

In the organic photoelectric conversion device of the present invention, the solid semiconductor material is usually in an aggregation state in the form of particles, fibers and others. Among such various forms, the solid semiconductor material is preferably particles or fibers (herein after collectively called particles). The particle diameter of the solid semiconductor material is not limited. However the particle (or fibrous) diameter of the solid semiconductor material is normally 2 nm or more, preferably 5 nm or more, and usually 10 μm or less, preferably 1 μm or less. It has been difficult for conventional techniques to finely disperse such particles with small diameter along with pigments in a semiconductor mixture layer, particularly in a semiconductor mixture layer in which an organic pigment and an inorganic solid semiconductor material coexist. The present invention however can finely disperse even such particles with small diameters in the semiconductor mixture layer.

Observation with an electron microscope can measure particle diameters of the solid semiconductor material in the semiconductor mixture layer.

The type of solid semiconductor material is not specifically limited, and the only requirement being that it may be used as a material for the organic photoelectric conversion device. The solid semiconductor material is exemplified by an organic semiconductor such as naphthalene (or perylene) tetracarboxylic diimide, fullerene ($C_{60}$), or derivatives thereof; an oxide semiconductor such as titania, zinc oxide, or copper oxide; a compound semiconductor such as GaAs, GaP, In P, CdS, CdSe, GaN, CuInSe$_2$, or Cu(InGa)Se$_2$; and single elemental semiconductor such as Si or Ge.

Further, in the method for producing the organic photoelectric conversion device, the solid semiconductor material may be dissolved or dispersed in the form of particles in a coating solution (that is described below). The solid semiconductor material dissolved in solvent is, for example, an organic semiconductor material which can be formed into a layer by a solution process, and is specifically exemplified by conjugated macromolecules such as polythiophene, polyfluorene, polythienylenevinylene, or polyacetylene, polyaniline; and alkyl-substitutedoligothiophene.

The solid semiconductor material dispersed in the form of particles is, for example, organic semiconductor particles or inorganic semiconductor particles. The organic semiconductor particles are formed of, for example, crystalline organic semiconductor with low solubility. Such semiconductor is exemplified by condensed aromatic hydrocarbons, such as naphthacene, pentacene, pyrene, fullerene; oligothiophenes, such as α-sexithiophene, including four or more thiophene rings; compounds in which four or more of thiophene ring, benzene ring, fluorene ring, naphthalene ring, anthracene ring, thiazole ring, thiadiazoles ring, or benzothiazole ring are linked; aromatic carboxylic anhydrides such as naphthalene tetracarboxylic anhydride, naphthalene tetracarboxylic diimide, perylenetetracarboxylic anhydride, perylenetetracarboxylic diimide, or imide thereof; and macrocyclic compounds such as copper phthalocyanine, perfluorocopper phthalocyanine, tetrabenzoporphyrin and metallic salt thereof. In addition, the inorganic semiconductor such as above-described oxide semiconductor, compound semiconductor, and single elemental semiconductor usually take the form of particles in the coating solution.

Above all, a preferable solid semiconductor material is an inorganic semiconductor such as above-described oxide semiconductor, compound semiconductor, and single elemental semiconductor. An inorganic semiconductor is excellent in durability and can be formed into various nano particles. Further, many inorganic semiconductors have superior durability and large carrier mobility, so that improved efficiency of the organic photoelectric conversion device may be expected. In particular, titania and zinc oxide are preferable because of the advantage of low cost.

If an inorganic semiconductor is used as the solid semiconductor material, the solid semiconductor material is preferably inorganic particles, which are advantageously introduced into the layer with ease by application of the solution mixture and advantageously provides a large interface where carrier separation occurs.

[4. The Organic Photoelectric Conversion Device]
[4-1. Outline of the Organic Photoelectric Conversion Device]

The organic photoelectric conversion device includes at least a substrate, a pair of electrodes (i.e. a positive electrode and a negative electrode) which are formed on the substrate and at least one of which is transparent, an electron donor layer which is formed between the pair of electrodes and which includes an electron donor (or a semiconductor of a p-type), and an electron acceptor layer which is formed between the pair of electrodes and which includes an electron acceptor (or a semiconductor of an n-type). The electron donor layer and the electron acceptor layer may be separated layers or may be a single layer functioning as both the electron donor layer and the electron acceptor layer.

An active layer is formed of at least the above electron donor layer and electron acceptor layer. In other words, the active layer is a multilayer (i.e., a hetero junction type) formed of the electron donor layer and the electron acceptor layer if the two layers are separated. Conversely, if the electron donor layer and the electron acceptor layer are formed into a single layer, the active layer is identical to the above single layer (i.e., a bulkhetero junction type). The active layer of the organic photoelectric conversion device however includes one or more pigments according to the present invention.

The organic photoelectric conversion device of the present invention includes a p-type semiconductor layer and an n-type semiconductor layer, among which the above layer is preferably deposited.

Unless the effects of the present invention are significantly impaired, the organic photoelectric conversion device may include another element other than the above.

The active layer of the organic photoelectric conversion device however includes one or more pigments of the present invention.

In production of the organic photoelectric conversion device of the present invention, the latent pigment according to the present invention is formed into the pigment according to the present invention to form the active layer. An active layer including a pigment can generally be formed by vacuum deposition or wet coating. However, it has been difficult for conventional coating methods to coat with pigments because of their low solubility in organic solvents and the like. On the contrary, an active layer made from a pigment can be easily formed by converting a latent pigment into the pigment after coating with the latent pigment according to the present invention to form a layer.

This case makes it possible to control the crystallinity and the shape of the layer to be obtained. Specifically, a layer of a latent pigment is formed by a wet process and the latent pigment is converted into a pigment by heating so that a crystalline pigment high in planarity can be used. That can improve the mobility and consequently improve the photoelectric conversion characteristics of the organic photoelectric conversion device. In addition, forming pigment between the active layer and a negative or positive electrode makes it possible to improve the characteristics of the organic photoelectric conversion device.

Hereinafter, description will now be made in relation to the organic photoelectric conversion device of the present invention by way of embodiments. However, the present invention should by no means be limited to the below embodiments. The elements of the below embodiments can be used in any combination without departing from the gist of the present invention.

[4-2. First Embodiment]

FIG. 1 is a schematic sectional view of an organic photoelectric conversion device according to a first embodiment of the present invention. As shown in FIG. 1, organic photoelectric conversion device 1 of the first embodiment includes substrate 2, positive electrode 3, p-type semiconductor layer 4, electron donor layer 5, electron acceptor layer 6, n-type semiconductor layer 7, and negative electrode B. In this organic photoelectric conversion device 1, the above electron donor layer 5 and electron acceptor layer 6 form active layer 9. In the first embodiment, active layer 9 is formed of electron donor layer 5 and electron acceptor layer 6. p-type semiconductor layer 4 and n-type semiconductor layer 7 are not essential but are preferably included. It is preferable that the first embodiment uses the benzoporphyrin compound according to the present invention as pigment. As a latent pigment corresponding to the pigment, the soluble precursor according to the present invention is preferably used.

[The Substrate]

Substrate 2 serves as a support of organic photoelectric conversion device 1. Accordingly, on the substrate 2, there are formed positive electrode 3, p-type semiconductor layer 4, active layer 9 (i.e., electron donor layer 5 and electron acceptor layer 6), n-type semiconductor layer 7, and negative electrode 8.

Any material (substrate material) can be used for substrate unless significantly impairing effects of the present invention. In this embodiment, light is taken into organic photoelectric conversion device 1 through substrate 2, so the substrate material should be transparent. The light to be taken in is usually visible light, so that the transparent substrate material has visible-light transmittance of usually 60% or higher, preferably 80% or higher.

From this viewpoint, the substrate material is preferably exemplified by inorganic material such as quartz, glass, sapphire, or titania; organic material such as polyethylene terephthalate, polyethylene naphthalate, polyether sulfone, polyimido, nylon, polystyrene, polyvinyl alcohol, ethylenevinyl alcohol copolymer, fluorocarbon polymer film, vinyl chloride, polyethylene, cellulose, polyvinylidene chloride, aramid, polyphenylene sulfide, polyurethane, polycarbonate, polyarylate, or polynorbornene; paper material such as a paper sheet or synthetic paper; and composite material such as metal of stainless steel, titanium, aluminium and others whose surface is laminated or coated to impart insulation. Among the above examples, glass and synthetic resin, such a spolyester, polymethacrylate, polycarbonate, or polysulfone, are preferable. A single substrate material may be independently used or two or more materials may be used in any combination at any ratio.

If synthetic resin is used for the substrate material, attention is preferably paid to gas barrier characteristics. Excessively low gas barrier characteristics of substrate 2 may result in outside air passing through substrate 2 deteriorating organic photoelectric conversion device 1. For this reason, when substrate 2 is formed with synthetic resin, it is preferable to form a layer (gas barrier layer) having gas barrier characteristics on either or both sides of the synthetic resin substrate. Such a gas barrier layer is exemplified by a dense silicon oxide layer.

The shape of substrate 2 is not limited and can take the form of a plate, a film or a sheet. The thickness of substrate 2 is not limited but is usually 5 μm or more, preferably 20 μm or more, and usually 20 mm or less, preferably 10 mm or less. If substrate 2 is too thin, it may lack the strength to support organic photoelectric conversion device 1, and conversely if substrate 2 is too thick, there is a possibility of excessively increasing costs and weight.

[The Positive Electrode]

Positive electrode 3 is formed on substrate 2. Positive electrode 3 receives positive holes generated by electric charge separation in active layer 9 through p-type semiconductor layer 4.

Any material (positive electrode material) with conductivity can be used for positive electrode 3 unless significantly impairing the effects of the present invention. However, since light is taken into organic photoelectric conversion device 1 through positive electrode 3 in this embodiment, the positive electrode material should be transparent. The light taken in is usually visible light, so that the transparent positive electrode material has visible-light transmittance of usually 60% or higher, preferably 80% or higher.

From this viewpoint, the positive electrode material is preferably exemplified by metal such as platinum, gold, silver, aluminium, chromium, nickel, copper, titanium, magnesium, calcium, barium, or sodium, and alloy thereof; metal oxide such as indium oxide or tin oxide and the alloy (ITO) thereof; conductive polymer such as polyaniline, polypyrrole, polythiophene, or polyacetylene; polymer generated by adding to the above conductive polymer, a dopant, exemplified by acid such as hydrochloric acid, sulfuric acid, or sulfonic acid, Lewis acid such as $FeCl_3$, halogen such as iodine, and a metal atom such as sodium or potassium; and conductive composite material in which conductive particles such as metal particles, carbon black, fullerene, or carbon nanotube is dispersed in a matrix such as a polymer binder. Above all, a preferable positive electrode material is metal oxide such as indium tin oxide or indium zinc oxide. A single positive electrode material may be independently used or two or more kinds may be used in any combination at any ratio.

In production of transparent positive electrode, the material thereof is exemplified by metal oxide such as ITO, or indium zinc oxide (IZO) and a metal thin film.

The electrodes (the positive electrode, and the negative electrode detailed below) have a function for collecting positive holes and electrons produced inside the active layer. Accordingly, it is preferable that the electrodes are made of materials suitable for collecting positive holes and electrons. From this viewpoint, a material suitable for collecting positive holes is exemplified by materials with high work function such as Au or ITO.

The thickness of positive electrode 3 is not limited, but is usually 10 nm or thicker, preferably 50 nm or thicker and usually 1000 nm or thinner, preferably 300 nm or thinner. Positive electrode 3 with an excessive thickness may lower transparency and also increase the costs, while excessively thin positive electrode 3 may increase the series resistance and thereby may lower the performance.

The positive electrode can be formed in any method of, for example, a dry process such as vacuum deposition or sputtering. Alternatively, the positive electrode can be formed in a wet process with conductive ink and others, for example. In this case, any conductive ink can be used and the ink is exemplified by conducting polymer and metal particle dispersed solution. Further, the positive electrode may take the form of two or more laminated layers and the characteristics (e.g., electric characteristic or wet characteristics) can be improved by a surface process).

[The P-type Semiconductor Layer]

P-type semiconductor layer 4 is preferably formed on positive electrode 3.

A preferable material (p-type semiconductor material) for p-type semiconductor layer 4 is capable of efficiently transporting positive holes generated in active layer 9 (particularly electron donor layer 5 in the present embodiment) to positive electrode 3. For this purpose, it is preferable that the p-type semiconductor material has high positive hole mobility, high conductivity, and small positive hole injection barrier relative to positive electrode 3, and small positive hole injection barrier from active layer 9 (particularly electron donor layer 5 in the present embodiment) to p-type semiconductor layer 4.

In the present embodiment, since light is taken into organic photoelectric conversion device 1 through p-type semiconductor layer 4, the p-type semiconductor layer is preferably transparent. The light taken in is usually visible light, so that the p-type semiconductor material has visible-light transmittance of usually 60% or higher, preferably 80% or higher. It is satisfactory that p-type semiconductor material is, if not transparent, thin.

In order to reduce production costs and to increase the size of organic photoelectric conversion device 1, the p-type semiconductor material is preferably an organic semiconductor material and thereby the p-type semiconductor layer is a p-type organic semiconductor layer.

With the foregoing facts in view, a preferable p-type semiconductor material is exemplified by pigment, preferably a porphyrin compound or a phthalocyanine compound, which may have the center metal or may be non-metallic. These compounds are exemplified by a porphyrin compound such as 29H,31H-phthalocyanine, copper(II) phthalocyanine, zinc (II) phthalocyanine, titaniumphthalocyanine oxide, or copper (II)4,4',4'',4'''-tetraaza-29H,31H-phthalocyanine; and a porphyrin compound such as tetrabenzoporphyrin, tetrabenzo copperporphyrin, or tetrabenzo zincporphyrin.

Other than a pigment such as a porphyrin compound or a phthalocyanine compound, a preferable example of the p-type semiconductor material is a system in which positive hole transporting polymer and a dopant are mixed. Such a positive hole transporting polymer is exemplified by poly (ethylenedioxythiophene), polythiophene, polyaniline, and polypyrrole. In the meanwhile, the dopant is exemplified by iodine; acid such as poly(styrenesulfonic acid), or camphor sulfonic acid; and Lewis acid such as $PF_5$, As $F_5$, and $FeCl_3$.

A single p-type semiconductor material may be independently used or two or more materials may be used in any combination at any ratio.

The thickness of p-type semiconductor layer 4 is not limited, but is usually 3 nm or thicker, preferably 10 nm or thicker and usually 200 nm or thinner, preferably 100 nm or thinner. P-type semiconductor layer 4 with an excessive thickness may lower the transmittance and increase the series resistance while excessively thin p-type semiconductor layer 4 may make the layer uneven.

P-type semiconductor layer 4 can be formed in any method, but in formation of p-type semiconductor layer 4 including pigment, a preferable method applies latent pigment, which is then converted.

[The Electron Donor Layer]

Among the layers constituting active layer 9, electron donor layer 5 contains an electron donor and is formed on p-type semiconductor layer 4. The electron donor contained in electron donor layer 5 preferably has characteristics of efficient absorption of visible light, high mobility to efficiently transport positive holes excited by light, and others. In addition to the above general requirement, it is preferable that the electron donor has heat resistance to usually 100° C. or higher, preferably 120° C. or higher, more preferably 150° C. or higher to suit outdoor use.

Such an electron donor is exemplified by the pigment according to the present invention. Therefore, in organic photoelectric conversion device 1 of the present embodiment, which includes the pigment according to the present invention serving as the electron donor, is included in electron donor layer 5. A single pigment of the present invention may be independently used or two or more kinds may be used in any combination at any ratio.

Further, electron donor layer 5 can concurrently or independently use an extra electron donor, which is exemplified by condensed aromatic hydrocarbons such as naphthacene, pentacene, pyrene, or fullerene; oligomers such as α-sexithiophene; macrocyclic compounds such as phthalocyanine, or porphyrin; oligothiophenes including four or more thiophene rings, represented by α-sexithiophene and dialkylsexithiophene; compounds in which four or more of thiophene ring, benzene ring, fluorene ring, naphthalene ring, anthracene ring, thiazole ring, thiadiazoles ring, or benzothiazole ring are linked; condensed thiophenes such as anthradithiophene, dibenzothieno-bis-thiophene, or α, α'-bis (dithieno[3,2-b':2',3'-d]thiophene) and their derivatives; polythiophene, polyfluorene, polythienylenevinylene, polyphenylenevinylene, polyphenylene, polyacetylene, polypyrrole, and polyaniline. Among the above examples, regioregular polythiophene exhibiting self organization, and liquid crystal macromolecules such as polyfluorene and their copolymers are preferable. A single extra electron donor may be independently used or two or more kinds may be used in any combination at any ratio.

If electron donor layer 5 contains the pigment according to the present invention, it is preferable that the pigment according to the present invention is largely used. Specifically, the pigment according to the present invention is usually 50 weight % or more, preferably 70 weight % or more, further preferably 90 weight % or more of the electron donor. It is particularly preferable that the electron donor uses only the pigment according to the present invention with the intention of obtaining the advantages brought by the use of the pigment according to the present invention.

The thickness of electron donor layer 5 is not limited, but is usually 5 nm or thicker, preferably 10 nm or thicker, and usually 500 nm or thinner, preferably 200 nm or thinner. If electron donor layer 5 is too thick, there is a possibility of increase in the series resistance. Conversely, an excessively thin electron donor layer 5 may not be able to absorb enough light for photoelectric conversion.

[The Electron Acceptor Layer]

Among the layers constituting active layer 9, electron acceptor layer 6, contains therein an electron acceptor, and is formed on electron donor layer 5. The electron acceptor included in electron acceptor layer 6 efficiently separates the charge of the electrons generated at the conjunction interface with the electron donor and transports the electrons to n-type semiconductor layer 7.

In order to efficiently transport the electrons from electron donor layer 5 to electron acceptor layer 6, the relative relationship between the lowest unoccupied molecular orbital (LUMO) of electron donor layer 5 and that of electron acceptor layer 6 is important. Specifically, the LUMO of the electron donor serving as the material for electron donor layer 5 is preferably a certain energy amount higher than that of the electron acceptor serving as the material for electron acceptor layer 6, that is, the electron affinity of the electron acceptor is preferably the certain energy amount higher than that of the electron donor. The above certain energy amount varies according to the usage, but is usually 0.1 eV or higher, preferably 0.2 eV or higher, more preferably 0.3 eV or higher and is usually 0.6 eV or lower, preferably 0.4 eV or lower.

An electron acceptor satisfying the above condition is exemplified by a pigment and a fullerene compound. Above all, the following are examples of preferable used pigments and fullerene compounds.

[Chemical Formula 33]

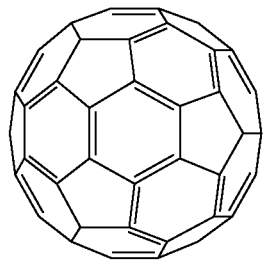

F-1 ($C_{60}$)

F-2

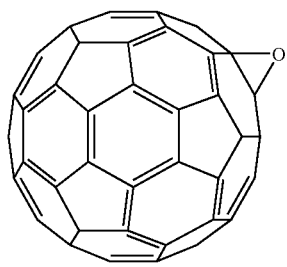

F-3 (C₇₀)

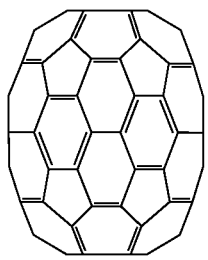

F-4 (PCBM)

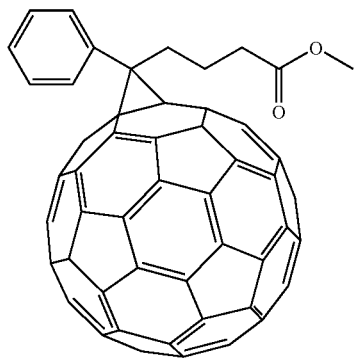

F-5

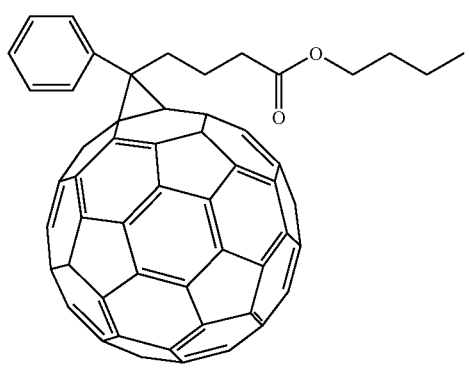

F-6

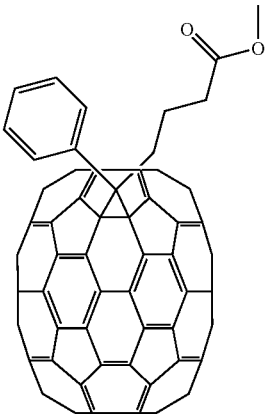

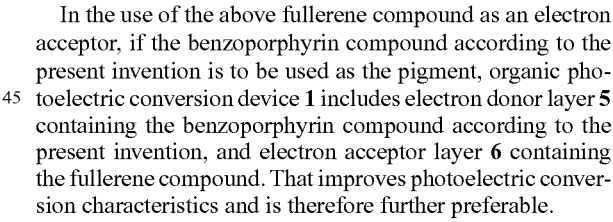

In the use of the above fullerene compound as an electron acceptor, if the benzoporphyrin compound according to the present invention is to be used as the pigment, organic photoelectric conversion device 1 includes electron donor layer 5 containing the benzoporphyrin compound according to the present invention, and electron acceptor layer 6 containing the fullerene compound. That improves photoelectric conversion characteristics and is therefore further preferable.

As the electron acceptor, compound other than a fullerene compound can be used together with the fullerene compound, or can be substituted for the fullerene compound. However, if electron acceptor layer 6 contains a fullerene compound, it is preferable that the electron acceptor that is to be used largely contains a fullerene compound. Specifically, the fullerene compound contained in the electron acceptor is 50 weight % or more, preferably 70 weight % or more, more preferably 90 weight % or more. It is still further preferable to use only the fullerene compound, so that the advantages of using the fullerene compound can be surely obtained.

The electron acceptor may be a pigment of an n type. In particular, production of a pigment of a p type and a pigment of an n type from latent pigment is preferable for durability.

A single electron acceptor may be independently used or two or more kinds of electron acceptors may be used in any combination at any ratio.

The thickness of electron acceptor layer 6 is not limited, but is usually 5 nm or thicker, preferably 10 nm or thicker, and usually 500 nm or thinner, preferably 200 nm or thinner. If electron acceptor layer 6 is excessively thick, there is possibility of an increase in series resistance. Conversely, excessively thin layer thickness may impair the coating ratio.

[The N-type Semiconductor Layer]

N-type semiconductor layer 7 is preferably formed on the electron acceptor layer 6. The functions that the n-type semiconductor layer 7 is expected to perform are to transport electrons to the negative electrode and to additionally prevent negative electrode 8 from quenching excitons generated in response to light absorption in active layer 9 (i.e., electron donor layer 5 and electron acceptor layer 6) similarly to the p-type semiconductor layer. For these purposes, it is preferable that the material (n-type semiconductor material) for n-type semiconductor layer 7 has an optical gap larger than those possessed by the electron donor and acceptor.

From this viewpoint, an n-type semiconductor material is preferably exemplified by an organic compound of an electron carrier such as a phenanthroline derivative or a silol derivative; and an inorganic semiconductor such as $TiO_2$. A single n-type semiconductor material may be independently used or two or more kinds may be used in any combination at any ratio.

The thickness of n-type semiconductor layer 7 is not limited, but is usually 2 nm or thicker, preferably 5 nm or thicker and usually 200 nm or thinner, preferably 100 nm or thinner. Such a thickness of N-type semiconductor layer 7 in the above range makes it possible to use effects from light interference caused from light incident from positive electrode 3, if not being absorbed in active layer 9 but passing through active layer 9, being reflected by negative electrode 8 and thereby returning active layer 9.

[The Negative Electrode]

Negative electrode 8 is formed on n-type semiconductor layer 7. Negative electrode 8 receives electrons generated by electric charge separation in active layer 9 through n-type semiconductor layer 7.

Any material (negative electrode material) with conductivity can be used for negative electrode 8 unless significantly impairing the effects of the present invention. However, for the sake of efficient electron collection, it is preferable to use a metal that provides a good contact with n-type semiconductor layer 7 as the material.

From this viewpoint, the preferable material for the negative electrode is exemplified by metal such as magnesium, indium, calcium, aluminum, or silver; and their alloys.

If the negative electrode is transparent, the material is exemplified by oxide such as ITO, or indium zinc oxidezinc (IZO); and metal thin film.

As has been described in relation to the above positive electrode, in order to use a material suitable for collecting positive holes and electrons for electrodes, a material suitable for collecting electrons is exemplified by materials with a low work function such as Al.

Further, efficiency of organic photoelectric conversion device 1 is effectively improved by inserting a ultrathin insulting layer (0.1-5 nm) made of LiF, $MgF_2$, $Li_2O$ or the like into the interface between negative electrode 8 and n-type semiconductor layer 7.

The thickness of negative electrode 8 is not limited, but is usually 10 nm or thicker, preferably 50 nm or thicker and usually 1000 nm or thinner, preferably 500 nm or thinner. Negative electrode 8 with an excessive thickness may increase the time and costs for processing and is therefore not practically preferable, while an excessively thin negative electrode 8 may increase the series resistance and thereby may lower the performance.

The negative electrode can be formed by any method, which is exemplified similarly to those of the positive electrode. Further, the negative electrode may take the form of two or more laminated layers and characteristics (e.g., electric characteristics or wet characteristics) can be improved by a surface process.

[The Production Method]

Organic photoelectric conversion device 1 of the this embodiment can be produced by converting the latent pigment such as the soluble precursor according to the present invention into the pigment in the step of forming the pigment layer. This explanation assumes that electron donor layer 5 is a pigment layer.

Organic photoelectric conversion device 1 of the present embodiment can be produced by converting the latent pigment such as the soluble precursor according to the present invention into the pigment such as the benzoporphyrin compound according to the present invention in the step of forming the pigment layer. The following is one example of the specific methods for production.

First of all, substrate 2 is prepared on which positive electrode 3 is then formed (the positive-electrode forming step). The method for forming positive electrode 3 is not limited but can be formed by sputtering or vacuum deposition, for example.

In succession, p-type semiconductor layer 4 is formed on positive electrode 3 (the p-type semiconductor layer forming step). p-type semiconductor layer 4 can be formed in any method. If the p-type semiconductor material has sublimation, the vacuum deposition, etc. can be used for formation. Otherwise, if the p-type semiconductor material is soluble in solvent, the layer can be formed by wet coating such as spin coating and ink jetting.

Then active layer 9 (i.e., electron donor layer 5 and electron acceptor layer 6) is formed on p-type semiconductor layer 4 in the coating method below.

Specifically, electron donor layer 5 is first formed (the electron donor layer forming step). In this formation, the latent pigment such as a soluble precursor according to the present invention is dissolved in solvent to prepare the coating solution (a latent pigment solution; if the latent pigment is the soluble precursor, sometimes called a "precursor solution"). The latent pigment used here needs to correspond to the pigment to be contained in electron donor layer 5. A single latent pigment may be independently used or two or more kinds may be used in any combination at any ratio.

Any solvent can be used for the coating solution as long as electron donor layer 5 can be obtained, but is exemplified by aromatic hydrocarbons such as toluene, benzene, xylene, or chlorobenzene; lower alcohols such as methanol, ethanol, propanol, or butanol; ketones such as acetone, methyl ethyl ketone, cyclopentanone, or cyclohexanone; esters such as ethyl acetate, butyl acetate, or methyl lactate; nitrogen-containing organic solvents such as pyridine, or quinoline; halide hydrocarbons such as chloroform, methylene chloride, dichloroethane, trichloroethane, or trichloroethylene; ethers such as ethyl ether, tetra hydrofuran, or dioxane; amides such as dimethylformamide, or dimethyl acetamide. A single solvent may be independently used or two or more kinds may be used in any combination at any ratio.

Any value can be taken for the content ratio of the latent pigment in the coating solution unless significantly impairing effects of the present invention. But the concentration is usually 0.1 g/L or more, preferably 0.5 g/L or more, more preferably 1 g/L or more, and is usually 1000 g/L or less, preferably 500 g/L or less, more preferably 200 g/L or less.

After that, the prepared coating solution is applied to p-type semiconductor layer 4 to form the coating (the coating layer, the latent pigment layer, the precursor layer). The coating manner is not limited and can use spin coating, dip coating, spray coating, and ink jetting, for example.

After the formation of the coating layer, the latent pigment in the coating layer is converted to pigment (the converting step). For example, if the latent pigment is the soluble precursor according to the present invention that is converted to pigment by heat, the coating layer is subjected to heat process, which converts the latent pigment into the pigment according to the present invention. Consequently, the coating layer is converted into electron donor layer 5. The temperature, pressure, time and atmospheric conditions for the conversion are the same as those described in [2-2. soluble precursor of the benzoporphyrin compound]. In addition, before the conversion with, for example, heat, the solvent may be dried or be removed from the coating layer, resulting in the coating layer becoming a fine amorphous or mostly amorphous layer.

If an extra electron donor other than the pigment according to the present invention is used together, it is sufficient that the extra electron donor is dissolved or dispersed in the above solution.

It is possible to control crystallization and the shape of the thin layer by converting a latent pigment to a pigment having a molecular structure high in planarity as in the above method. That can improve the mobility of positive holes in electron donor layer 5 and maximize the contact between electron donor layer 5 and electron acceptor layer 6. As a consequence, it seems that resultant organic photoelectric conversion device 1 has improved photoelectric conversion characteristics compared to a conventional device.

After the formation of electron donor layer 5, electron acceptor layer 6 is formed (the electron acceptor layer forming step) also by coating. It is preferable that the electron acceptor layer 6 is usually formed by wet coating in which an electron acceptor is included on electron donor layer 5.

The wet coating can be adopted if the electron acceptor is soluble. If this method is to be used, an electron acceptor layer 6 is formed of a liquid in the following manner. First, electron acceptor solution containing the electron acceptor is prepared. Any solvent can be used for the electron acceptor solution as long as electron acceptor layer 6 can be formed. The solvent is the same as the solvent for the above coating solution. A single solvent may be independently used or two or more kinds of solvents may be used in any combination at any ratio.

Any value can be taken for the content ratio of the electron acceptor in the electron acceptor solution unless significantly impairing effects of the present invention. But the concentration is usually 0.1 g/L or more, preferably 1 g/L or more, more preferably 5 g/L or more, and is usually 1000 g/L or less, preferably 500 g/L or less, more preferably 200 g/L or less.

The prepared electron acceptor solution is then applied to the electron donor layer 5 made of a pigment that has been converted from a latent pigment and thereby a coating layer is formed. Then removing or drying of the solvent from the coating layer completes the formation of electron acceptor layer 6.

Since the thin layer made of pigment which has been crystallized by the conversion is formed by crystallites extremely small in size, there is a possibility that electron acceptors are immersed between the crystallites of electron donor layer 5 as a result of formation of electron acceptor layer 6 in the above coating method. Accordingly, the contact area between the electron donor and the electron acceptor increases, accompanying increase in conversion efficiency and in photoelectric current. That makes it possible to obtain excellent photoelectric conversion characteristics.

n-type semiconductor layer 7 is formed (the n-type semiconductor layer forming step) after the formation of electron acceptor layer 6. The method of the formation of n-type semiconductor layer 7 is not limited to, but can be, for example, vacuum deposition or coating similar to the formation of p-type semiconductor layer 4.

After that, negative electrode 8 is formed on n-type semiconductor layer 7 (the negative electrode forming step). The method to form negative electrode 8 is not limited, but can be sputtering or vacuumed deposition similarly to the method for production of positive electrode 3. Execution of a series of the above steps produces organic photoelectric conversion device 1 of the first embodiment.

[The Major Advantages of the Organic Photoelectric Conversion Device of the First Embodiment]

Because of the structure described above, organic photoelectric conversion device 1 of the first embodiment captures light therein, generates positive holes and electrons in active layer 9, and releases the positive holes and the electrons to positive electrode 3 and negative electrode 8. In this aspect, organic photoelectric conversion device 1 of the present embodiment is superior in photoelectric conversion characteristics to conventional organic photoelectric conversion devices because the device of the present embodiment has a broader contact area between the electron donor and the electron acceptor to improve the mobility thereof.

The organic photoelectric conversion device 1 of the first embodiment may have photoelectric conversion characteristics in any value. However, the photoelectric conversion characteristic preferably satisfies at least one of the below indicators, more preferably satisfies all the below indicators.

Specifically, organic photoelectric conversion device 1 of the first embodiment has an open-circuit voltage (Voc) of usually 0.3 V or higher, preferably 0.4 V or higher, more preferably 0.5 V or higher with no upper limit.

Organic photoelectric conversion device 1 of the first embodiment has a short-circuit current (Jsc) of usually 1 mA/cm$^2$ or higher, preferably 3 mA/cm$^2$ or higher, more preferably 5 mA/cm$^2$ or higher with no upper limit.

Organic photoelectric conversion device 1 of the first embodiment has an energy conversion efficiency of (ηp) of usually 0.5% or more, preferably 1.0% or more, more preferably 1.5% or more with no upper limit.

Organic photoelectric conversion device 1 of the first embodiment has a form factor (FF) of usually 0.3 or more, preferably 0.4 or more, more preferably 0.5 or more with no upper limit.

The above open-circuit voltage (Voc), short-circuit current (Jsc), energy conversion efficiency (ηp) and form factor (FF) were measured by measurement of the voltage-current characteristics obtained as irradiating organic photoelectric conversion device 1 with light from a solar simulator (AM1.5G) at the irradiation intensity of 100 mW/cm$^2$.

[Others]

Organic photoelectric conversion device 1 of the first embodiment may have a modified version of the structure described above.

For example, substrate 2 may be formed on negative electrode 8, or may be formed on both positive electrode 3 and negative electrode 8. In any case, positive electrode 3 and negative electrode 8 are formed directly on substrate 2 or indirectly on substrate 2 via one or more layers.

Further, p-type and n-type semiconductor layers 4 and 7 are dispensable. With this structure, positive electrode 3 and negative electrode 8 receive positive holes and electrons generated from active layer 9 without passing through p-type and n-type semiconductor layers 4 and 7.

Further, the first embodiment assumes that light is captured from positive electrode 3, but organic photoelectric conversion device 1 may capture light from negative electrode 8. In this case, n-type semiconductor layer 7 and negative electrode 8 are configured to be transparent because at least one of positive electrode 3 and negative electrode 8, and at least one of p-type semiconductor layer 4 and n-type semiconductor layer 7 should be transparent.

Each of the layers constituting organic photoelectric conversion device 1 may contain one or more other components than that described above unless significantly impairing the effects of the present invention.

Still further, organic photoelectric conversion device 1 may include another layer or element in addition to substrate 2, positive electrode 3, p-type semiconductor layer 4, electron donor layer 5, electron acceptor layer 6, n-type semiconductor layer 7 and negative electrode 8 described above unless the effects of the present invention are significantly impaired. For example, a protection layer (not shown) may be formed to cover negative electrode 8.

Such a protection layer is exemplified a polymer film made from styrene resin, epoxy resin, acrylic resin, polyurethane, polyimido, polyvinyl alcohol, polyvinylidene difluoride, or polyethylenepolyvinyl alcohol copolymer; an inorganic oxide film or a nitride film made of silicon oxide, silicon nitride, or aluminum oxide; and is an accumulation of these films. A single material for the protection layer may be independently used or two or more materials may be used in any combination at any ratio.

The protection layer can be formed by any method, which is exemplified by, if the protection layer is a polymer film, coating and drying a polymer solution, or coating with or evaporating monomer and then polymerizing the monomer. In formation of a polymer film, cross-links and a multiplayer structure can be further formed. On the other hand, if the protection layer is an inorganic film such as an inorganic oxide film or a nitride film, the protection layer can be formed by, a vacuum process such as sputtering and evaporation, and a solution process represented by sol gel method, for example.

If the organic photoelectric conversion device serves as a solar cell, it is preferable that the device is equipped with an optical filter that is not pervious to ultra violet light. This is because since ultra violet light generally tends to increase deterioration of solar cells, interception of ultra violet light can extend the life of solar cells.

For example, in the method for producing organic photoelectric conversion device 1, the step of converting the latent pigment can be performed at any timing after coating the latent image. Accordingly, the heat process may be performed to cause a heat conversion of a latent pigment in any timing after forming the layer made of a latent pigment. Specifically, a layer made from a latent pigment may be formed on p-type semiconductor layer 4 without subsequent heat conversion; and then electron acceptor layer 6, n-type semiconductor layer 7, and negative electrode 8 may be formed in sequence on the latent pigment layer; and heat treatment may be finally carried out.

[4-3. Second Embodiment]

Figure 2:
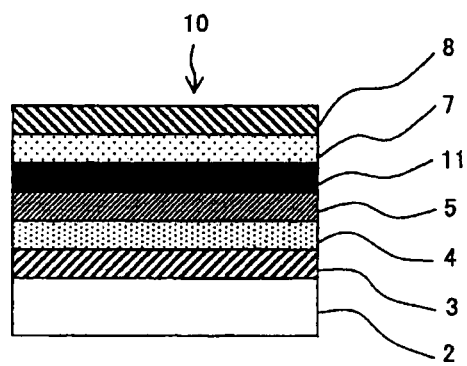
FIG. 2 is a schematic sectional view of an organic photoelectric conversion device according to a second embodiment of the present invention.

FIG. 2 is a schematic sectional view of an organic photoelectric conversion device according to a second embodiment of the present invention. As shown in FIG. 2, organic photoelectric conversion device 10 of the second embodiment includes substrate 2, positive electrode 3, p-type semiconductor layer 4, electron donor layer 5, partial active layer 11, n-type semiconductor layer 7, and negative electrode 8. In other words, organic photoelectric conversion device 10 is identical in structure to organic photoelectric conversion device 1 of the first embodiment except that electron acceptor layer 6 is replaced by partial active layer 11. Namely, the active layer of the present embodiment is formed of an electron donor layer and partial active layer. For this reason, it is preferable that the second embodiment also uses a benzoporphyrin compound according to the present invention as the pigment similar to the first embodiment. Further, as a latent pigment corresponding to the pigment, the soluble precursor according to the present invention is preferably used.

[The Substrate, the Positive Electrode, and the P-type Semiconductor Layer]

Substrate 2, positive electrode layer 3, and p-type semiconductor layer 4 are the same as those of the first embodiment.

[The Electron Donor Layer]

Electron donor layer 5 is identical in structure to that of the first embodiment, but electron donor layer 5 of the second embodiment is formed separately by partial active layer 11.

Electron donor layer 5 separately formed from partial active layer 11 uses a pigment according to the present invention as an electron donor similar to the first embodiment to thereby serve as a pigment layer including a pigment according to the present. That makes electron donor layer 5 function as a pigment layer containing the pigment according to the present invention. In other words, organic photoelectric conversion device 10 comprises partial active layer 11, and a pigment layer formed between the partial active layer 11 and positive electrode 3 (if p-type semiconductor layer 4 is included, p-type semiconductor layer 4). In this case, a preferable pigment is a benzoporphyrin compound according to the present invention.

[The Partial Active Layer]

Partial active layer 11 of the present embodiment can function as an active layer by itself, and is exemplified by mixture active layer containing an electron donor and an electron acceptor in the same layer. Accordingly, partial active layer 11 functions not only as an electron donor layer but also as the electron acceptor layer.

The electron acceptor included in partial active layer 11 is identical to that included in electron acceptor layer 6 of the first embodiment.

The electron donor included in partial active layer 11 is not limited, so any electron donor can be used. A single electron donor may be independently used or two or more kinds may be used in any combination at any ratio. Therefore, it is possible to use a pigment according to the present invention as the electron donor for partial active layer 11 similar to the first embodiment.

It is however preferable that the electron donor is other than the pigment according to the present invention in the second embodiment. Partial active layer 11 of this embodiment is a mixture layer of an electron donor and an electron acceptor. With the presence of electron donor layer 5, the electron acceptor included in partial active layer 11 makes an efficient partial contact with the pigment in electron donor layer 5 in addition to the contact with the electron donor in partial active layer 11. For this reason, if the electron donor used in electron donor layer 5 is different from that used in partial active layer 11, the electron acceptor contacts with two kinds of electron donors that are different in absorption wavelength region to increase the photoelectric current. As a result, the photoelectric conversion characteristics can be improved.

If partial active layer 11 does not include the pigment according to the present invention, the electron donor layer 5 does include the pigment, so that organic photoelectric conversion device 11 of the present embodiment includes the pigment according to the present invention in at least one layer.

With the above facts in view, the second embodiment will be described assuming that partial active layer 11 includes an electron donor (such as polythiophene) other than pigment.

The mixing ratio of the electron donor and the electron acceptor in partial active layer 11 can take any value unless the effects of the present invention are significantly impaired. However, the ratio of the electron donor to the total weight of the electron donor and the electron acceptor is usually 5% or more, preferably 10% or more, more preferably 15% or more, and usually 95% or less, preferably 90% or less, more preferably 85% or less. An excessively high or low ratio of electron donor may lower the photoelectric conversion characteristics.

The thickness of partial active layer 11 is not limited, but is usually 5 nm or more, preferably 10 nm or more, and usually 1000 nm or less, preferably 500 nm or less. There is a possibility that an excessively thick partial active layer 11 will increase the series resistance and an excessively thin partial active layer 11 will absorb the light inadequately.

[The N-type Semiconductor Layer and the Negative Electrode]

In organic photoelectric conversion device 10, n-type semiconductor layer 7 and negative electrode 8, which are the same as those in the first embodiment, are formed on partial active layer 11.

[The Production Method]

Organic photoelectric conversion device 10 of the present embodiment can be produced through the conversion of the soluble precursor according to the present invention to a pigment in the step of forming a pigment layer. Here, description is made on the assumption that electron donor layer 5 is a pigment layer.

Organic photoelectric conversion device 10 of the present embodiment can be produced by conversion of latent pigment such as the soluble precursor to the benzoporphyrin compound according to the present invention in the step of forming electron donor layer 5 serving as the pigment layer. The following is an example of the specific production method, for example.

Substrate 2 is prepared first, on which positive electrode 3 and p-type semiconductor layer 4 are then formed similarly to the first embodiment.

Next, electron donor layer 5 serving as the pigment layer is formed on p-type semiconductor layer 4. Also in this embodiment, in the same manner as that of the first embodiment, the latent pigment such as the soluble precursor according to the present invention is dissolved in solvent to prepare a coating solution, which is then applied to p-type semiconductor layer 4. Then heat treatment is performed on the obtained coating layer to convert the latent pigment such as a soluble precursor to pigment. Electron donor layer 5 is thereby formed.

Then, partial active layer 11 is formed on electron donor layer 5 in any method, which is however exemplified by wet coating of electron donor layer 5 with an electron donor and an electron acceptor. Specifically, partial active layer 11 can be formed in the same manner as the electron acceptor layer of the first embodiment except that partial active layer 11 is to include an electron donor in addition to an electron acceptor. Such a method makes it possible for the interface between partial active layer 11 and electron donor layer 5 to have the same advantages as the step of forming the electron acceptor layer. In other words, a wet coating method results in a large contact area between an electron donor and an electron acceptor to increase the conversion efficiency and the photoelectric current. It is therefore possible to obtain a fine photoelectric conversion characteristic.

After that, n-type semiconductor layer 7 and negative electrode 8 are formed in the same manner as the first embodiment. Through the above steps, organic photoelectric conversion device 10 of the second embodiment can be produced.

[Major Advantages of the Organic Photoelectric Conversion Device of the Second Embodiment]

Because of the structure described above, organic photoelectric conversion device 10 of the present embodiment captures light therein, generates positive holes and electrons in partial active layer 11, and releases the positive holes and the electrons to positive electrode 3 and negative electrode 8. In this aspect, organic photoelectric conversion device 12 of the present embodiment has excellent photoelectric conversion characteristics because the electron acceptor efficiently contacts with the pigment not only in partial active layer 11 but also on the interface between partial active layer 11 and electron donor layer 5 to increase the photoelectric current.

The organic photoelectric conversion device 10 of the present embodiment may have photoelectric conversion characteristics of any value, but is similar to organic photoelectric conversion device 1 of the first embodiment to have the maximum values of the open-circuit voltage (Voc), the short-circuit current (Jsc), the energy conversion efficiency ($\eta p$) form factor (FF), and external quantum efficiency.

[Others]

Organic photoelectric conversion device 10 of the present embodiment may have a modified structure to the above-described structure. For example, the same modification as the first embodiment may be made.

For example, the pigment according to the present invention can be used as the electron donor of partial active layer 11. However in this case, the pigment for partial active layer 11 is preferably different from that for electron donor layer 5 to increase photoelectric current and improve the photoelectric conversion characteristics. The formation method of partial active layer 11 can be the same as the formation method of the electron donor layer of the first embodiment except for coexistence of an electron acceptor in the precursor solution.

Further, similarly to a third embodiment to be detailed below, electron acceptor layer 6 may be formed between partial active layer 11 and n-type semiconductor layer 7.

[4-4 Third Embodiment]

Figure 3:
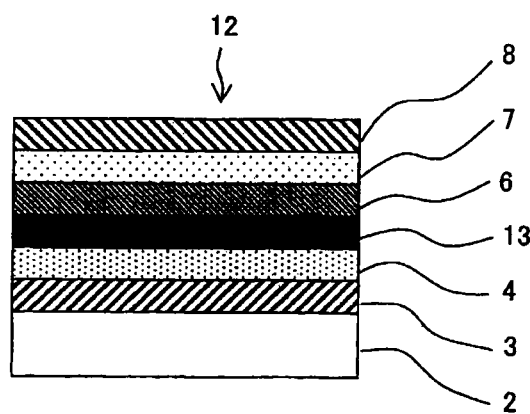
FIG. 3 is a schematic sectional view of an organic photoelectric conversion device according to a third embodiment of the present invention.

FIG. 3 is a schematic sectional view of an organic photoelectric conversion device according to a third embodiment of the present invention. As shown in FIG. 3, organic photoelectric conversion device 12 of the third embodiment includes substrate 2, positive electrode 3, p-type semiconductor layer 4, partial active layer 13, electron acceptor layer 6, n-type semiconductor layer 7, and negative electrode 8. In other words, organic photoelectric conversion device 12 is identical in structure to organic photoelectric conversion device 1 of the first embodiment except that electron donor layer 5 is replaced by partial active layer 13. Namely, the active layer of the present invention is formed of partial active layer 13 and electron acceptor layer 6.

[The Substrate, the Positive Electrode, and the P-type Semiconductor Layer]

Substrate 2, positive electrode layer 3, and p-type semiconductor layer 4 are the same as those of the first embodiment.

[The Partial Active Layer]

Partial active layer 13 of the present embodiment is identical to partial active layer 11 described in the second embodiment. A single pigment may be independently used or two or more kinds may be used in any combination at any ratio. In this case, partial active layer 13 functions not only as an electron donor layer but also as the electron acceptor layer.

If the pigment according to the present invention is used as the electron donor of partial active layer 13, it is advantageously possible to obtain a high photoelectric conversion efficiency.

[The Electron Acceptor Layer]

Electron acceptor layer 6 is identical in structure to that of the first embodiment, but electron acceptor layer 6 of the third embodiment is formed in a layer separated from partial active layer 13.

Electron acceptor layer 6 separately formed from partial active layer 13 can be formed in the same manner as in the first embodiment. However, it is preferable that the electron acceptor included in electron acceptor layer 6 is different from the electron acceptor included in partial active layer 13. In this embodiment, partial active layer 13 is a mixed layer of an electron donor and an electron acceptor. With electron acceptor layer 6 formed between partial active layer 13 and n-type semiconductor layer 7, the electron donor included in partial active layer 13 makes an efficient partial contact not only with the electron acceptor constituting partial active layer 13 but also with the electron acceptor in electron acceptor layer 6. For this reason, if the electron acceptor included in electron acceptor layer 6 is different from that used in partial active layer 13, the electron donor contacts with two kinds of electron acceptors that are different in absorption wavelength region to increase the photoelectric current. As a result, the photoelectric conversion characteristics can be improved.

With the above facts in view, the present embodiment will be described assuming that electron acceptor layer 6 contains an electron acceptor different from that of partial active layer 13.

[The N-type Semiconductor Layer and the Negative Electrode]

In organic photoelectric conversion device 12, n-type semiconductor layer 7 and negative electrode 8, which are the same as those in the first embodiment, are formed on electron acceptor layer 6.

[The Production Method]

Organic photoelectric conversion device 12 of the present embodiment can be produced through the step of converting the latent pigment such as the soluble precursor according to the present invention to pigment. Here, description is made on the assumption that the electron donor layer in partial active layer 13 uses a pigment. Alternatively, electron acceptor layer 6 may use pigment while partial active layer 13 may not use pigment.

In the production of organic photoelectric conversion device 12 of the present embodiment, the latent pigment such as a soluble precursor according to the present invention is converted into the pigment such as a benzoporphyrin compound according to the present invention in the step of forming partial active layer 13 as an electron donor layer. An example of a detailed production method is described below.

Substrate 2 is prepared first, on which positive electrode 3 and p-type semiconductor layer 4 are then formed similarly to the first embodiment.

Next, partial active layer 13 is formed on p-type semiconductor layer 4. Partial active layer 13 can be formed in the same manner as the formation of the electron donor layer of the first embodiment except for coexistence of the electron acceptor in the precursor solution.

After that, electron acceptor layer 6, n-type semiconductor layer 7 and negative electrode 8 are formed in the same manner as in the first embodiment.

Through the above steps, organic photoelectric conversion device 10 of the present embodiment can be produced.

[Major Advantages of the Organic Photoelectric Conversion Device of the Third Embodiment]

Because of the structure described above, organic photoelectric conversion device 12 of the third embodiment captures light therein, generates positive holes and electrons in partial active layer 13, and releases the positive holes and the electrons to positive electrode 3 and negative electrode 8. In this aspect, organic photoelectric conversion device 12 of the present embodiment has excellent photoelectric conversion characteristics because the electron acceptor efficiently contacts with the pigment not only in partial active layer 13 but also on the interface between partial active layer 13 and electron acceptor layer 6 to increase the photoelectric current.

The organic photoelectric conversion device 12 of the present embodiment may have photoelectric conversion characteristics in any value, but is similar to organic photoelectric conversion device 1 of the first embodiment to have the maximum values of the open-circuit voltage (Voc), the short-circuit current (Jsc), the energy conversion efficiency ($\eta p$) form factor (FF), and external quantum efficiency.

[Others]

Organic photoelectric conversion device 12 of the present embodiment may have a modified structure to the above-described structure. For example, the same modification as the first embodiment may be made.

Further, an electron donor layer (not shown) may be formed between 13 and p-type semiconductor layer 4, for example. The electron donor layer may or may not contain the pigment according to the present invention. If the electron donor does not contain a pigment serving as an electron donor or contains a pigment other than that used in partial active layer 13, it is preferable because photoelectric current increases.

[4-5. Fourth Embodiment]

The fourth embodiment of the present invention refers to an organic photoelectric conversion device produced through a step of conversion of two or more kinds of latent pigments into pigment. The organic photoelectric conversion device of the fourth embodiment is identical in structure to the above first to third embodiments except that the pigments in active layers 9, 11, and 13 are each obtained as a result of conversion of two or more kinds of latent pigments.

[The Organic Photoelectric Conversion Device]

The organic photoelectric conversion device of the present embodiment is the same in structure as the above first to third embodiments except for the active layer. Accordingly, the following is a description of the active layer, omitting explanation for other parts.

[The Active Layer]

The active layer is formed between the pair of electrodes and usually contains two or more kinds of semiconductors, i.e., an electron donor (a semiconductor of a p type) and an electron acceptor (a semiconductor of an n type). The active layer may take the form of a single layer or two or more layers. The active layer may contain a component other than the active component unless the effects of the present invention are significantly impaired. In the present invention, it is preferable that the semiconductors in the active layer are made from latent pigments. In particular, the semiconductors of both p and n types are preferably derived from latent pigments individually.

If a single layer contains two or more semiconductors, the ratio of the two or more semiconductors to be used is not limited unless the effects of the present invention are significantly impaired. For example, if two kinds of semiconductors are to be used, the semiconductors to be used have volume ratio expressed by (one kind of semiconductor)/(the other kind of semiconductor) of usually 1/99 or more, preferably 5/95 or more, more preferably 10/90 or more, and usually 99/1 or less, preferably 95/5 or less, more preferably 90/10 or less. In particular, if the two kinds of semiconductors are a p type and an n type, it is preferable that the volumes of the semiconductors are not largely different from each other because the phases thereof continue. For this reason, the volume ratio is further preferably 30/70 or more, still further preferably 40/60 or more, and further preferably 70/30 or less, still further preferably 60/40 or less.

The specific structure of the active layer varies with the type of an organic photoelectric conversion device. The structure of the active layer is exemplified by a bulkhetero junction type, a multilayer type (the hetero pn junction type), a Schottky type and a hybrid type.

A bulkhetero junction type represents a single layer containing semiconductors of a p type and an n-type, which are separated in phase from each other. Dissociation of carrier occurs on the interface of the separated phases, and either a positive electric charge (positive holes) or negative electric charge (electrons) is transported to an electrode in each phase.

In an active layer of a bulkhetero junction type, the separated phase structure thereof affects the light absorption process, the exciton diffusion process, the exciton dissociation process (carrier dissociation) process, and the carrier transporting process and other processes. For this reason, it seems that optimization of the separated phase structure can realize a preferable light-emitting efficiency.

An active layer in the form of a multilayer (i.e., the hereto pn junction type) takes the form of two or more layers at least one of which is formed of a pigment of a p type while the remaining of which are formed of a semiconductor of an n type. On the interface between layers of the p-type semiconductor and the n-type semiconductor, there is provided a phase interface between the p-type semiconductor and the n-type semiconductor where carrier dissociation occurs.

In addition, it is possible to use a semiconductor in a combined form of a bulkhetero junction type and a multilayer type. For example, an active layer is formed of two or more layers at least one of which contains a semiconductor of a p type and a semiconductor of an n type, and the p-type and n-type semiconductor are configured to be separated in phase from each other. In this structure, carrier dissociation occurs at both the phase interface between the laminated layers and the phase interface of the phase in a layer containing both the p-type and n-type semiconductors. In addition, it can be expected that the electric acquisition efficiency would be improved by blocking one of the carriers among the laminated layers.

An active layer of the Schottky type forms a Schottky barrier in the proximity of an electrode and the carrier dissociation occurs in the internal electric field of the Schottky barrier. With an electrode forming a Schottky barrier, any active layer can be used as long as the layer contains two or more pigments. Such an active layer of the Schottky type can specifically take the form of the above bulkhetero junction type, the multilayer type and the combination thereof, particularly expecting an improved characteristics (in e.g., conversion efficiency).

An active layer of the hybrid type contains inorganic pigment particles made from, for example, titania, or zinc oxide, together with pigment. With this configuration, the active layer takes a form of a mixed layer of inorganic pigment and organic pigment. Inorganic pigment is superior in durability and can be in the form of various nano-particles. Further, many kinds of inorganic particles have large carrier mobility, so that the active layer of the hybrid type are expected to enhance the efficiency of the organic photoelectric conversion device. The inorganic particles used here are not limited, but are preferably usually nanoscale particles or fibers.

The thickness of an active layer of any type is not limited, but is usually 5 nm or thicker, preferably 10 nm or thicker, and usually 10 μm or thinner, preferably 5 μm or thinner to secure adequate light absorption and avoid inactivation of electric charge generated by the light absorption.

[The Production Method]

The production method of organic photoelectric conversion device of the present embodiment is identical to those of the foregoing first to third embodiments except for the formation of active layers 9, 11, and 13, so description is made in relation to the formation of the active layer, omitting the remaining portion.

[Formation Method of the Active Layer]

In the production of the organic photoelectric conversion device of the present embodiment, the formation of the active layer includes the step (converting step) of converting two or more latent pigments into pigment. In this case, the conversion of the latent pigments to the pigment in the converting step usually follows a step (herein after sometimes called "layer forming step") for forming a layer of the latent pigments.

[The Layer Forming Step]

In the layer forming step, the latent pigments are formed into a layer by coating. The latent pigments, if in a liquid state, can be applied without processing. However, a coating solution is prepared by dissolving the latent pigments in a proper solvent, and the coating object such as a substrate or an electrode is coated with the coating solution to thereby form a layer.

The solvent to dissolve the latent pigments is not limited, and any solvent can be used as long as it is capable of dissolving the latent pigments. The solvent is exemplified by aliphatic hydrocarbons such as hexane, heptane, octane, isooctane, nonane, or decane; aromatic hydrocarbons such as toluene, benzene, xylene, or chlorobenzene; lower alcohols such as methanol, ethanol, propanol, or butanol; ketones such as acetone, methyl ethyl ketone, cyclopentanone, or cyclohexanone; esters such as ethyl acetate, butyl acetate, or methyl lactate; nitrogen-containing organic solvents such as pyridine, or quinoline; halide hydrocarbons, such as chloroform, methylene chloride, dichloroethane, trichloroethane, or trichloroethylene; ethers such as ethyl ether, tetra hydrofuran, or dioxane; and amides such as dimethylformamide, or dimethyl acetamide.

A single solvent may be independently used, or two or more kinds may be used in any combination at any ratio.

It is sufficient that the coating solution contains at least one latent pigment, but the solution can contain two or more kinds of latent pigments. The kinds, the combination, and the ratio of latent pigments are properly selected according to the type of the organic photoelectric conversion device and to the kind and the ratio of a pigment that is to be contained in the active layer of the organic photoelectric conversion device.

For example, if an organic photoelectric conversion device is formed into a bulkhetero junction type, the active layer of the present embodiment preferably contains at least one pigment of a p type and at least one pigment of an n type in the same single layer, and the coating solution preferably contains at least one latent pigment serving as a precursor of the pigment of a p type and at least one latent pigment serving as a precursor of the pigment of an n type, that is, two or more kind of latent pigments in total. Conversely, if the organic photoelectric conversion device is formed into a multilayer type, since it is sufficient that each of the layers serving as the active layer contains at least one kind of a pigment, it is satisfactory that the coating solution for each layer contains at least one latent pigment. Even if a coating solution contains only one kind of a latent pigment as the multilayer type, the production of the organic photoelectric conversion device of the present embodiment accordingly converts two or more kinds of latent pigments to pigment because the other layer includes another latent pigment.

Further, the coating solution may contain other components than the latent pigments and the solvent unless the effects of the present invention are significantly impaired. For example, the coating solution may contain a dopant that controls the electric property such as conductivity, inorganic pigment particles for an organic photoelectric conversion device of a hybrid type, other organic pigment particles, an organic semiconductor polymer, or an organic semiconductor molecule low in molecular weight. One of these components may be independently user, or two or more of these components may be used in any combination at any ratio.

The concentration of the coating solution is not limited as long as a desired latent pigment layer can be formed. Therefore, the latent pigments and extra component can be contained in the coating solution in any concentrations. However, it is preferable that selection for a solvent and setting of the concentrations are made so that the coating solution has a viscosity in a suitable range for coating to ensure fine coating properties.

The method of coating with the coating solution is also not limited, and is exemplified by spin coating, casting with a solution, dip coating, blade coating, wire-bar coating, gravure coating, and spray coating. Alternatively, the coating may be carried out by a printing method exemplified by ink jetting, screen printing, relief printing, intaglio printing, offset printing, and flexography.

After the formation of a layer made from latent pigments by coating, the solvent may be removed from the layer if required. The manner of removal of the solvent is not limited and can be any manner such as heat drying or decomposition drying. In addition, the layers of the latent pigments are heated in most cases in the converting step to be detailed below, in which the solvent tends to be dried and removed as heated. Accordingly, the removal of the solvent may be carried out concurrently with the converting step.

[The Converting Step]

After the formation of the latent pigment layer, the latent pigments are converted into pigments by giving an external stimulus to the latent pigment layer. Thereby, a pigment layer is formed to serve as an active layer.

The external stimulus to convert the latent pigment into the pigment is exemplified by heat treatment and irradiation with light. Among them, heat treatment is preferable. The temperature of the heat treatment depends on the materials to be used, and in general, is usually 80° C. or higher, preferably 100° C. or higher, and usually 350° C. or lower, preferably 300° C. or lower. A latent pigment that is converted at a low temperature may lack stability itself and there may be difficulty in treatment thereof. On the other hand, excessively high temperatures during heat treatment require high heat resistance of elements such as the substrate and the electrodes, of the organic photoelectric conversion device, increasing the production costs.

The time for which the external stimulus is applied is not limited, but in regard of the production costs, is preferably short. The time of application of the external stimulus depends on the kind of external stimulus but is preferably in the range of one nanosecond to one second for laser heating, one second to one hour for normal heating, and one hour to several days for thermo formation, for example.

In addition, if the active layer is formed by forming two or more layers, all the layers of latent pigments may be formed and the latent pigments included in the layers may be converted into pigments in a lump. However, it is preferable that the conversion takes place each time a layer of a latent pigment is formed. In other words, layer formation alternates with conversion. Since a pigment obtained through conversion is usually resistant to dissolving in a solvent, such a formation manner can inhibit dissolving a latent pigment layer previously formed in a coating solution used for later formation of the latent pigment layer.

[Examples of the Production Method of Organic Photoelectric Conversion Device of Each Type]

Hereinafter, description will now be made in relation to the production method of an organic photoelectric conversion device of each type.

For example, in production of an organic photoelectric conversion device of a bulkhetero junction type with two or more kinds of latent pigments, a coating solution is prepared which contains two or more kinds of latent pigments in total corresponding to at least one pigment of a p type and at least one pigment of an n type. At this time, the ratio of latent pigments to be contained in the coating solution is sufficiently set according to a ratio of pigments that the resultant active layer obtained as a result of conversion of the latent pigment into the pigment. Since latent pigment usually reduces in weight and in volume when converted into pigment, the ratio is preferably set considering the reduction. Then the prepared coating solution is applied to the substrate and an electrode to form a latent pigment layer (the layer forming step). After that, the two or more kinds of latent pigments are converted into pigment with external stimulus such as heat (the converting step) to form an active layer containing semiconductors of a p type and an n type in the same layer.

In an organic photoelectric conversion device of a bulkhetero junction type, the phase separation structure in the active layer can be variously controlled by the molecular structure of each pigment to be used and by the layer forming step. For example, variation in mixing ratio of latent pigments to be mixed can control the phase separation structure. Further, using a difference in conditions (e.g., difference in heat conversion temperature) for the conversion of the latent pigments, the layer structure can be controlled by controlling conditions for generating pigments, for example, by converting one of the latent pigments first, followed by the conversion of the remaining latent pigments.

Next, in production of an organic photoelectric conversion device of a multilayer type, a coating solution is prepared which contains at least one latent pigment of one of a p type and an n type. Then, the coating solution is applied to form a latent pigment layer (the layer forming step), and the latent pigment in the layer is converted into a pigment (the converting step). In succession, a coating solution is prepared which contains at least one kind of a latent pigment of the other one type of a p type and an n type, and applied to form a latent pigment layer (the layer forming step). The latent pigment in the layer is converted into a pigment (the converting step). As a consequence, two or more kinds of latent pigments are converted into pigments to form an active layer including a layer of the p-type pigment and a layer of the n-type pigment.

As described above, conversion of latent pigment into pigment usually largely lowers the solubility in solvent. That makes it possible to inhibit the pigment layer already formed from being damaged by dissolving in a coating solution applied to the pigment layer.

Alternatively, one of the layers constituting an active layer may contain two or more latent pigments. In this case, the two or more kinds of latent pigments may be a p type, an n-type, or a combination of the two types, but is preferably the combination of the both types. In the formation of such an active layer, a coating solution is prepared so as to contain two or more kinds latent pigments and the layer formation steps and converting steps are repeated. Consequently, an organic photoelectric conversion device of the combination of a multi-layer type and a bulkhetero type can be produced.

In addition, an electrode interface layer (i.e., the above p-type semiconductor layer and n-type semiconductor layer) can be similarly formed with one or more latent pigments.

In production of an organic photoelectric conversion device of a Schottky type, the active layer is sufficiently formed in contact with an electrode that forms a Schottky barrier. Such an active layer may be formed in the same manner as the formation of an active layer of the above bulkhetero type or a multilayer type. That makes it possible to form an active layer which is the combination of a Schottky type with a bulkhetero or multilayer type.

By coating with a coating solution containing two or more kinds of latent pigments all of which correspond to pigments of the same one of a p type and an n type, a layer made of the latent pigments are formed (a layer forming step), and the latent pigment layer is converted into pigments. Consequently, an active layer containing two or more kinds of pigments can be formed with ease, although it has been conventionally difficult to form such a layer.

In addition, in the production of an organic photoelectric conversion device of a hybrid type, the coating solution contains inorganic pigment particles of a p type and/or an n type and latent pigments corresponding to pigments of the opposite type or both types. Then the coating solution is applied to the substrate or an electrode to thereby form a layer of latent pigments (the layer forming step). The latent pigment layer is converted into the pigment (the converting step) to fabricate an active layer containing pigment of one of a p and an n types and pigment of the other of a p and an n types. Also in this case, this active layer may be produced in the same manner as the above production method of an active layer of a bulkhetero junction type or a multilayer type except that the coating solution contains inorganic pigment particles. That makes it possible to produce an active layer of the combination of a hybrid type with a bulkhetero junction type or a multilayer type. Further, the coating solution may contain a latent pigment corresponding to a pigment of one of a p type and an n type in the same manner as the inorganic pigment particles, so that the active layer contains a pigment of the same type.

Each of these types can be used in a combination with another type. However, in the production of the organic photoelectric conversion device of any type in the present embodiment, two or more kinds of the pigments contained in the active layer are obtained by conversion of latent pigments.

Above all, an active layer, such as the above bulkhetero junction type, that has a phase separation structure of pigments of a p type and an n type has a large phase interface and consequently seems to improve the electricity generation efficiency. For this reason, a preferable production method forms an active layer containing two or more pigments and is exemplified by mixing two or more latent pigments to be contained in the coating solution, applying the coating solution to form into a layer and then carrying out the converting step.

As described above, producing an organic photoelectric conversion device through the converting step to convert two or more kinds of latent pigments into pigments, the resultant organic photoelectric conversion device having a long lifetime can be produced by coating. In other words, even if the pigments do not possess preferable layer formation characteristics, forming a layer of latent pigments that are precursors of the pigments effectively makes use of the excellent layer formation characteristics to produce the organic photoelectric conversion device at low costs. In particular, in the production method of an organic photoelectric conversion device of the present embodiment, using two or more kinds of latent pigments, a layer formed of pigments of both p type and n type can be fabricated by a method of coating, which can be expected to greatly reduce the production costs of the organic photoelectric conversion device compared to conventional techniques.

Since a pigment obtained by conversion of a latent pigment usually has a long lifetime in most cases, the resultant organic photoelectric conversion device is advantageously long in lifetime.

The production method of the organic photoelectric conversion device of the present embodiment can realize a micro phase separated structure of both p and n types which structure employs a mechanism of an organic photoelectric conversion device of a bulkhetero junction type, so that the efficiency of the organic photoelectric conversion device can be enhanced.

[4-6. Fifth Embodiment]

The fifth embodiment of the present invention relates to an organic photoelectric conversion device produced through a layer forming step in which a mixture of a latent pigment and a material (i.e., a solid semiconductor material) whose solid shows semiconductor characteristics is applied to form into a layer by coating. This production method is identical to those of the foregoing first through third embodiments except that an active layer is obtained by a layer forming step in which the latent pigment and the solid semiconductor material are mixed and shaped into a layer by coating.

[The Organic Photoelectric Conversion Device]

The organic photoelectric conversion device of present embodiment has the same structure except for the active layer as those of the first through the third embodiments, so any repetitious description is omitted here. Accordingly, description is herein after made in relation to the active layer.

[The Active Layer]

The active layer is formed between a pair of electrodes, contains a semiconductor material, and releases an electron charge in response to the absorption of light. The active layer may take the form of a single layer or of two or more deposited layers. However, if the active layer is in the form of a single layer, the layer serves as a semiconductor mixture layer containing a pigment and a solid semiconductor material. Conversely, if the active layer is in the form of two or more layers, an active layer (sic) includes at least one semiconductor mixture layer containing a pigment and a solid semiconductor material. The semiconductor mixture layer may contain another component unless the effects of the present invention are significantly impaired. As for each of the pigment and the solid semiconductor material, a single substance may be independently used or two or more different substances may be used in any combination at any ratio.

The semiconductor mixture layer preferably has a phase separation structure because, after irradiation with light that causes carrier dissociation and thereby generates positive holes and electrons, this structure can be expected to enhance the possibility that the generated positive holes and electrons, without recombining, reach the electrodes.

In a phase separation structure, the materials (e.g., a pigment, the solid semiconductor material and others) that form the phases are not uniformly mixed at molecular level, and the materials each take the shape of aggregation between which interfaces are formed. The phase separation structure can be confirmed by observation of a local structure thereof with an optical microscope, an electron microscope, or an atomic force microscope (AFM), or by observation of diffraction caused by the aggregations by means of X-ray diffraction.

In addition, the solid semiconductor material is in the solid state in the semiconductor mixture layer. Accordingly, the solid semiconductor material exhibits semiconductor characteristics in the active layer.

The ratio of the pigment and the solid semiconductor material in the semiconductor mixture layer is not limited and is arbitrarily determined according to the type and application of the organic photoelectric conversion device. The volume ratio (weight/density) expressed by (solid semiconductor material)/(pigment) is usually 1/99 or more, preferably 5/95 or more, more preferably 10/90 or more and usually 99/1 or less, preferably 95/5 or less, more preferably 90/10 or less. In particular, it is preferable that a pigment derived from a latent pigment and a solid semiconductor material are phase separated from each other to form continuous phases able to transport electric charge. For this purpose, the preferable phases thereof are not extremely different in volume, and therefore the above volume ratio is further preferably 30/70 or more, still further preferably 40/60 or more and further preferably 70/30 or less, still further preferably 60/40 or less. If either the pigments or the solid semiconductor material is excessively small in volume, the minor component is inclined to be a phase isolated in the island shape.

An active layer, if consisting of two or more layers, may include a layer other than the semiconductor mixture layer. The extra layer included in the active layer is not particularly limited as long as the layer contains a semiconductor material without significantly impairing the effects of the present invention. Such an extra layer is exemplified by a layer formed only of a pigment exhibiting semiconductor characteristics, a layer formed only of a solid semiconductor material, and a layer formed of one of a pigment exhibiting semiconductor characteristics and a solid semiconductor material, and another component.

The specific structure of the active layer varies with the type of organic photoelectric conversion device. The structure of the active layer is exemplified by a bulkhetero junction type, a multilayer type (the hetero pn conjunction type) a Schottky type and a hybrid type.

An active layer of a bulkhetero junction type takes a form of a single layer containing semiconductor materials of a p type and an n-type in a single layer, which are separated in phase from each other. Dissociation of carrier occurs on the interface of the separated phases, and positive electric charge (positive holes) and negative electric charge (electrons) are dissociated from each other and transported in each of the phases.

The active layer of a bulkhetero junction type includes a semiconductor mixture layer having an phase separation structure. At least one of the p-type semiconductor material and the n-type semiconductor material is the solid semiconductor material in the organic photoelectric conversion device of the present embodiment. Further, the other one of the p-type semiconductor material and the n-type semiconductor material may also be solid semiconductor material, but is preferably a pigment with semiconductor characteristics derived from a latent pigment.

In an active layer of a bulkhetero junction type, the phase separation structure thereof affects the light absorption process, the exciton dispersion process, the exciton dissociation (carrier dissociation) process, and the carrier transporting process and other processes. For this reason, it seems that optimization of the phase separation structure can realize a preferable light-emitting efficiency.

An active layer of a multilayer type (i.e., with a p-n junction type) consists of two or more layers at least one of which contains a pigment of a p type while the remainder of which contains a semiconductor of an n type. On the interface between layers containing the p-type semiconductor and layers containing the n-type semiconductor, there is provided a phase interface between the p-type semiconductor and the n-type semiconductor where carrier dissociation occurs.

In the organic photoelectric conversion device of the present embodiment, at least one of the p-type and n-type semiconductor materials that are used is a solid semiconductor material. The remaining p- or n-type semiconductor material may also be solid semiconductor material or a pigment with semiconductor characteristics. However, the organic photoelectric conversion device of the present embodiment includes an active layer consisting of two or more layers at least one of which is a semiconductor mixture layer containing a pigment in addition to the solid semiconductor material, and the pigment preferably has semiconductor characteristics.

In addition, it is possible to use in combination of a bulkhetero junction type and a multilayer type. For example, an active layer is formed of two or more layers at least one of which contains a solid semiconductor material and a pigment having major carriers in opposite polarities. That makes the solid semiconductor material of one of a p type and an n type and the pigment of the other one of a p type and an n type separated in phase from each other. In this structure, carrier dissociation occurs at both the phase interface between the laminated layers and the phase interface of the phase containing the solid semiconductor material and the pigment in the semiconductor mixture layer. Otherwise, it can be expected that the electric acquisition efficiency would be improved by blocking one of the carriers among the laminated layers.

An active layer of the Schottky type forms a Schottky barrier in the proximity of an electrode and the carrier dissociation occurs in the internal electric field of the Schottky barrier. With an electrode forming a Schottky barrier, any active layer can be used as long as the layer includes at least one semiconductor mixture layer. Such an active layer of the Schottky type can specifically take the form of the above bulkhetero junction type, the multilayer type and the combination thereof, particularly expecting a high characteristic (in e.g., conversion efficiency).

[The Production Method]

The production method of organic photoelectric conversion device of the present embodiment is identical to those of the foregoing first to third embodiments except for the formation of active layers 9, 11, and 13, so description is made in relation to the formation of the active layer, omitting the remaining portion.

[The Formation Method of the Active Layer]

In the production of the organic photoelectric conversion device of the present embodiment, the formation of the active layer includes the steps of forming a precursor layer by coating with the mixture of a latent pigment and a solid semiconductor material, and then converting the latent pigment to a pigment. It is thereby possible to form a semiconductor mixture layer containing a solid semiconductor material and a pigment. The semiconductor mixture layer is used as the active layer, or is combined with another layer to constitute the active layer together.

[The Layer Forming Step]

In the layer forming step, a precursor layer is formed. The method for layer formation is not particularly limited as long as the mixture of a latent pigment and a solid semiconductor material are formed into a layer by coating. If the latent pigment or the solid semiconductor material is in the liquid state, the mixture can be applied without processing. However, a coating solution is usually prepared by dissolving the latent pigments in a proper solvent and dissolving or dispersing the solid semiconductor material in the same solvent, and the coating object such as a substrate and/or electrode are coated with the coating solution to thereby form a layer.

The solvent for the coating solution is not limited, and any solvent can be used as long as it is capable of dissolving the latent pigments. The solvent is exemplified by aliphatic hydrocarbons such as hexane, heptane, octane, isooctane, nonane, or decane; aromatic hydrocarbons such as toluene, benzene, xylene, or chlorobenzene; lower alcohols such as methanol, ethanol, propanol, or butanol; ketones such as acetone, methyl ethyl ketone, cyclopentanone, or cyclohexanone; esters such as ethyl acetate, butyl acetate, or methyl lactate; nitrogen-containing organic solvents such as pyridine, or quinoline; halide hydrocarbons such as chloroform, methylene chloride, dichloroethane, trichloroethane, or trichloroethylene; ethers such as ethyl ether, tetrahydrofuran, or dioxane; and amides such as dimethylformamide, or dimethyl acetamide.

A single solvent may be independently used, or two or more kinds may be used in any combination at any ratio.

It is sufficient that the coating solution contains at least one latent pigment, but the solution can contain two or more latent pigments. The kinds, the combination, and the ratio of latent pigments are properly selected according to the type of the organic photoelectric conversion device and to the kind and the ratio of a pigment that is to be contained in the active layer of the organic photoelectric conversion device.

A single solid semiconductor material may be contained in the coating solution, or two or more kinds may be contained at any combination at any ratio. The solid semiconductor material can be in any state during the production process as long as the solid semiconductor material is in the solid state to serve as a semiconductor the organic photoelectric conversion device. For example, the solid semiconductor material may be dissolved, or dispersed in the form of particles in the coating solution. If two or more solid semiconductor materials are to be used, the materials may be either soluble or dispersible in the coating solution, or the combinations of both. A preferable solid semiconductor material is however dispersible, in the form of particles, in the coating solution.

In use of a solid semiconductor material in the particles, the preferable particle diameter of the solid semiconductor material in the coating solution is in the same range as the preferable range of the particle diameter of a solid semiconductor material in the active layer described above.

If the solid semiconductor material does not have a particle diameter in the preferable range, the particle diameter comes to be within the preferable range by undergoing a process exemplified by the following as required:

1) pulverizing the solid semiconductor material with a mechanical means such as a ball mill or a sand mill, or by an ultrasonic process so that the solid semiconductor material is shaped into particles;

2) converting a precursor material to particles of solid semiconductor material or synthesizing the particles from the precursor material in a solvent or in a gas phase;

3) forming a solid semiconductor material layer on an oil film by vacuum deposition or sputtering and recovering the solid semiconductor material layer together with the oil film, which obtains particles of the solid semiconductor material; or 4) dissolving a solid semiconductor material in an appropriate solvent, adding the solution to a poor solvent, and precipitating particles of the solid semiconductor material.

Further, the coating solution may contain an extra component other than the latent pigment, the solid semiconductor material, and the solvent as long as the effects of the present invention are significantly impaired. An extra component may be a dispersal agent such as a surface-active agent stably disperses particles in the coating solution, or may be a dopant that controls electrical properties such as the electric conductivity of the active layer. An extra component may be independently used or two or more of the extra components may be used in any combination at any ratio.

The concentration of the coating solution is not particularly limited as long as ensuring formation of a desired semiconductor mixture layer. The concentrations of the latent pigment, the solid semiconductor material, and each extra component in the coating solution may take any values. However, to ensure fine applicability, it is preferable to select the solvent and set the above concentrations such that the resultant coating solution has a viscosity within a suitable range for coating. The ratio between the latent pigment and the solid semiconductor material in the coating solution is preferably set such that the volume ratio expressed by (solid semiconductor material)/(pigment) after the conversion of the latent pigment to the pigment is within the preferable range described above.

Further, in preparation of the coating solution, the latent pigment, the solid semiconductor material, the solvent, and each extra component are not limited in the mixing sequence. For example, the solid semiconductor material may be dissolved or dispersed in the solvent before or after dissolving the latent pigment in the solvent.

If the solid semiconductor material takes the form of particles dispersed in the coating solution, the coating solution has preferably enhanced dispersibility by adequately dispersing the solid semiconductor material in the solution. For this purpose, the dispersibility of the solid semiconductor material in the coating solution may be enhanced by, for example, controlling the concentration and the stirring state of the coating solution, or carrying out an ultrasonic process.

The prepared coating solution is applied to the coating object (usually a substrate or an electrode) in a proper coating method to form a precursor layer. The coating method is not particularly limited, but is exemplified by spin coating, casting with a solution, dip coating, blade coating, wire-bar coating, gravure coating, and spray coating. Alternatively, the coating may be carried out by patterning in a printing method exemplified by ink jetting, screen printing, relief printing, intaglio printing, offset printing, and flexography.

After the formation of the precursor layer by coating, the solvent may be removed from the precursor layer if required. The manner of removal of the solvent is not limited and can be any manner such as heat drying, decomposition drying and the like. In addition, the precursor layer is heated in most cases in the converting step to be detailed below, in which the solvent tends to be dried and removed as heated. Accordingly, the removal of the solvent may be carried out concurrently with the converting step.

Through the above layer forming step, the precursor layer can be formed. At that time, even if the solid semiconductor material is dispersed in the form of particles in the coating solution, the solid semiconductor material is well dispersed also in the precursor layer similarly in a coating layer. In addition, also the latent pigment has high dispersibility because the latent pigment has once been dissolved in solvent. However, if the solid semiconductor material is dissolved in the coating solution, the latent pigment and the solid semiconductor material are each high in dispersibility because of having once been dissolved in solvent.

[The Converting Step]

After formation of the precursor layer in the layer forming step, the latent pigment is converted into a pigment, keeping the dispersal state in the precursor layer, by applying external stimulus to the precursor layer. That can form a semiconductor mixture layer containing the pigment and the solid semiconductor material. At that time, since the latent pigment is converted into the pigment maintaining the dispersed state, the pigment and the solid semiconductor material maintain fine dispersibility in the semiconductor mixture layer as well.

As described above, the external stimulus to convert the latent pigment into the pigment is exemplified by heat treatment and irradiation with light. Among them, heat treatment is preferable. The temperature of the heat treatment depends on the materials to be used, and in general, is usually 80° C. or higher, preferably 100° C. or higher, and usually 350° C. or lower, preferably 300° C. or lower. A latent pigment that is converted at a low temperature may lack stability and may be difficult in the treatment thereof. On the other hand, an excessively high temperature in the heat requires high heat resistance of elements such as the substrate and the electrodes, of the organic photoelectric conversion device, which may increase the production costs.

The time for which the external stimulus is applied is not limited, but is preferably short to keep production costs down. The time of application of the external stimulus depends on the kind of the external stimulus but is preferably in the range of one nanosecond to one second for laser heating, one second to one hour for normal heating, or one hour to several days for thermo formation, for example.

The converting step can be conducted in the air, but in order to suppress influence of oxidization, is preferably performed in an inactivating gas such as nitrogen and argon, or in a vacuum.

In addition, if the converting step accompanies variation in temperature, a temperature rising velocity or a cooling velocity can control the state of crystal of the pigment to be generated.

Through the converting step detailed above, the semiconductor mixture layer can be formed. If the active layer is made of a single layer, the semiconductor mixture layer independently serves as the active layer. On the other hand, if an active layer is made of two or more semiconductor mixture layers, these semiconductor mixture layers can be formed by repeating the coating step and the converting step. In production of an active layer by laminating, it is acceptable that all precursor layers are formed and the latent pigments contained in the precursor layers are then converted into pigments in a lump. However, it is usually preferable that the conversion is performed each time a precursor layer is formed, i.e., layer formation alternates with the conversion. Since a pigment obtained through conversion is usually resistant to dissolving in a solvent, such a formation manner can inhibit dissolving and roughing a latent pigment layer previously formed in a coating solution used for later formation of a latent pigment layer.

In addition, the active layer with two or more deposited layers may include a layer other than the semiconductor mixture layer. Such an extra layer is formed in any method. For example, an electrode interface layer described above can be any method publicly known.

[Examples of the Production Method of Organic Photoelectric Conversion Device of Each Type]

Hereinafter, description will now be made in relation to the production method of an organic photoelectric conversion device of each type.

For example, in production of an organic photoelectric conversion device of a bulkhetero junction type, if a semiconductor mixture layer is formed with a pigment having semiconductor characteristics and a solid semiconductor material, a coating solution is first prepared which contains at least a latent pigment corresponding to a pigment of one of p type or n type, a solid semiconductor material opposite in type from the pigment, and a solvent. At this time, the mixing ratio of the latent pigment and the solid semiconductor material to be contained in the coating solution is sufficiently set such that a ratio of a pigment and the solid semiconductor material in the resultant semiconductor mixture layer that is to be obtained as a result of conversion of the latent pigment to the pigment is within a preferable range.

Since the weight and the volume of a latent pigment usually reduce when being converted into a pigment, the ratio is preferably set considering the reduction. Then the prepared coating solution is applied to the substrate and an electrode to form a latent pigment layer (the layer forming step). After that, the latent pigment is converted into a pigment with external stimulus such as heat (the converting step) to form the semiconductor mixture layer containing pigment of one of a p and an n types and pigment of the other of a p and an n types. The semiconductor mixture layer itself can serve as the active layer.

In an organic photoelectric conversion device of a bulkhetero junction type, the phase separation structure in the active layer can be variously controlled by the molecular structures of the pigment and the solid semiconductor material to be used and the layer forming step. For example, variation in mixing ratio of the latent pigment and the solid semiconductor material to be mixed can control the phase separation structure. The solid semiconductor material can be as described above soluble or dispersible in the form of particulate in the coating solution.

In either case, according to the production method of an organic photoelectric conversion device of the present embodiment, it is possible to form a layer suitable for an organic photoelectric conversion device with bulkhetero junction because the pigment originated from the latent pigment is separated in phase from the solid semiconductor material.

The above description assumes that the pigment used here has semiconductor characteristics, but a pigment with no semiconductor characteristic can be used according to the use of the organic photoelectric conversion device. In such a case, at least one solid semiconductor material of each of a p type and an n type is to be used. An example of a pigment without semiconductor characteristics has only sensitization but conducts no electricity.

For example, if layers containing solid semiconductor materials that are opposite in type of a p type and n type to each other are formed in production of a multilayer organic photoelectric conversion device, at least one of the layers is regarded as a semiconductor mixture layer and is therefore formed by the above layer forming and converting steps. Specifically, in production of at least one layer, a coating solution is prepared which contains a solid semiconductor material of a p type or an n type, a latent pigment, and a solvent, and is applied to form a precursor layer (the layer forming step). Then the latent pigment in the precursor layer is converted into a pigment (the converting step).

The pigment here may have or may not have semiconductor characteristics. If the pigment has semiconductor characteristics, the polarity of the major carrier of the pigment may be the same as or opposite to that of the solid semiconductor material, but the opposite polarity is preferable, so that an organic photoelectric conversion device of the combination of a multilayer type and the bulkhetero junction type can be formed.

In production of an organic photoelectric conversion device of a Schottky type, for example, the active layer is sufficiently formed in contact with an electrode that forms a Schottky barrier. Such an active layer may be formed in the same manner as the formation of an active layer of the above bulkhetero junction type or a multilayer type. That makes it possible to form an active layer which is the combination of a Schottky type with a bulkhetero junction type or multilayer type.

In addition, in production of an organic photoelectric conversion device of a hybrid type, the active layer of the hybrid type may be formed in the same manner as the production of the active layer of a bulkhetero junction type or that of the multilayer type except that the semiconductor mixture layer is configured to contain both organic and inorganic components. Specifically, at least two kinds components consisting of organic and inorganic components may be used as a pigment or as a solid semiconductor material. Otherwise, an organic component may be used as one of the pigment and the solid semiconductor material while an inorganic component is used as the other of the pigment and the solid semiconductor material. Alternatively, both the pigment and the solid semiconductor material may be one of organic or inorganic and an extra component to be contained may be the other of inorganic or organic.

More specifically, it is sufficient that, in addition to the latent pigment, the solid semiconductor material, and the solvent, the coating solution may contain inorganic particles made of titania, zinc oxide, or the like, or organic particles made of perylene pigment, quinacridone pigment, phthalocyanine pigment or the like. That makes it possible to form a hybrid-type active layer containing both an organic component and an inorganic component.

These types can be used in any combination. However, in the production of the organic photoelectric conversion device of any type in the present embodiment, the active layer thereof includes a semiconductor mixture layer, which is obtained upon completion of the layer forming step.

Above all, an active layer, such as the above bulkhetero junction type, that has a phase separation structure of pigments of a p type and an n type has a large phase interface and consequently seems to improve the electricity generation efficiency. Further, since the production method of the present embodiment can form a layer in which a solid semiconductor material and pigment are well dispersed, the polarity of the major carrier of the solid semiconductor material is preferably opposite to that of the pigment.

Further, the above example may have an active layer including a layer other than the semiconductor mixture layer such as the positive-hole blocking layer (i.e., the p-type semiconductor layer in the first to third embodiments) or the electron blocking layer (i.e., the n-type semiconductor layer in the first to third embodiments). Such an extra layer can be fabricated in any method.

As described above, the production method of an organic photoelectric conversion device of the present embodiment can produce an organic photoelectric conversion device by a coating process. Here, pigment is generally high in durability, so that the organic photoelectric conversion device of the present embodiment with solid semiconductor material and pigment dispersed in the active layer ensures a long lifetime. The present invention by no means limits the lifetime. A longer lifetime is desirable, and is usually one year or longer, preferably three years or longer, further preferably five years or longer.

In addition, the present invention usually guarantees the following advantages.

For example, an organic photoelectric conversion device produced by the production method of the present embodiment has a semiconductor mixture layer in which pigment and solid semiconductor material are finely dispersed, and is therefore capable of realizing a high photoelectric conversion efficiency, whose specific range is usually 3% or more, preferably 5% or more, further preferably 7% or more with no upper limit and the higher, the more preferable.

Further for example, in the production of an organic photoelectric conversion device of the present embodiment, layers are formed by coating so that a device large in area size can be produced by means of a printing process.

Still further, the use of coating makes it possible to produce an organic photoelectric conversion device at low cost.

Still further, it is possible to use nano particles of pigment and solid semiconductor material, which have been problematic for conventional techniques.

Still further, if the pigment is organic and the solid semiconductor material is in the form of particles, the semiconductor mixture layer is obtained in the form of a mixture layer made of organic pigment and particles. It has been very difficult to form such a semiconductor mixture layer, which brings benefits to the present invention. Above all, if the semiconductor mixture layer contains organic pigment and inorganic particles, the organic photoelectric conversion device can have further enhanced durability by an efficient use of the high durability of inorganic particles. Therefore, such a semiconductor mixture layer is preferable. Still further, inorganic particles without semiconductor characteristics may be used along with the solid semiconductor material or may be substituted for the solid semiconductor material. This case can also advantageously produce with ease an organic photoelectric conversion device with a mixture layer made of organic pigment and inorganic particles, which has not hitherto been easily produced.

EXAMPLES

Next, the present invention is detailed with reference to examples. The present invention should by no means be limited to the examples below, and various modifications may be suggested without departing from the sprit of the present invention. In the following description of the examples, the symbols in brackets [ ] correspond to the symbols in the drawing referred to.

Example 1

The bicycle compound (11A) can be converted to a planer molecule (11B) by heating to around 250° C.

[Chemical Formula 34]

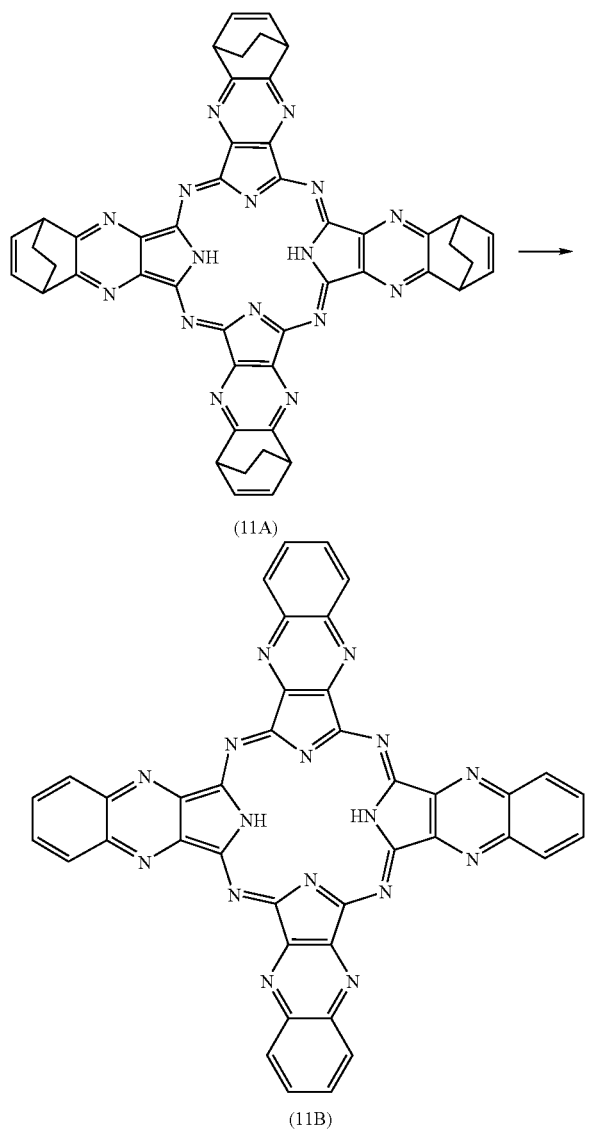

(11A)

(11B)

A thermal oxidation silica layer of 300 nm was formed on a silicon substrate doped at high concentration to be an n type. The bicycle compound (11A) was applied to the substrate to cover a gap 10 μm in width and 500 μm in length and formed by patterning between electrodes made of chromium of 5 nm and gold of 100 nm, and was then heat converted at 230° C. The field-effect transistor thereby obtained has characteristics of an n type and has high saturate mobility of $1.2 \times 10^{-3}$ cm$^2$/Vs.

The compound represented by above compound (7A) likewise has the structure of an field-effect transistor and exhibits mobility of about 0.01-0.1 cm$^2$/Vs after being subjected to heat conversion at 200° C., as disclosed in Japanese Patent Application Laid-Open (KOKAI) No. 2004-6750.

Using two kinds of latent pigments of this compound (7A) and the bicyclo compound (11A), an organic photoelectric conversion device was produced and evaluated.

In detail, a transparent electrode was produced by forming strip patterns with the widths of 2 mm on a glass substrate on which a transparent electrode layer made of indium tin oxide (ITO) is deposited at thickness of 145 nm with the sheet resistance 8.4 Ω by means of a normal photolithography technique and hydrochloric acid etching. The transparent electrode, having undergone patterning, was ultrasonically washed with a surface-active agent, washed with ultrapure water, and ultrasonically washed with ultrapure water. After washing, the electrode was dried by nitrogen blast and finally washed with ultra violet ozone.

The transparent substrate was spin coated with conductive polymer of poly(ethylenedioxythiophene):poly(styrenesulfonic acid) (PEDOT:PSS, product of H. C. Starck-V TECH Ltd., trade name Baytron PH) such that the polymer had a layer thickness of 40 nm, and was dried at 120° C. for 10 minutes in the atmosphere.

Then the substrate was placed in a glove box and the subsequent operation was carried out in a nitrogen atmosphere.

The substrate was heated at 180° C. for 3 minutes in a nitrogen atmosphere. A solution in which the compound (7A) (1 weight %) was dissolved in a chloroform-chlorobenzene mixture solvent (mixed at a weight ratio of 1:1) was filtered and then applied to the substrate by spin coating at 1500 rpm. The substrate was heated at 250° C. for 20 minutes and thereby a layer formed by the compound (7B) was obtained. The compound layer was then spin coated at 1500 rpm with a filtered solution in which the bicyclo compound (11A) (0.5 weight %) was dissolved, and heated at 250° C. for 40 minutes and at 280° C. for 20 minutes. A layer made of the compound (11B) was then laminated.

The substrate with the above organic layers was placed in a vacuum deposition unit. A phenanthroline derivative (so-called BCP) shown below was put into the unit, heated and consequently deposited. The degree of vacuum and the velocity of deposition during the deposition were set to be about $10^{-4}$ Pa and about 1 nm/sec, respectively. Thereby the layer having a thickness of 6 nm was deposited.

[Chemical Formula 35]

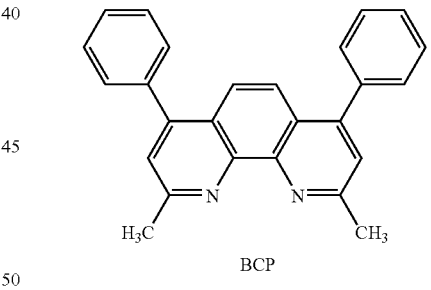

BCP

In succession, a shadow mask with stripes each having a width of 2 mm serving as a mask for forming an upper electrode was placed to be in intimate contact with the element and to be orthogonal to the ITO stripes of the transparent electrode, and the element was then placed in another vacuum deposition unit. Similarly to the formation of the n-type semiconductor layer, air was pumped out of the vacuum deposition unit until the degree of vacuum inside the unit became as low as $7.6 \times 10^{-5}$ Pa. After that, aluminum was deposited on the BCP layer at the deposition velocity of 3 nm/second to form a layer with a thickness of 80 nm and the upper electrode was thereby formed. The degree of vacuum during the deposition was about $10^{-4}$ Pa.

The above process consequently obtained an organic photoelectric conversion device with an organic layer and a light reception area size of 2 mm×2 mm.

The organic photoelectric conversion device was irradiated with light from solar simulator (AM1.5G) at the irradiation intensity of 100 mW/cm² and the voltage-current characteristics were measured with the result of photoelectric conversion characteristics of the open-circuit voltage (Voc) of 0.14 V, the short-circuit current (Jsc) of 2.9 mA/cm², the energy conversion efficiency (ηp) of 0.16%, and the form factor (FF) of 0.40.

As the result of measurement of the spectral sensitivity of the organic photoelectric conversion device, the external quantum efficiency showed the maximum 21% at a wavelength of 470 nm. The spectral sensitivity represented a ratio of electricity per one photon on the basis of the measurement of the electricity obtained by photoelectric conversion when the element was irradiated with monochromatic light.

Example 2

A transparent electrode was produced by forming strip patterns with a width of 2 mm on a glass substrate on which a transparent electrode layer made of indium tin oxide (ITO) is deposited at thickness of 145 nm with the sheet resistance 8.4 Ω by means of a normal photolithography technique and hydrochloric acid etching. The transparent electrode undergone patterning was ultrasonically washed with a surface-active agent, washed with ultrapure water, and ultrasonically washed with ultrapure water. After washing, the electrode was dried by nitrogen blast and finally washed with ultra violet ozone.

The transparent substrate was spin coated with conductive polymer of poly(ethylenedioxythiophene):poly(styrenesulfonic acid) (PEDOT:PSS, product of H. C. Starck-V TECH Ltd., trade name Baytron PH) such that the polymer had the layer thickness of 40 nm, and was dried at 120° C. for 10 minutes in the atmosphere.

Then the substrate was placed in a glove box and the subsequent operation was carried out in a nitrogen atmosphere.

The substrate was heated at 180° C. for 3 minutes in a nitrogen atmosphere. A solution in which a compound (12A) (0.25 weight %) was dissolved in a chloroform-chlorobenzene mixture solvent (mixed at a weight ratio of 1:1) was filtered and then applied to the substrate by spin coating at 1500 rpm. The substrate was heated at 180° C. for 20 minutes and thereby a layer formed by the compound (12B) was obtained.

[Chemical Formula 36]

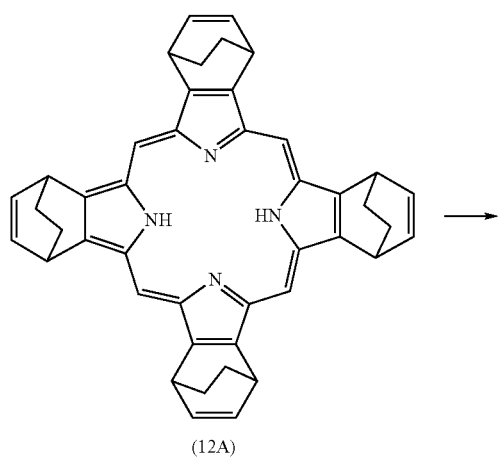

(12A)

→

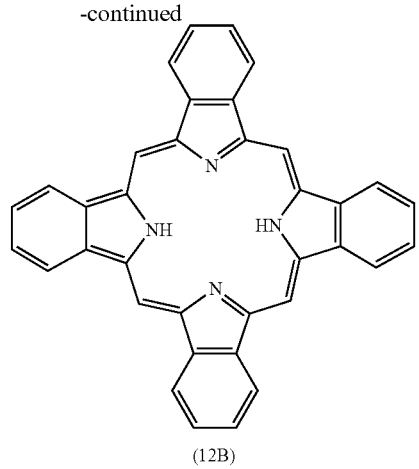

(12B)

A solution was prepared in which the compound (12A) (1.2 weight %) was dissolved in a chloroform-chlorobenzene mixture solvent (mixed at a weight ratio of 1:1), and a solution was prepared in which PCBNB (the below compound (12C) product of Frontier Carbon Corporation, 0.8 weight %) was dissolved in the chloroform-chlorobenzene mixture solvent. These solutions were mixed at a weight ratio of 1:1, filtered, spin-coated at 1500 rpm, and heated at 180° C. for 20 minutes. Consequently, a mixture layer formed of the compounds (12B, 12C) was obtained.

[Chemical Formula 37]

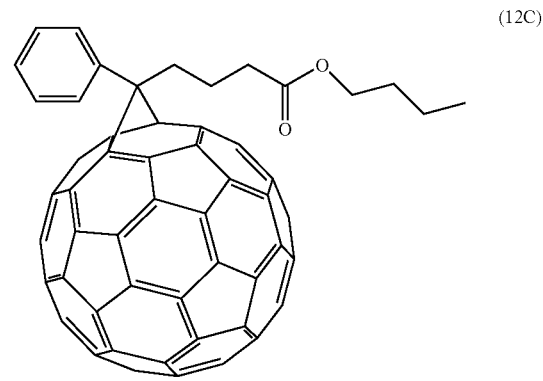

(12C)

The substrate with the above organic layers was placed in a vacuum deposition unit, a phenanthroline derivative (so-called BCP) shown below was put into the unit and heated and deposited. The velocity of deposition was set to be about 1 nm/sec. Thereby a layer having a thickness of 6 nm was deposited.

In succession, a shadow mask with stripes each having a width of 2 mm serving as a mask for forming an upper electrode was placed to be in intimate contact with the element and to be orthogonal to the ITO stripes of the transparent electrode, and the element was then placed in another vacuum deposition unit. Similarly to the formation of the n-type semi-conductor layer, aluminum was deposited on the BCP layer at the deposition velocity of 3 nm/second to form a layer with a thickness of 80 nm and the upper electrode was thereby formed.

The above process consequently obtained an organic thin layer solar cell formed of an organic photoelectric conversion device with an organic layer and a light reception area size of 2 mm×2 mm.

The organic photoelectric conversion device was irradiated with light from a solar simulator (AM1.5G) at the irradiation intensity of 100 mW/cm² and the voltage-current characteristics were measured with the result of photoelectric conversion characteristics of the open-circuit voltage (Voc) of 0.38 V, the short-circuit current (Jsc) of 7.7 mA/cm², the energy conversion efficiency (ηp) of 1.22%, and the form factor (FF) of 0.42.

As a result of measurement of the spectral sensitivity of the organic photoelectric conversion device, the external quantum efficiency showed the maximum 56% at a wavelength of 470 nm. The spectral sensitivity represented a ratio of electricity per one photon on the basis of the measurement of the electricity obtained by photoelectric conversion when the element was irradiated with monochromatic light.

Example 3

In formation of a mixture layer formed on the compounds (12B) and (12C), an organic photoelectric conversion device was produced in the same manner as example 2 except that solutions were prepared in each of which one of the compound (12A) (0.8 weight %) and the compound (12C) (1.2 weight %) was dissolved in a chloroform-chlorobenzene mixture solvent (mixed at a weight ratio of 1:1) and that the mixture solution of these solutions in a weight ratio 1:1 was applied and then annealed at 160° C. for 20 minutes.

The organic photoelectric conversion device was irradiated with light from a solar simulator (AM1.5G) at the irradiation intensity of 100 mW/cm² and the voltage-current characteristics were measured with the result of photoelectric conversion characteristics of the open-circuit voltage (Voc) of 0.38 V, the short-circuit current (Jsc) of 7.7 mA/cm², the energy conversion efficiency (ηp) of 1.34%, and the form factor (FF) of 0.40.

As the result of measurement of the spectral sensitivity of the organic photoelectric conversion device, the external quantum efficiency showed the local maxima 57% at a wavelength of 450 nm and 62% at 670 nm.

Example 4

An ITO substrate was coated with PEDOT:PSS (PH; 40 nm), which was dry heated. PV-Fast Red B (0.3 g, a product of Clariant (Japan) K.K.) and cyclohexanone (30 ml) were stirred with glass beads for 6 hours and dispersed. Then the glass beads were filtered to prepare a dispersed solution. In the meanwhile, a cyclohexanone solution containing the compound (12A) (0.4 weight %) was prepared. The above two solutions were mixed at a ratio of 1:1, spin coated at 1,000 rpm, annealed at 210° C. to thereby form into a layer with a thickness of 40 nm. Aluminum (50 nm) was vacuum deposited on the layer, which formed an element in a sandwiched shape.

[Chemical Formula 38]

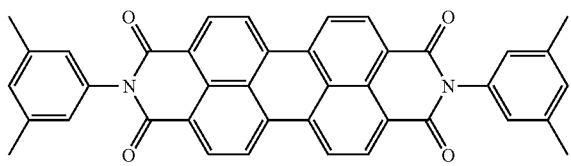

PV - Fast Red B

Voltage was applied to between the ITO- and Al-electrodes. Irradiating the element with light emitted from an optical fiber (LUMINERACELA-100SAE manufactured by HAYASHI WATCH-WORKS CO., LTD) in the direction from the ITO-electrode, electricity flowing was measured, compared with electricity when the element was placed in the dark. When voltage of +1V was applied to between the ITO- and Al-electrodes (the ITO electrode being the positive), the measurement resulted in the electricity flow about increasing 8 times when being irradiated with light, so that the element was qualified to work as a photoelectric conversion device.

Example 5

An organic photoelectric conversion device having the structure shown in FIG. 1 was produced in the method below.

Specifically, transparent electrode [3] was produced by forming strip patterns with the widths of 2 mm on glass substrate [2] on which a transparent electrode layer made of indium tin oxide (ITO) is deposited at thickness of 145 nm with the sheet resistance 8.4 Ω by means of a normal photolithography technique and hydrochloric acid etching. Transparent electrode [3] undergone patterning was ultrasonically washed with a surface-active agent, washed with ultrapure water, and ultrasonically washed with ultrapure water. After washing, the electrode was dried by nitrogen blast and finally washed with ultra violet ozone.

Transparent substrate [3] was spin coated with conductive polymer of poly(ethylenedioxythiophene):poly(styrenesulfonic acid) (PEDOT:PSS, product of H.C. Starck-V TECH Ltd., trade name Baytron PH) such that the polymer had a layer thickness of 40 nm, and was heat-dried at 120° C. for 10 minutes in the atmosphere, and was heated at 180° C. for 3 minutes in nitrogen. That formed an organic semiconductor layer [4] of a p type.

Next, the p-type organic semiconductor layer [4] was spin coated with a solution containing the BP-1 precursor (0.25 weight %) which is a precursor of the benzoporphyrin compound BP-1 in chloroform, and then was subjected to heat treatment at 210° C. for 30 minutes on a hotplate. The heat treatment converted the brown precursor layer into a green BP-1 layer and thereby obtained crystalline electron donor layer [5] having an average thickness of 45 nm.

In succession, electron donor layer [5] formed of the above benzoporphyrin was spin coated with a solution prepared by dissolving a fullerene compound F-4 (so-called PCBM) (1.2 weight %) in chlorobenzene and was subjected to heat treatment at 150° C. for 10 minutes and thereby electron acceptor layer [6] with an average thickness of 40 nm was laminated.

Substrate [2] on which organic layers [4], [5], and [6] have been formed was placed in a vacuum deposition unit. Air in the vacuum deposition unit was roughly pumped out by an oil rotary pump, and further pumped out by a cryopump until the degree of vacuum in the vacuum deposition unit became as low as 1.9×10⁻⁴ Pa. A phenanthroline derivative (so-called BCP) shown below was put on a metal board placed in the vacuum deposition unit and was heated so that the phenanthroline derivative was deposited. The degree of vacuum and the velocity of deposition during the deposition were set to be about 1.7×10⁻⁴ Pa and about 1.0 nm/sec, respectively. That deposited layer with a thickness of 6 nm on electron acceptor layer [6] to form n-type semiconductor layer [7].

[Chemical Formula 39]

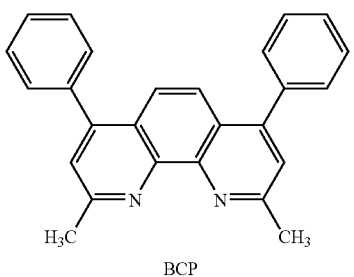

BCP

In succession, a shadow mask with stripes each having a width of 2 mm serving as a mask for forming an upper electrode was placed to be in intimate contact with the element and be orthogonal to the ITO stripes of transparent electrode [3], and the element was then placed in another vacuum deposition unit. Similarly to the formation of n-type semiconductor layer [7], air was pumped out of the vacuum deposition unit until the degree of vacuum inside the unit became as low as $7.6 \times 10^{-5}$ Pa. After that, aluminum was deposited on n-type semiconductor layer [7] at the deposition velocity of 3 nm/second to form a layer with a thickness of 80 nm and the upper electrode [8] was thereby formed. The degree of vacuum during the deposition was about $1.2 \times 10^{-4}$ Pa.

The above process consequently obtained an organic thin layer solar cell in the form of an organic photoelectric conversion device [1] with an organic thin layer and a light reception area size of 2 mm×2 mm.

Organic photoelectric conversion device was irradiated with light from a solar simulator (AM1.5G) at the irradiation intensity of 100 mW/cm$^2$ and the voltage-current characteristics were measured with the result of photoelectric conversion characteristics of the open-circuit voltage (Voc) of 0.55 V, the short-circuit current (Jsc) of 5.5 mA/cm$^2$, the energy conversion efficiency (ηp) of 1.45%, and the form factor (FF) of 0.48.

As the result of measurement of the spectral sensitivity of the organic photoelectric conversion device, the external quantum efficiency showed the maximum 52% at a wavelength of 460 nm. The spectral sensitivity represented a ratio of electricity per one photon on the basis of the measurement of the electricity obtained by photoelectric conversion when the element was irradiated with monochromatic light. In addition, the absorption was not corrected and the same is applied to the examples and the comparative example below.

Comparative Example 1

An organic photoelectric conversion device was produced in the same manner as in example 1 except that electron donor layer [5] is formed by vacuum deposition with copper phthalocyanine to have a thickness of 25 nm.

The organic photoelectric conversion device was irradiated with light from a solar simulator (AM1.5G) at an irradiation intensity of 100 mW/cm$^2$ and the voltage-current characteristics were measured with the result of photoelectric conversion characteristics of the open-circuit voltage (Voc) of 0.57 V, the short-circuit current (Jsc) of 3.3 mA/cm$^2$, the energy conversion efficiency (ηp) of 0.72%, and the form factor (FF) of 0.38.

As a result of measurement of the spectral sensitivity of the organic photoelectric conversion device, the external quantum efficiency showed the maximum 19% at a wavelength of 620 nm.

Example 6

An organic photoelectric conversion device was produced in the same manner as in example 5 except that electron donor layer [5] having a thickness of 85 nm was formed by spin coating the p-type organic semiconductor layer with a coating solution obtained by dissolving the precursor (1.0 weight %) of the benzoporphyrin compound BP-1 in a chloroform-chlorobenzene solvent (mixed at a weight ratio of 1:1), and then heating at 210° C. for 30 minutes.

The organic photoelectric conversion device was irradiated with light from a solar simulator (AM1.5G) at the irradiation intensity of 100 mW/cm$^2$ and the voltage-current characteristics were measured with the result of photoelectric conversion characteristics of an open-circuit voltage (Voc) of is 0.52 V, a short-circuit current (Jsc) of 6.3 mA/cm$^2$, an energy conversion efficiency (ηp) of 1.64%, and a form factor (FF) of 0.50.

As a result of measurement of the spectral sensitivity of the organic photoelectric conversion device, the external quantum efficiency showed the maximum 54% at a wavelength of 620 nm.

Example 7

An organic photoelectric conversion device was produced in the same manner as in example 6 except that electron acceptor layer [6] having a thickness of 40 nm was formed by spin coating with a coating solution obtained by dissolving PCBM (1.2 weight %) in toluene and then heating at 65° C. for 10 minutes.

The organic photoelectric conversion device was irradiated with light from a solar simulator (AM1.5G) at an irradiation intensity of 100 mW/cm$^2$ and the voltage-current characteristics were measured with the result of photoelectric conversion characteristics of an open-circuit voltage (Voc) of 0.55 V, a short-circuit current (Jsc) of 5.6 mA/cm$^2$, an energy conversion efficiency (ηp) of 1.74%, and a form factor (FF) of 0.56.

As a result of measurement of the spectral sensitivity of the organic photoelectric conversion device, the external quantum efficiency showed the maximum 50% at a wavelength of 460 nm.

Example 8

An organic photoelectric conversion device was produced in the same manner as example 7 except that the heat treatment after the spin coating in formation of electron acceptor layer [6] was performed at 90° C. for 10 minutes.

The organic photoelectric conversion device was irradiated with light from a solar simulator (AM1.5G) at an irradiation intensity of 100 mW/cm$^2$ and the voltage-current characteristics were measured with the result of photoelectric conversion characteristics of an open-circuit voltage (Voc) of 0.56 V, a short-circuit current (Jsc) of 6.5 mA/cm$^2$, an energy conversion efficiency (ηp) of 1.85%, and a form factor (FF) of 0.51.

As a result of measurement of the spectral sensitivity of the organic photoelectric conversion device, the external quantum efficiency showed the maximum 46% at a wavelength of 460 nm.

Example 9

An organic photoelectric conversion device was produced in the same manner as example 7 except that PCBM was substituted by a fullerene compound F-5.

The organic photoelectric conversion device was irradiated with light from a solar simulator (AM1.5G) at the irradiation intensity of 100 mW/cm$^2$ and the voltage-current characteristics were measured with the result of photoelectric conversion characteristics of an open-circuit voltage (Voc) of 0.54 V, a short-circuit current (Jsc) of 6.2 mA/cm$^2$, an energy conversion efficiency (ηp) of 1.20%, and a form factor (FF) of 0.36.

As a result of measurement of the spectral sensitivity of the organic photoelectric conversion device, the external quantum efficiency showed the maximum 54% at a wavelength of 460 nm.

Example 10

The following method produced an organic photoelectric conversion device [10] having a structure shown in FIG. 2 in which the benzoporphyrin compound BP-1 was formed between p-type organic semiconductor layer [4] and active layer [11]. Specifically, p-type organic semiconductor layer [4] was formed on glass substrate [2] on which transparent electrode [3] made of ITO has been formed in the same manner as example 1, and was subsequently spin coated with a chloroform-chlorobenzene mixture solution at a weight ratio of 1:1 in which the BP-1 precursor which is precursor of the benzoporphyrin compound BP-1 was dissolved (0.25 weight %). After that, heat treatment was conducted at 210° C. for 30 minutes on a hot plate to thereby form a crystalline benzoporphyrin compound layer [5] having an average thickness of 20 nm.

Next, using the method of vacuum deposition, a mixture active layer [11] was formed in which copper phthalocyanine and C$_{60}$ were mixed at a weight ratio of 1:1 with a thickness of 15 nm. Further, vacuum deposition was carried out to laminate C$_{60}$ and BCP to have thicknesses of 30 nm and 6 nm respectively, to form n-type semiconductor layer [7] on mixture active layer [11]. Finally, an upper electrode [8] made from aluminum is formed in the same manner as example 1, so that production of organic photoelectric conversion device [10] was completed.

The organic photoelectric conversion device [10] was irradiated with light from a solar simulator (AM1.5G) at the irradiation intensity of 100 mW/cm$^2$ and the voltage-current characteristics were measured with the result of photoelectric conversion characteristics of an open-circuit voltage (Voc) of 0.40 V, a short-circuit current (Jsc) of 8.9 mA/cm$^2$, an energy conversion efficiency of (ηp) of 1.74%, and a form factor (FF) of 0.49.

As a result of measurement of the spectral sensitivity of the organic photoelectric conversion device, the external quantum efficiency showed the maximum 50% at wavelengths of 440 nm and 690 nm.

INDUSTRIAL APPLICABILITY

The organic photoelectric conversion device and the production method thereof according to the present invention can be applied to any industrial field and particularly applied to a photo voltaic generation device (i.e., a solar cell) and an image sensor.

The present invention is detailed with reference to various embodiments, but it is apparent to those skilled in the art that various changes and modifications can be suggested without departing from the spirit of the present invention.

The present invention is based on Japanese Patent Applications (Japanese Patent Application No. 2006-128541, Japanese Patent Application No. 2006-161374, Japanese Patent Application No. 2006-321475, and Japanese Patent Application No. 2007-121209) respectively filed on May 2, 2006, Jun. 9, 2006, Nov. 29, 2006, May 1, 2007, which are herein incorporated by reference.

What is claimed is:

1. A method for producing an organic photoelectric conversion device including a substrate, a pair of electrodes which are formed on the substrate and at least one of which is transparent, and an active layer comprising an electron donor layer containing a pigment as an electron donor and an electron acceptor layer containing an electron acceptor and the active layer being formed between the pair of electrodes, wherein the pigment is at least one compound selected from the group consisting of porphyrin, pthalocyanine, and derivatives thereof, and the method comprises forming the active layer by coating a latent pigment, converting the latent pigment into said pigment, and coating the electron acceptor.

2. The method for producing an organic photoelectric conversion device according to claim 1, wherein said pigment has a semiconductor characteristic.

3. The method for producing an organic photoelectric conversion device according to claim 1, comprising converting two or more kinds of said latent pigments into said pigment.

4. The method for producing an organic photoelectric conversion device according to claim 3, wherein the coating is performed with a mixture of said two or more kinds of latent pigments.

5. The method for producing an organic photoelectric conversion device according to claim 1, wherein the latent pigment is a benzoporphyrin compound of formula (I) or (II) having a bicyclo ring and the method comprises converting the benzoporphyrin compound into the benzoporphyrin compound as the electron donor by a heat conversion

[Chemical Formula 1]

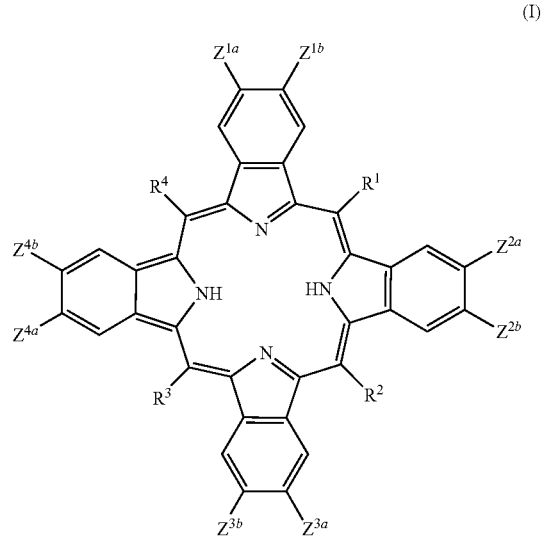

(I)

-continued

[Chemical Formula 2]

(II)

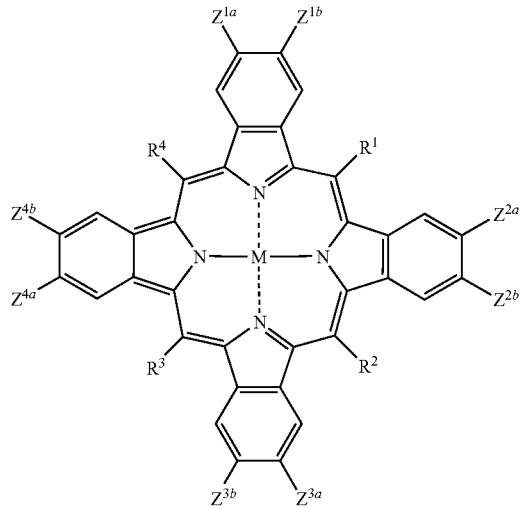

wherein $Z^{ia}$ and $Z^{ib}$, i is an integer of 1-4, independently of one another are a univalent atom or a univalent atomic group, but $Z^{ia}$ and $Z^{ib}$ may bind to each other to form a ring; $R^1$-$R^4$ independently of one another are a univalent atom or a univalent atomic group; and M is a divalent metal atom or an atomic group in which a trivalent or more metal atom binds to one or more other atoms.

6. The method for producing an organic photoelectric conversion device according to claim 5, wherein the latent pigment is a compound expressed by the following formula (III) or (IV)

[Chemical Formula 3]

(III)

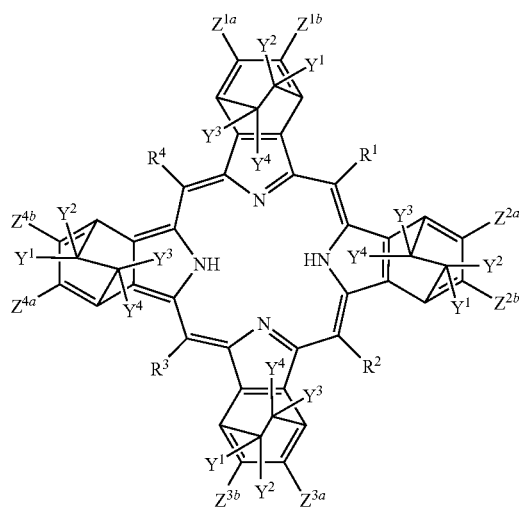

-continued

[Chemical Formula 4]

(IV)

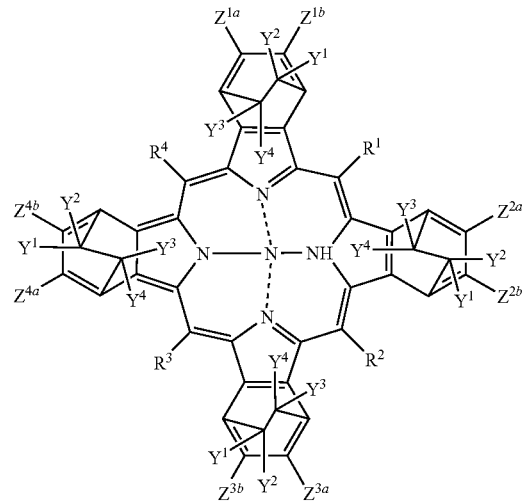

wherein $Z^{ia}$ and $Z^{ib}$, i is an integer of 1-4, independently of one another are a univalent atom or a univalent atomic group, but $Z^{ia}$ and $Z^{ib}$ may bind to each other to form a ring; $R^1$-$R^4$ independently of one another are a univalent atom or a univalent atomic group; $Y^1$-$Y^4$ independently of one another are a univalent atom or a univalent atomic group; and M is a divalent metal atom or an atomic group in which a trivalent or more metal atom binds to one or more other atoms.

7. The method for producing an organic photoelectric conversion device according to claim 5, comprising:
  forming a layer made of the latent pigment by coating;
  forming the electron acceptor layer on the layer of the latent pigment; and
  forming the electron donor layer by said heat conversion.

8. The method for producing an organic photoelectric conversion device according to claim 1, wherein said organic photoelectric conversion device is a solar cell.

9. The method for producing an organic photoelectric conversion device according to claim 5, wherein said organic photoelectric conversion device is a solar cell.

10. The method for producing an organic photoelectric conversion device according to claim 1, wherein the electron acceptor is a fullerene compound.

11. The method for producing an organic photoelectric conversion device according to claim 1, wherein said pair of electrodes are a positive electrode and a negative electrode, and a p-type semiconductor layer is formed between said positive electrode and said electron donor layer.

12. The method for producing an organic photoelectric conversion device according to claim 1, wherein said pair of electrodes are a positive electrode and a negative electrode, and an n-type semiconductor layer is formed between said negative electrode and said electron acceptor layer.

* * * * *